US012518916B2

(12) United States Patent
Hong et al.

(10) Patent No.: US 12,518,916 B2
(45) Date of Patent: Jan. 6, 2026

(54) MAGNETIC ELEMENT AND MANUFACTURING METHOD THEREOF

(71) Applicant: Delta Electronics (Shanghai) Co., Ltd., Shanghai (CN)

(72) Inventors: Shouyu Hong, Shanghai (CN); Qingdong Chen, Shanghai (CN); Zhiheng Fu, Shanghai (CN); Ganyu Zhou, Shanghai (CN); Yan Tong, Shanghai (CN); Wen Han, Shanghai (CN); Jinping Zhou, Shanghai (CN); Pengkai Ji, Shanghai (CN); Yiqing Ye, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 724 days.

(21) Appl. No.: 17/383,496

(22) Filed: Jul. 23, 2021

(65) Prior Publication Data

US 2022/0130605 A1 Apr. 28, 2022

(30) Foreign Application Priority Data

Oct. 22, 2020 (CN) ........................ 202011139866.2

(51) Int. Cl.
*H01F 27/24* (2006.01)
*H01F 27/30* (2006.01)
(Continued)

(52) U.S. Cl.
CPC ......... *H01F 41/0206* (2013.01); *H01F 27/24* (2013.01); *H01F 27/306* (2013.01); *H01F 27/324* (2013.01); *H05K 1/165* (2013.01)

(58) Field of Classification Search
CPC ...... H01F 27/24; H01F 27/306; H01F 27/324; H01F 2027/2809; H01F 27/263;
(Continued)

(56) References Cited

U.S. PATENT DOCUMENTS 4,975,671 A * 12/1990 Dirks .................. H01F 17/0033 336/200
6,040,753 A * 3/2000 Ramakrishnan .... H01F 17/0033 336/200
(Continued)

FOREIGN PATENT DOCUMENTS

CN 1324081 A 11/2001
CN 1197098 C 4/2005
(Continued)

OTHER PUBLICATIONS

G. Li and X. Wu, "A High Power Density 48V-12V DCX with 3-D PCB Winding Transformer," 2020 IEEE Applied Power Electronics Conference and Exposition (APEC), 2020, pp. 463-467.

*Primary Examiner* — Mang Tin Bik Lian
(74) *Attorney, Agent, or Firm* — KIRTON McCONKIE; Evan R. Witt

(57) ABSTRACT

A magnetic element includes a magnetic core assembly and a winding assembly. The magnetic core assembly includes a first magnetic part and a second magnetic part arranged independently. The winding assembly includes a first winding. The first winding is wound around the first magnetic part. Moreover, at least a portion of a substrate is formed as the first winding. The substrate includes a first accommodation space, a second accommodation space and a first metal structure. Moreover, at least a portion of the first metal structure is formed as at least a portion of the first winding. At least a portion of the first magnetic part and at least a portion of the second magnetic part are disposed within the first accommodation space and the second accommodation space, respectively. The substrate has an integral structure.

23 Claims, 81 Drawing Sheets

(51) Int. Cl.
*H01F 27/32* (2006.01)
*H01F 41/02* (2006.01)
*H05K 1/16* (2006.01)

(58) Field of Classification Search
CPC .... H01F 27/266; H01F 27/2804; H01F 27/34; H05K 1/165
See application file for complete search history.

(56) References Cited

U.S. PATENT DOCUMENTS

| | | | | |
|---|---|---|---|---|
| 6,188,305 | B1 * | 2/2001 | Chang | H05K 1/165 336/200 |
| 7,489,226 | B1 | 2/2009 | Chignola et al. | |
| 7,671,713 | B2 * | 3/2010 | Xu | H02M 7/003 336/200 |
| 8,427,267 | B1 * | 4/2013 | Vinciarelli | H01F 27/2804 336/200 |
| 9,190,204 | B1 | 11/2015 | Cates, Jr. | |
| 9,355,769 | B2 | 5/2016 | Quilici | |
| 10,468,181 | B1 * | 11/2019 | Vinciarelli | H05K 3/4697 |
| 11,295,891 | B2 * | 4/2022 | Venkatadri | H01F 27/2895 |
| 2001/0043135 | A1 * | 11/2001 | Yamada | H01F 27/2804 336/184 |
| 2011/0156853 | A1 | 6/2011 | Kato et al. | |
| 2011/0285492 | A1 * | 11/2011 | Wang | H01F 27/306 336/198 |
| 2014/0232502 | A1 * | 8/2014 | Gutierrez | H01F 27/2895 336/200 |
| 2015/0061817 | A1 | 3/2015 | Lee et al. | |
| 2017/0352469 | A1 * | 12/2017 | Bolognia | H01F 27/2895 |
| 2019/0333674 | A1 | 10/2019 | Quilici | |
| 2020/0194161 | A1 * | 6/2020 | Hu | H01F 17/04 |
| 2020/0211755 | A1 * | 7/2020 | Liu | H01F 27/24 |
| 2020/0313555 | A1 * | 10/2020 | DeVries, Jr | H01F 27/2852 |

FOREIGN PATENT DOCUMENTS

| | | | |
|---|---|---|---|
| CN | 100584144 | C | 1/2010 |
| CN | 111145988 | A | 5/2020 |
| EP | 2413334 | A2 | 2/2012 |
| EP | 3648128 | A2 | 5/2020 |
| JP | H10208942 | A | 8/1998 |
| KR | 20010047022 | A | 6/2001 |

* cited by examiner

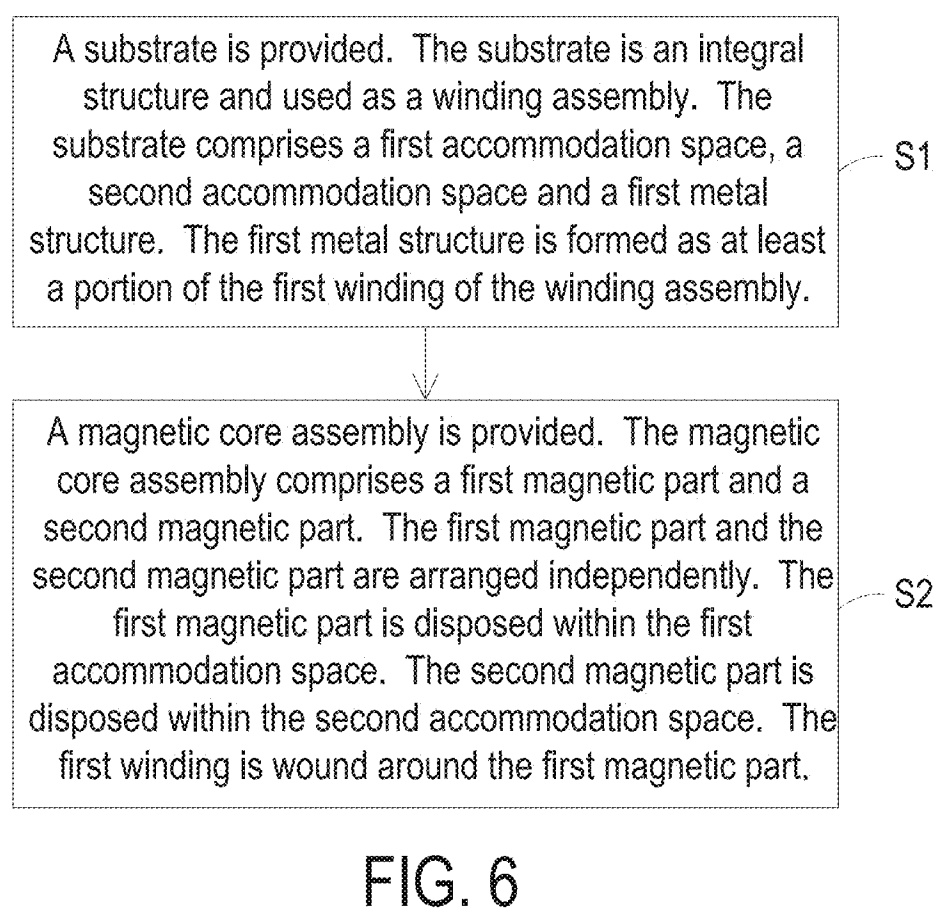

S1

A substrate is provided. The substrate is an integral structure and used as a winding assembly. The substrate comprises a first accommodation space, a second accommodation space and a first metal structure. The first metal structure is formed as at least a portion of the first winding of the winding assembly.

→

S2

A magnetic core assembly is provided. The magnetic core assembly comprises a first magnetic part and a second magnetic part. The first magnetic part and the second magnetic part are arranged independently. The first magnetic part is disposed within the first accommodation space. The second magnetic part is disposed within the second accommodation space. The first winding is wound around the first magnetic part.

FIG. 6

MAGNETIC ELEMENT AND MANUFACTURING METHOD THEREOF

FIELD OF THE INVENTION

The present invention relates to a magnetic element and a method of manufacturing the magnetic element, and more particularly to a magnetic element with low magnetic loss and high precision of dimension and a method of manufacturing the magnetic element.

BACKGROUND OF THE INVENTION

As the human's demands on smart life are gradually increased, the data processing capability becomes more important. Consequently, it is important to develop a data center with high efficiency and high power density.

Conventionally, the data center uses servers to process data. A main board of the server is usually equipped with central processing units, chipsets, memories, power supplies and the essential peripheral components. As the demands on the data processing capability of the server are increased, the number and the integration of the data processing chips are increased. In other words, the space within the server is almost occupied by the data processing chips, and the power consumption of the server increases. Therefore, the power supply for the data processing chips should be operated with high efficiency and high power density. Moreover, the volume of the power supply should be designed as small as possible. Consequently, the overall volume of the server is reduced, and the power-saving efficacy of the data center is achieved. For meeting the high power density requirement, the switching frequency of the power supply is correspondingly increased.

Consequently, the power supply is operated at a low voltage and a high current according to the higher switching frequency. However, when a magnetic element is applied to the low-voltage and high-current power supply, the power density and the conversion efficiency of the magnetic element are still low. In other words, it is important to develop a magnetic element with high power density and high conversion efficiency in order to be applied to the data center.

Please refer to FIGS. 1A and 1B. FIG. 1A is a schematic perspective view illustrating the structure of a conventional magnetic element. FIG. 1B is a schematic cross-sectional view illustrating the magnetic element as shown in FIG. 1A and taken along the line A-A'. The conventional magnetic element 1' is formed through a horizontal winding process. The conventional magnetic element 1' includes a substrate 2', a magnetic core 3' and a plurality of windings 4'. The windings 4' are formed in corresponding wiring layers 21' of the substrate 2'. The magnetic core 3' passes through the substrate 2'. The magnetic core 3' and the substrate 2' are perpendicular or nearly perpendicular to each other. That is, the magnetic core 3' and the wiring layer 21' of the substrate 2' are perpendicular or nearly perpendicular to each other. As shown in FIG. 1B, the wiring layer 21' has a thickness W and a width H, wherein the width H is greater than ten times the thickness W (i.e., H>10 W). This kind of wiring-layer metal winding is generally referred to as a wiring-layer metal winding with a vertical-winding structure. Generally, the impedance of portions of the winding 4' away from the magnetic core and the impedance of portions of the winding 4' close to the magnetic core are different. Consequently, the current distribution is not uniform.

The magnetic core 3' of the magnetic element 1' includes a U-shaped magnetic part 31' and an I-shaped magnetic part 32'. The U-shaped magnetic part 31' is penetrated through two receiving holes 22' and connected with the I-shaped magnetic part 32'. The U-shaped magnetic part 31' includes two vertical legs 33' and a horizontal leg 34'. The two vertical legs 33' are disposed through the substrate 2'. The horizontal leg 34' is connected between the two vertical legs 33'. The length of the horizontal leg 34' is w1. The distance between the outer sides of the two vertical legs 33' is w2. The distance between the inner sides of the two receiving holes 22' is H1. The distance between the outer sides of the two receiving holes 22' is H2. For increasing the production efficiency, the magnetic core 3' is produced through molds. After the magnetic core 3' is produced, the surfaces of the magnetic core 3' are finely polished to increase the precision of the dimension. Take the U-shaped magnetic part 31' for example. After the U-shaped magnetic part 31' is formed, the surface of the U-shaped magnetic part 31' is polished. For example, the two lateral surfaces of the horizontal leg 34' are polished. However, since the U-shaped magnetic part 31' has an integral structure, the arrangement of the horizontal leg 34' influences the process of finely polishing the outer surfaces of the vertical legs 33'. Consequently, the tolerance is accumulated. Generally, the outer sides of the two vertical legs 33' are retracted relative to the lateral sides of the horizontal leg 34'. Consequently, it is difficult to finely polish the outer sides of the two vertical legs 33'. The lateral sides of the horizontal leg 34' are readily damaged when the outer sides of the two vertical legs 33' are polished. Similarly, it is difficult to finely polish the inner sides of the vertical legs 33'. In other words, the tolerance of the dimension is very large.

Please refer to FIG. 1B again. The distance between the inner sides of the two vertical legs 33' is w3. The width of each vertical leg 33' is w4. In case that the tolerance of the distance w2 between the outer sides of the two vertical legs 33', the tolerance of the distance w3 between the inner sides of the two vertical legs 33' and the tolerance of the width w4 of each vertical leg 33' are all +/−0.2 mm, the receiving hole 22' corresponding to the U-shaped magnetic part 31' needs to be large. That is, the distance H2 between the outer sides of the receiving holes 22' needs to be greater than the maximum distance w2 between the outer sides of the two vertical legs 33'. Similarly, the distance H1 between the inner sides of the receiving holes 22' needs to be smaller than the minimum distance w3 between the inner sides of the two vertical legs 33'. During the practical wiring process, the distance H1 between the inner sides of the receiving holes 22' is reduced because of the tolerance of the distance w3. Consequently, the wiring space is reduced, and the wiring flexibility is reduced. Since the winding between the two receiving holes 22' needs to have a certain width, the distance w2 between the outer sides of the two vertical legs 33' needs to be large enough. In other words, the tolerance of the length w1 of the horizontal leg 34' and the tolerance of the distance w2 between the outer sides of the two vertical legs 33' are added to the tolerance of the distance H1 between the inner sides of the receiving holes 22' and the tolerance of the distance H2 between the outer sides of the receiving holes 22'. Consequently, the overall dimension of the substrate 2' is increased, and the power density of the magnetic element 1' is reduced.

Therefore, there is a need of providing a magnetic element and a method of manufacturing magnetic element in order to overcome the drawbacks of the conventional technologies.

SUMMARY OF THE INVENTION

An object of the present invention provides a magnetic element with low magnetic loss and high dimension precision.

Another object of the present invention provides a method of manufacturing the magnetic element.

In accordance with an aspect of the present invention, a magnetic element is provided. The magnetic element includes a magnetic core assembly and a winding assembly. The magnetic core assembly includes a first magnetic part and a second magnetic part arranged independently. The winding assembly includes a first winding. The first winding is wound around the first magnetic part. Moreover, at least a portion of a substrate is formed as the first winding. The substrate includes a first accommodation space, a second accommodation space and a first metal structure. Moreover, at least a portion of the first metal structure is formed as at least a portion of the first winding. At least a portion of the first magnetic part and at least a portion of the second magnetic part are disposed within the first accommodation space and the second accommodation space, respectively. The substrate has an integral structure.

In accordance with another aspect of the present invention, a method of manufacturing a magnetic element is provided. Firstly, a substrate is provided. The substrate has an integral structure. At least a portion of the substrate is formed as a winding assembly of the magnetic element. The substrate includes a first accommodation space, a second accommodation space and a first metal structure. At least a portion of the first metal structure is formed as at least a portion of a first winding of the winding assembly. Then, a magnetic core assembly with a first magnetic part and a second magnetic part is provided. The first magnetic part and the second magnetic part are arranged independently. At least a portion of the first magnetic part and at least a portion of the second magnetic part are disposed within the first accommodation space and the second accommodation space, respectively. The first winding is wound around the first magnetic part.

The above contents of the present invention will become more readily apparent to those ordinarily skilled in the art after reviewing the following detailed description and accompanying drawings, in which:

BRIEF DESCRIPTION OF THE DRAWINGS

FIG. 6 is a flowchart illustrating a method of fabricating the magnetic element as shown in FIG. 2;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
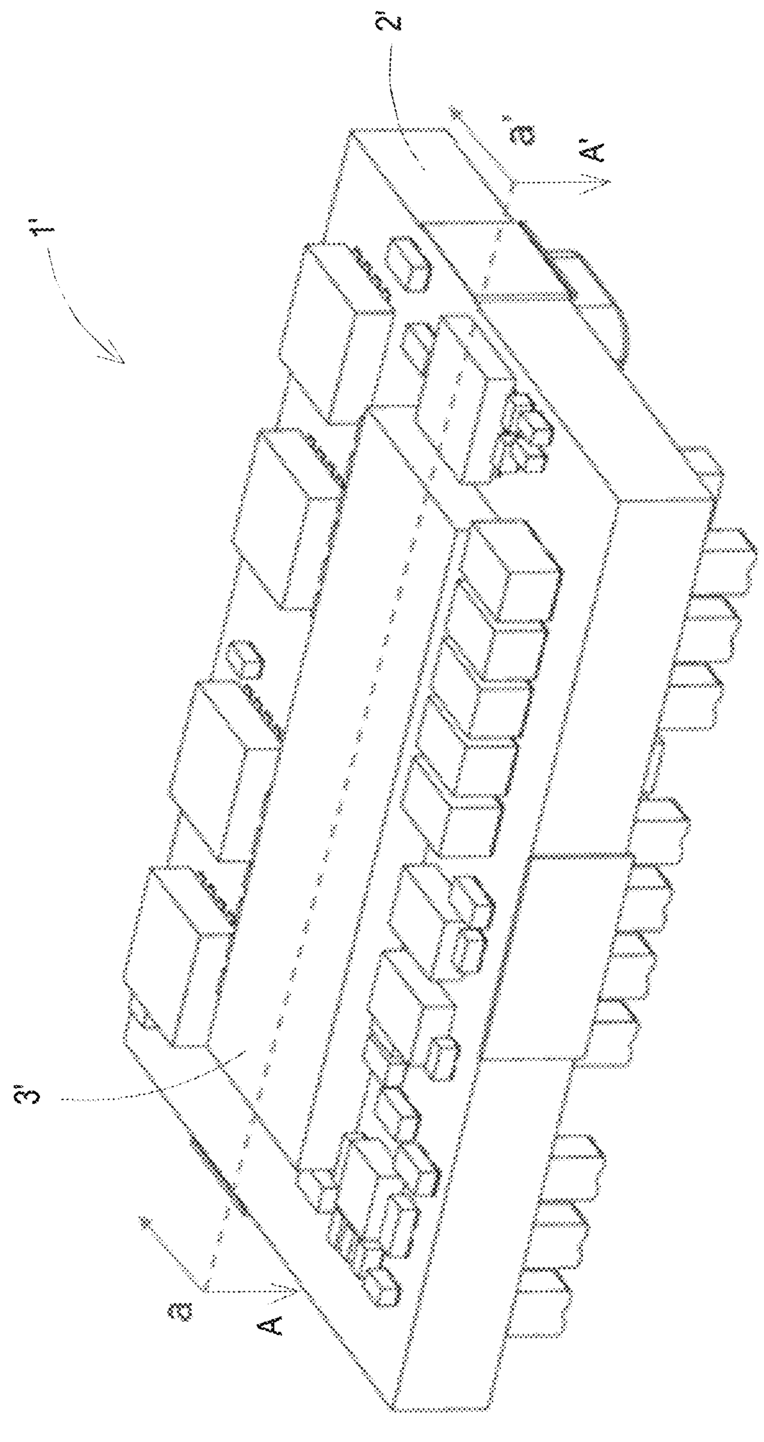
FIG. 1A PRIOR ART
FIG. 1A is a schematic perspective view illustrating the structure of a conventional magnetic element.
Figure 1B:
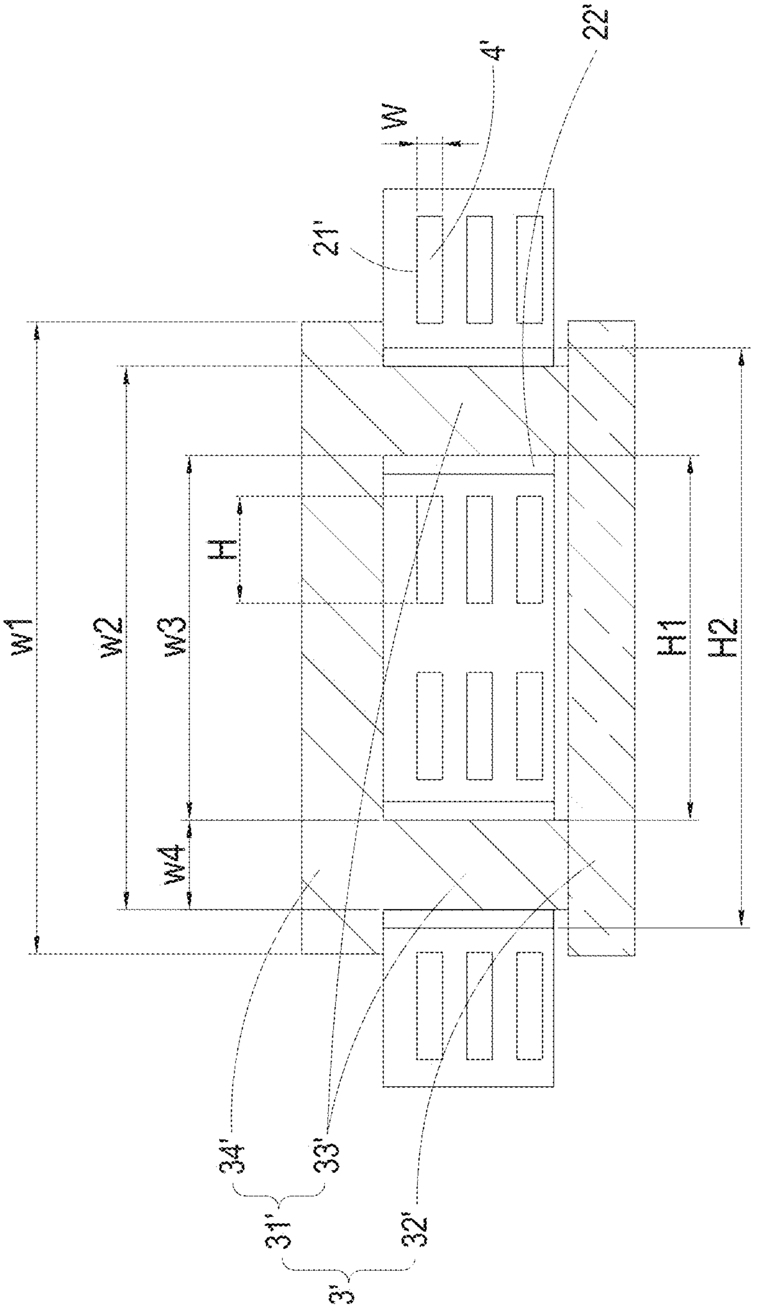
FIG. 1B PRIOR ART
FIG. 1B is a schematic cross-sectional view illustrating the magnetic element as shown in FIG. 1A and taken along the line A-A'.
Figure 2:
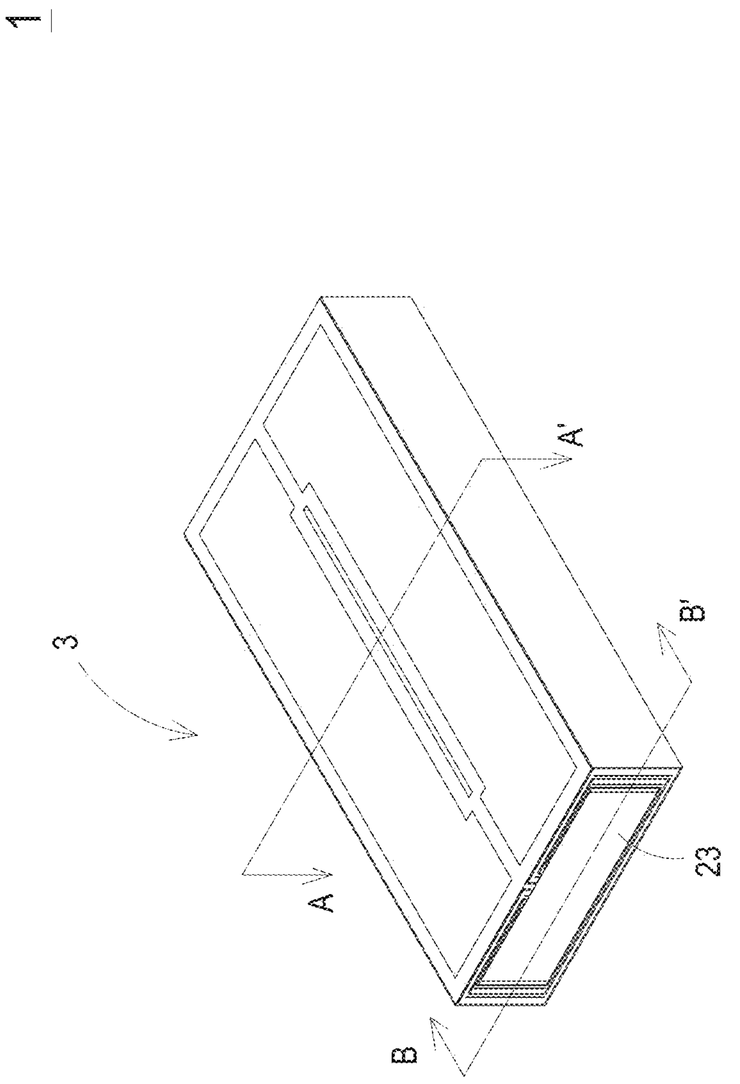
FIG. 2 is a schematic perspective view illustrating a magnetic element according to an embodiment of the present invention.
Figure 3:
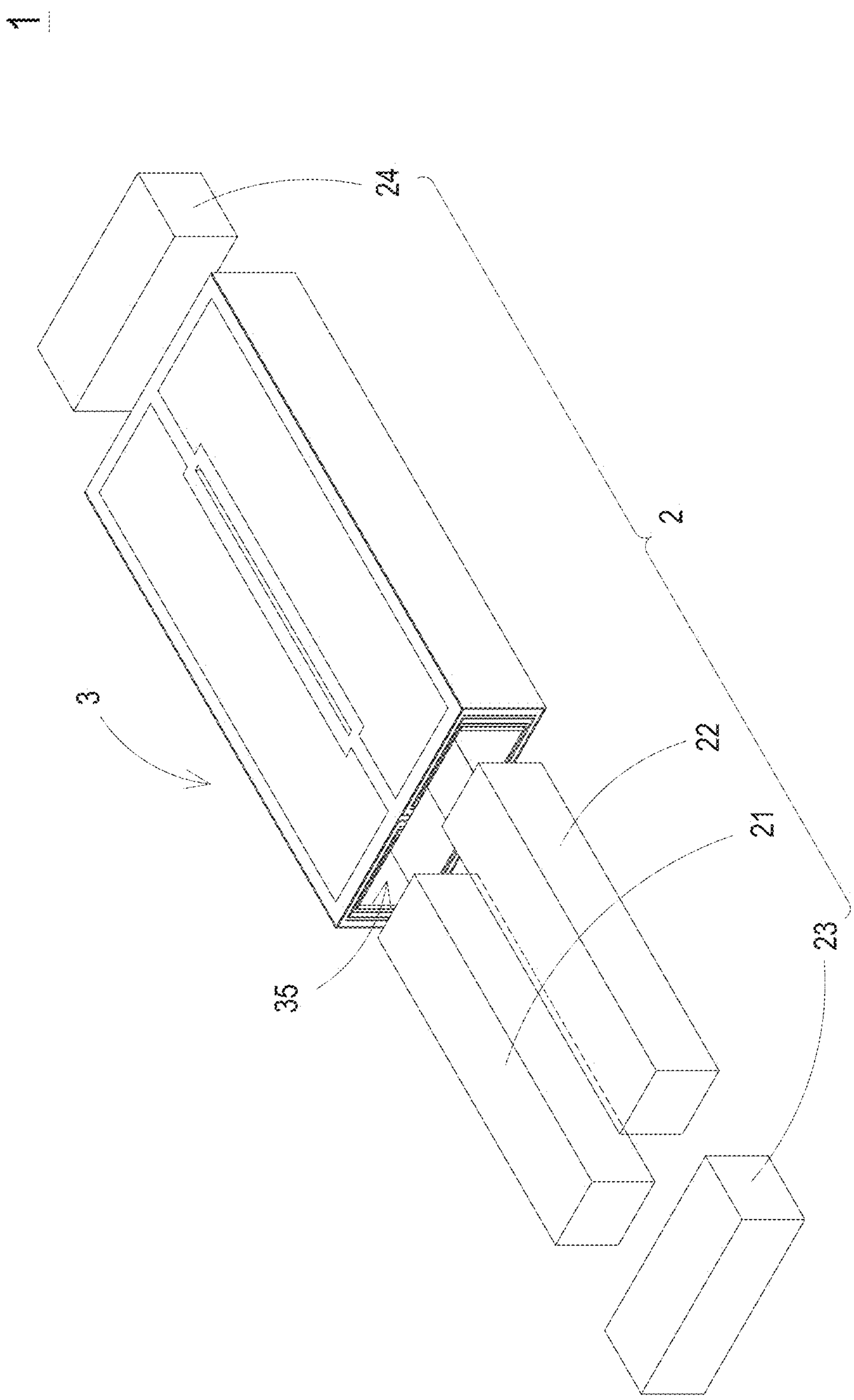
FIG. 3 is a schematic exploded view illustrating the magnetic element as shown in FIG. 2.
Figure 4:
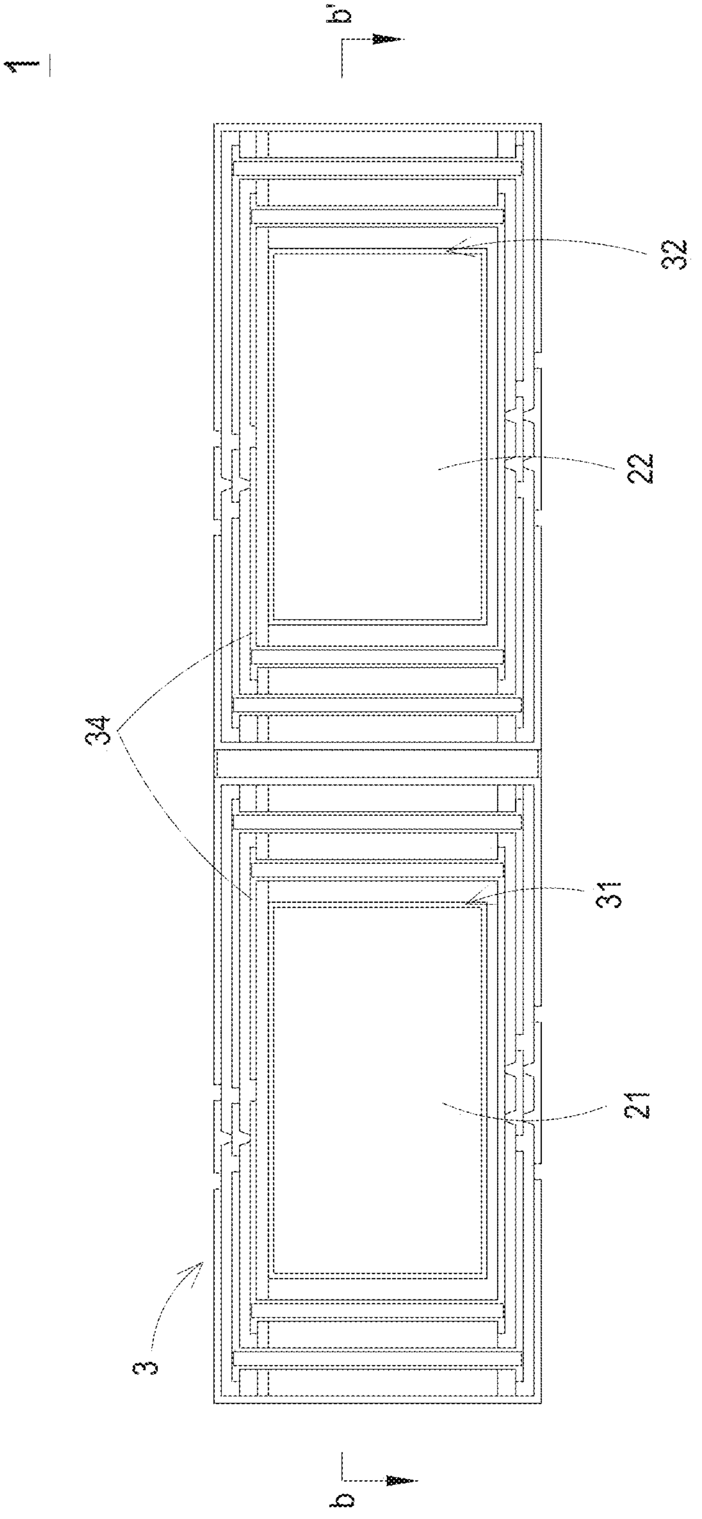
FIG. 4 is a schematic cross-sectional view illustrating the magnetic element as shown in FIG. 2 and taken along the line A-A'.
Figure 5:
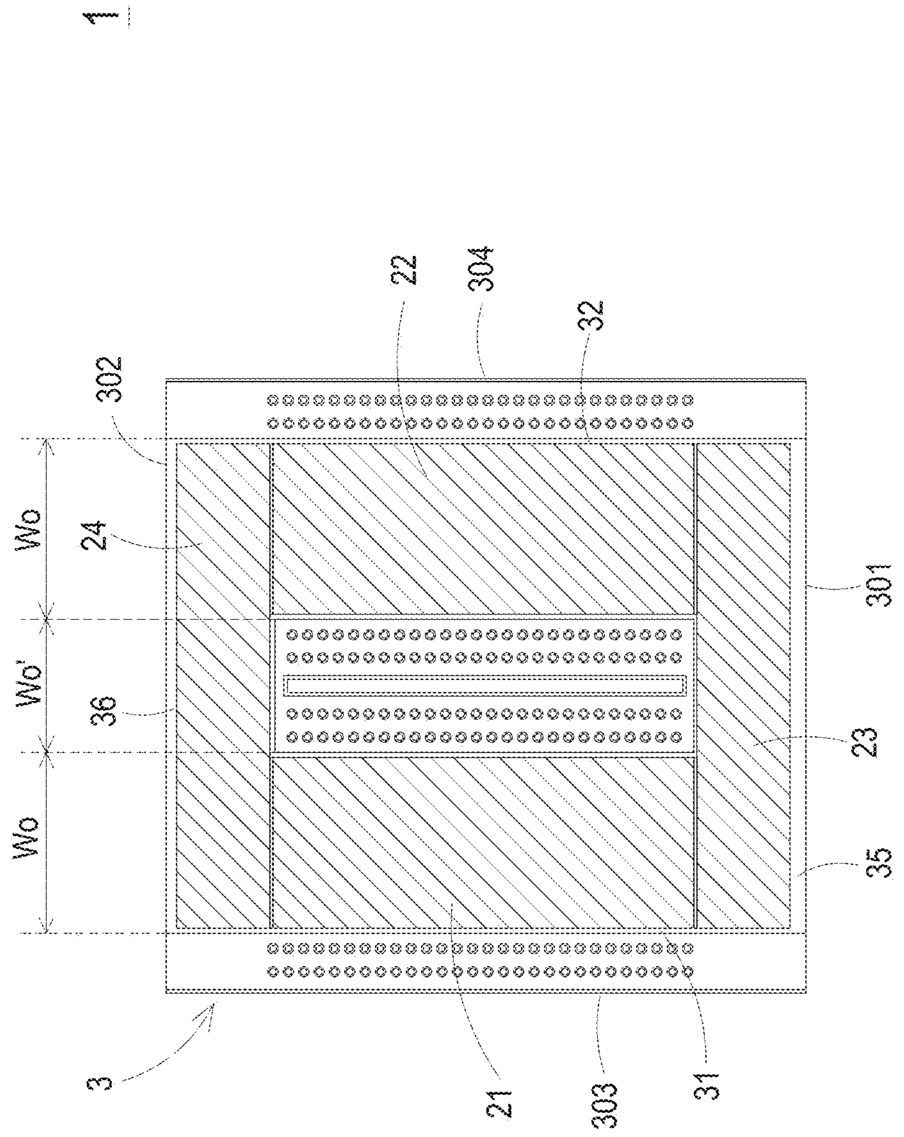
FIG. 5 is a schematic cross-sectional view illustrating the magnetic element as shown in FIG. 2 and taken along the line B-B'.

Please refer to FIGS. 2, 3, 4 and 5. FIG. 2 is a schematic perspective view illustrating a magnetic element according to an embodiment of the present invention. FIG. 3 is a schematic exploded view illustrating the magnetic element as shown in FIG. 2. FIG. 4 is a schematic cross-sectional view illustrating the magnetic element as shown in FIG. 2 and taken along the line A-A'. FIG. 5 is a schematic cross-sectional view illustrating the magnetic element as shown in FIG. 2 and taken along the line B-B'.

In an embodiment, the magnetic element 1 includes a magnetic core assembly 2 and a winding assembly. The magnetic core assembly 2 includes a first magnetic part 21 and a second magnetic part 22. The first magnetic part 21 and the second magnetic part 22 are arranged independently. In this embodiment, the first magnetic part 21 and the second magnetic part 22 are located at two opposite sides of the magnetic element 1. The winding assembly is defined by a substrate 3. The substrate 3 is an integral structure. An example of the substrate 3 includes but is not limited to a printed circuit board, a ceramic substrate, or a substrate with manual flat-wound copper foil. The substrate 3 includes a first accommodation space 31, a second accommodation space 32 and a first metal structure 34. The first accommodation space 31 and the second accommodation space 32 are enclosed by the first metal structure 34. The first accommodation space 31 and the second accommodation space 32 are located at two opposite sides of the substrate 3. The first magnetic part 21 is disposed within the first accommodation space 31. The second magnetic part 22 is disposed within the second accommodation space 32 (see FIGS. 4 and 5). In an embodiment, the winding assembly at least includes a first winding. The first metal structure 34 is formed as at least a portion of the first winding of the winding assembly.

In an embodiment, the substrate 3 further includes a first opening 35 and a second opening 36. The first opening 35 is located at a first side 301 of the substrate 3. The second opening 36 is located at a second side 302 of the substrate 3. The first side 301 and the second side 302 of the substrate 3 are opposite to each other. That is, the first opening 35 and the second opening 36 are opposite to each other. The first accommodation space 31 and the second accommodation space 32 are arranged between the first opening 35 and the second opening 36. The first opening 35 is in communication with the first accommodation space 31 and the second accommodation space 32. The second opening 36 is in communication with the first accommodation space 31 and the second accommodation space 32. That is, the first opening 35, the first accommodation space 31, the second opening 36 and the second accommodation 32 are formed as a quadrilateral shape.

The magnetic core assembly 2 further includes a third magnetic part 23 and a fourth magnetic part 24 (see FIGS. 3 and 5). The third magnetic part 23 is disposed within the first opening 35. The fourth magnetic part 24 is disposed within the second opening 36. The first magnetic part 21 and the second magnetic part 22 are arranged between the third magnetic part 23 and the fourth magnetic part 24. The two ends of the third magnetic part 23 are connected with a first end of the first magnetic part 21 and a first end of the second magnetic part 22, respectively. The two ends of the fourth magnetic part 24 are connected with a second end of the first magnetic part 21 and a second end of the second magnetic part 22, respectively. In this embodiment, the first magnetic part 21, the second magnetic part 22, the third magnetic part 23 and the fourth magnetic part 24 are arranged independently from each other. In some embodiments, the first magnetic part 21, the second magnetic part 22, the third magnetic part 23, and the fourth magnetic part 24 are arranged as a quadrilateral of any shape, such as a rectangle shape, a parallelogram shape or a trapezoid shape.

FIG. 6 is a flowchart illustrating a method of fabricating the magnetic element as shown in FIG. 2. Firstly, in a step S1, a substrate 3 is provided. The substrate 3 is an integral structure and used as a winding assembly of the magnetic element 1. The substrate 3 includes a first accommodation space 31, a second accommodation space 32 and a first metal structure 34. The first metal structure 34 is formed as at least a portion of the first winding of the winding assembly. As shown in FIG. 5, the widths of the first accommodation space 31 and the second accommodation space 32 are W0. The distance between the first accommodation space 31 and the second accommodation space 32 is W0'. In practice, the tolerance of the widths of each of the first accommodation space 31 and the second accommodation space 32 can be controlled within +/−50 μm. Consequently, the first accommodation space 31 and the second accommodation space 32 have high dimension precision. In a step S2, a magnetic core assembly 2 is provided. The magnetic core assembly 2 includes a first magnetic part 21 and a second magnetic part 22. The first magnetic part 21 and the second magnetic part 22 are arranged independently. The first magnetic part 21 is disposed within the first accommodation space 31. The second magnetic part 22 is disposed within the second accommodation space 32. The first winding is wound around the first magnetic part 21. In an embodiment, the first magnetic part 21 and the second magnetic part 22 of the magnetic core assembly 2 are formed through molds. Consequently, the first magnetic part 21 and the second magnetic part 22 can be machined easily. In another embodiment, the first magnetic part 21 and the second magnetic part 22 are formed by cutting a magnetic core (not shown). Consequently, the dimension precision is enhanced. For achieving the easily-machined purpose and the high dimension precision, the first magnetic part 21 and the second magnetic part 22 of the magnetic core assembly 2 are firstly formed through molds, and then the first magnetic part 21 and the second magnetic part 22 are polished. Consequently, the dimension tolerance is controlled to be in the range between 0 μm and 50 μm.

As mentioned above, the first magnetic part 21 and the second magnetic part 22 are arranged independently, the first magnetic part 21 is disposed within the first accommodation space 31, and the second magnetic part 22 is disposed within the second accommodation space 32. Consequently, the first magnetic part 21 and the second magnetic part 22 can be polished separately. Moreover, since the first magnetic part 21 and the second magnetic part 22 are respectively positioned in the first accommodation space 31 and the second accommodation space 32 of the substrate 3, the first magnetic part 21 and the second magnetic part 22 are not influenced by each other. After the first magnetic part 21 and the second magnetic part 22 are polished separately, the first magnetic part 21 and the second magnetic part 22 are respectively positioned in the first accommodation space 31 and the second accommodation space 32. In other words, the position precision of the first magnetic part 21 and the position precision of the second magnetic part 22 are not related to each other. The position precision between the first magnetic part 21 and the second magnetic part 22 is determined according to the position precision between the first accommodation space 31 and the second accommodation space 32. Since the dimension precisions and position precisions of the first accommodation space 31 and the second accommodation space 32 in the substrate 3 are very high, the position precision between the first magnetic part 21 and the second magnetic part 22 is very high. Consequently, the size of the magnetic element 1 is smaller than the conventional magnetic element, and the power density is enhanced.

In some embodiments, the magnetic element 1 includes a single magnetic part and a single accommodation space. That is, the magnetic element 1 includes the first magnetic part 21 and the first accommodation space 31.

Hereinafter, some examples of the method for assembling the substrate and the magnetic core assembly of the magnetic element will be illustrated with reference to FIGS. 2 to 6 and FIGS. 7A to 7F.

Figure 7A:
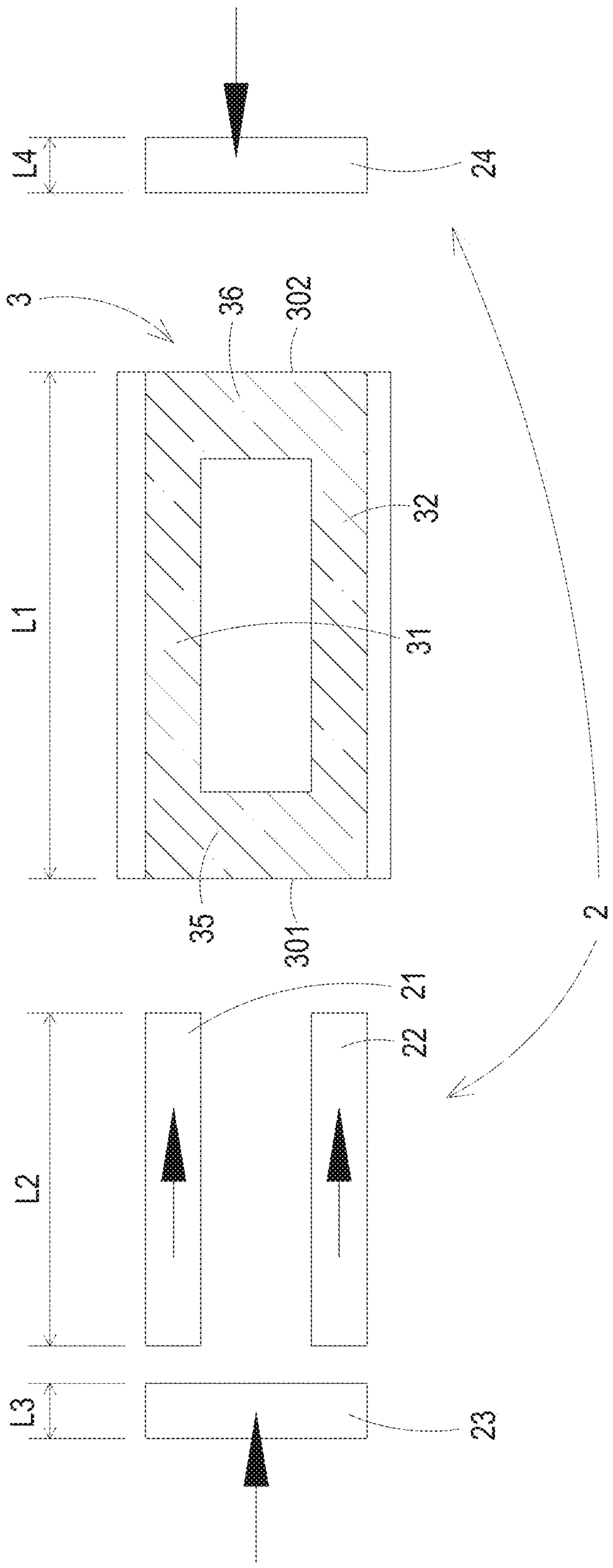
FIG. 7A schematically illustrates a first exemplary method for assembling the substrate and the magnetic core assembly of the magnetic element as shown in FIG. 2.

FIG. 7A schematically illustrates a first exemplary method for assembling the substrate and the magnetic core assembly of the magnetic element as shown in FIG. 2. The first magnetic part 21, the second magnetic part 22 and the third magnetic part 23 of the magnetic core assembly 2 are put into the substrate 3 through the first opening 35 at the first side 301 of the substrate 3. The fourth magnetic part 24 of the magnetic core assembly 2 is put into the substrate 3 through the second opening 36 at the second side 302 of the substrate 3. The first magnetic part 21 and the second magnetic part 22 are located beside the two long sides of the substrate 3, respectively. That is, the first magnetic part 21 and the second magnetic part 22 are disposed within the first accommodation space 31 and the second accommodation space 32 of the substrate 3, respectively. The first magnetic part 21 and the second magnetic part 22 are approximately parallel with each other. For example, the angle between the first magnetic part 21 and the second magnetic part 22 is in the range between 0 and 5 degrees. The third magnetic part 23 and the fourth magnetic part 24 are located beside the two short sides of the substrate 3, respectively. That is, the third magnetic part 23 and the fourth magnetic part 24 are disposed within the first opening 35 and the second opening 36 of the substrate 3, respectively. The third magnetic part 23 and the fourth magnetic part 24 are approximately parallel with each other. For example, the angle between the third magnetic part 23 and the fourth magnetic part 24 is in the range between 0 and 5 degrees.

In some embodiments, the two ends of the first magnetic part 21 are respectively connected with the third magnetic part 23 and the fourth magnetic part 24 through insulation material (not shown). The two ends of the second magnetic part 22 are respectively connected with the third magnetic part 23 and the fourth magnetic part 24 through insulation material (not shown). The inductance value of the magnetic element 1 may be adjusted according to the thickness of the insulation material. Since the first magnetic part 21, the second magnetic part 22, the third magnetic part 23 and the fourth magnetic part 24 in this embodiment are all disposed within the substrate 3, the insulation material is also disposed within the substrate 3. For reducing the magnetic loss of the magnetic element 1, the insulation material is not contacted with the substrate 3. Moreover, since the first magnetic part 21, the second magnetic part 22, the third magnetic part 23 and the fourth magnetic part 24 are all disposed within the substrate 3, the areas of the top surface and the bottom surface of the substrate 3 are large enough. As mentioned above, the wiring is limited in conventional magnetic element because the magnetic core is mounted through the substrate. In accordance with the present invention, the wiring is more flexible. Consequently, more components can be disposed on the substrate 3, and the performance of the components can be increased.

In this embodiment, the length L1 of the substrate 3 is equal to the sum of the length L2 of the first magnetic part 21, the width L3 of the third magnetic part 23 and the width L4 of the fourth magnetic part 24 (i.e., L1=L2+L3+L4). That is, the first magnetic part 21 is completely disposed within the first accommodation space 31, the second magnetic part 22 is completely disposed within the second accommodation space 32, the third magnetic part 23 is completely disposed within the first opening 35, and the fourth magnetic part 24 is completely disposed within the second opening 36. In some other embodiments, the length L1 of the substrate 3 is smaller than the sum of the length L2 of the first magnetic part 21, the width L3 of the third magnetic part 23 and the width L4 of the fourth magnetic part 24 (i.e., L1<L2+L3+L4). That is, the first magnetic part 21 is completely disposed within the first accommodation space 31, a portion of the third magnetic part 23 is disposed within the first opening 35, another portion of the third magnetic part 23 is exposed outside the substrate 3, a portion of the fourth magnetic part 24 is disposed within the second opening 36, and another portion of the fourth magnetic part 24 is exposed outside the substrate 3.

Figure 7B:
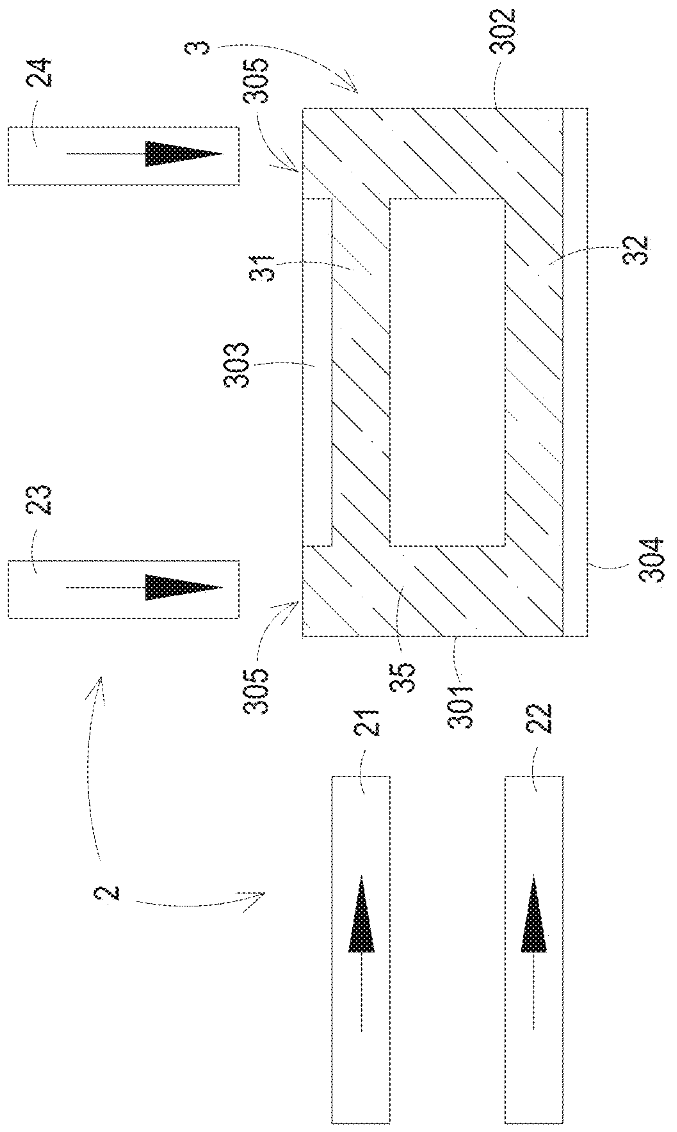
FIG. 7B schematically illustrates a second exemplary method for assembling the substrate and the magnetic core assembly of the magnetic element as shown in FIG. 2.

FIG. 7B schematically illustrates a second exemplary method for assembling the substrate and the magnetic core assembly of the magnetic element as shown in FIG. 2. As shown in FIG. 7B, the substrate 3 further has a third side 303 and a fourth side 304. The third side 303 and the fourth side 304 are arranged between the first side 301 and the second side 302. The third side 303 and the fourth side 304 are opposite to each other. In this embodiment, the third side 303 of the substrate 3 has two third openings 305. The first magnetic part 21 and the second magnetic part 22 are put into the substrate 3 through the first opening 35 at the first side 301 of the substrate 3. The third magnetic part 23 and the fourth magnetic part 24 are put into the substrate 3 through the two third openings 305 at the third side 303 of the substrate 3. In this embodiment, the substrate 3 is equipped with the first opening 35 and the third openings 305, but is not equipped with the second opening.

Figure 7C:
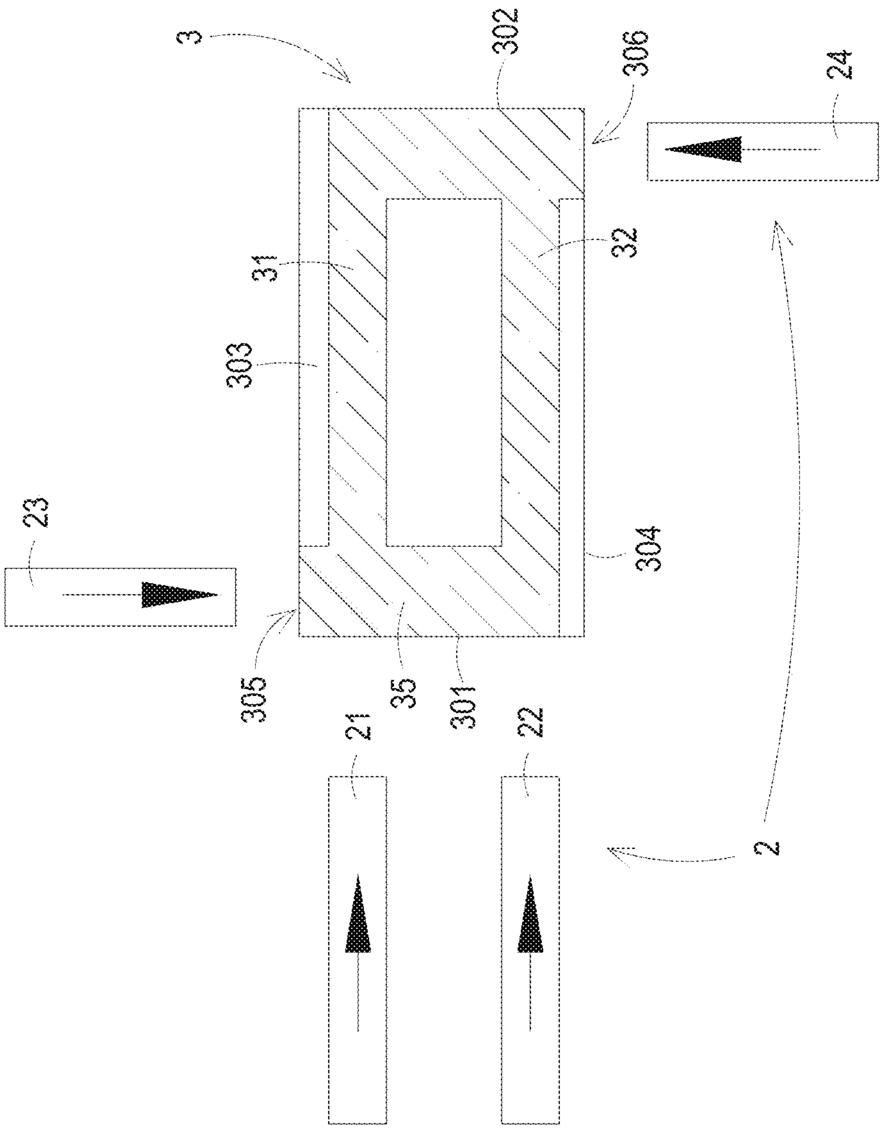
FIG. 7C schematically illustrates a third exemplary method for assembling the substrate and the magnetic core assembly of the magnetic element as shown in FIG. 2.

FIG. 7C schematically illustrates a third exemplary method for assembling the substrate and the magnetic core assembly of the magnetic element as shown in FIG. 2. As shown in FIG. 7C, the substrate 3 further has a third side 303 and a fourth side 304. The third side 303 and the fourth side 304 are arranged between the first side 301 and the second side 302. The third side 303 and the fourth side 304 are opposite to each other. In this embodiment, the third side 303 of the substrate 3 has a third opening 305, and the fourth side 304 of the substrate 3 has a fourth opening 306. The first magnetic part 21 and the second magnetic part 22 are put into the substrate 3 through the first opening 35 at the first side 301 of the substrate 3. The third magnetic part 23 is put into the substrate 3 through the third opening 305 at the third side 303 of the substrate 3. The fourth magnetic part 24 is put into the substrate 3 through the fourth opening 306 at the fourth side 304 of the substrate 3. In this embodiment, the substrate 3 is equipped with the first opening 35, the third opening 305 and the fourth opening 306, but is not equipped with the second opening.

Figure 7D:
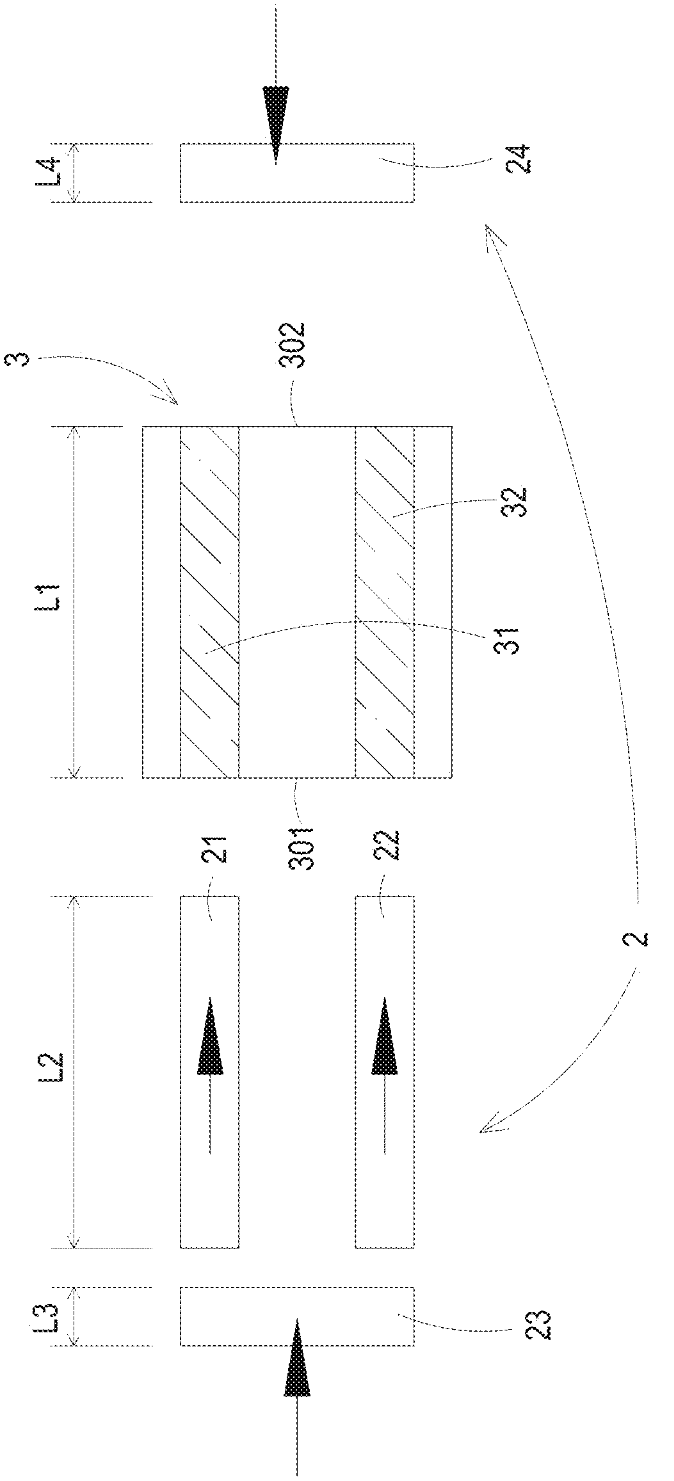
FIG. 7D schematically illustrates a fourth exemplary method for assembling the substrate and the magnetic core assembly of the magnetic element as shown in FIG. 2.

FIG. 7D schematically illustrates a fourth exemplary method for assembling the substrate and the magnetic core assembly of the magnetic element as shown in FIG. 2. In this embodiment, the length L1 of the substrate 3 is equal to the length L2 of the first magnetic part 21. That is, the length L1 of the substrate 3 is equal to the length of the second magnetic part 22. In this embodiment, the two ends of the first magnetic part 21 are respectively located at the first side 301 and the second side 302 of the substrate 3. The two ends of the second magnetic part 22 are respectively located at the first side 301 and the second side 302 of the substrate 3. Consequently, the third magnetic part 23 and the fourth magnetic part 24 are located outside the substrate 3. In some embodiments, the two ends of the first magnetic part 21 are respectively connected with the third magnetic part 23 and the fourth magnetic part 24 through insulation material (not shown). The two ends of the second magnetic part 22 are respectively connected with the third magnetic part 23 and the fourth magnetic part 24 through insulation material (not shown). The inductance value of the magnetic element 1 may be adjusted according to the thickness of the insulation material. Since the third magnetic part 23 and the fourth magnetic part 24 are located outside the substrate 3, the insulation material is also located outside the substrate 3. In other words, since it is not necessary to additionally control the amount of the insulation material, the production process is more flexible. As mentioned above, the third magnetic part 23 and the fourth magnetic part 24 are located outside the substrate 3. Consequently, after the first magnetic part 21 and the second magnetic part 22 are finely polished, the first magnetic part 21 and the second magnetic part 22 can be precisely disposed within the first accommodation space 31 and the second accommodation space 32, respectively.

In some other embodiments, the length L1 of the substrate 3 is smaller than the length of the first magnetic part 21. A portion of the first magnetic part 21 is disposed within the first accommodation space 31, and another portion of the first magnetic part 21 is located outside the first accommodation space 31. A portion of the second magnetic part 22 is disposed within the second accommodation space 32, and another portion of the second magnetic part 22 is located outside the second accommodation space 32.

Figure 7E:
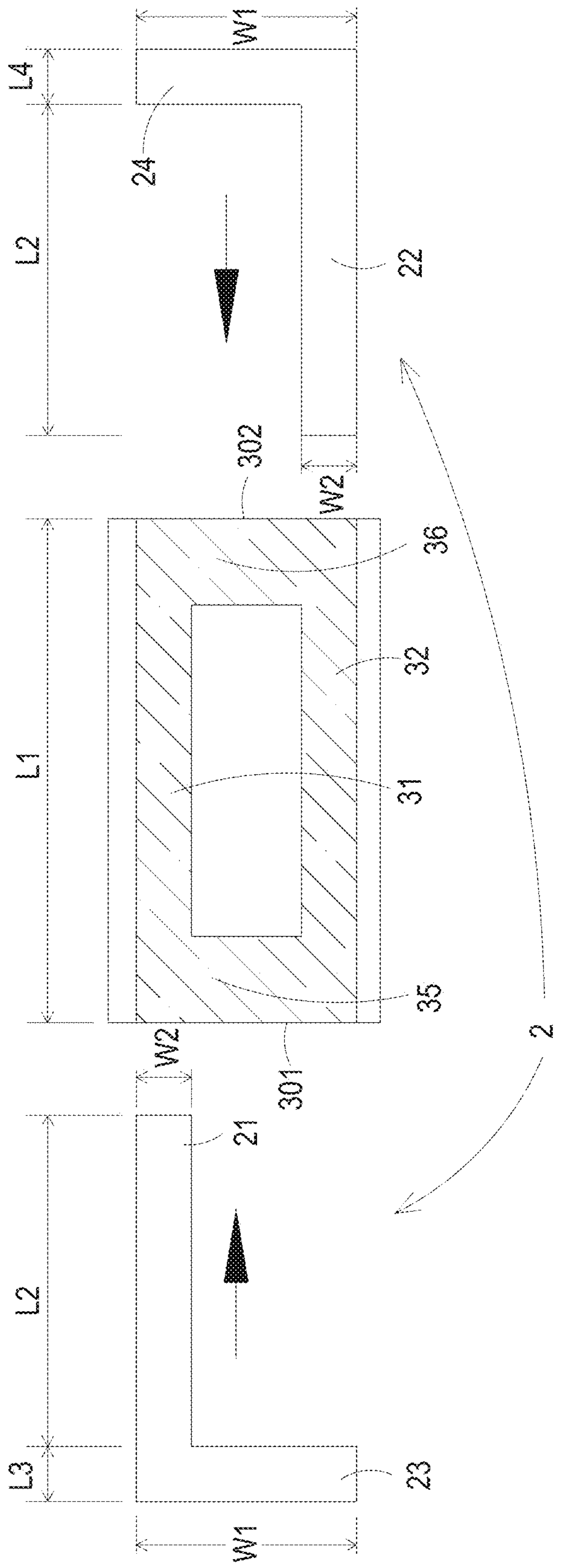
FIG. 7E schematically illustrates a fifth exemplary method for assembling the substrate and the magnetic core assembly of the magnetic element as shown in FIG. 2.

FIG. 7E schematically illustrates a fifth exemplary method for assembling the substrate and the magnetic core assembly of the magnetic element as shown in FIG. 2. In this embodiment, the first magnetic part 21 and the third magnetic part 23 are integrally formed as an L-shaped structure, and the second magnetic part 22 and the fourth magnetic part 24 are integrally formed as another L-shaped structure. The dimensions of the first magnetic part 21 and the second magnetic part 22 need to match the dimensions of the first accommodation space 31 and the second accommodation space 32, respectively. After the L-shaped structure of the first magnetic part 21 and the third magnetic part 23 is processed through the mold, the length L2 of the first magnetic part 21 and the width L3 of the third magnetic part 23 (i.e., the long side of the L-shaped structure) need to be precisely controlled, and the length W1 of the third magnetic part 23 and the width W2 of the first magnetic part 21 need to be precisely controlled. For example, a machine tool is used to polish all sides. Consequently, the length L2 of the first magnetic part 21 and the width L3 of the third magnetic part 23 (i.e., the long side of the L-shaped structure) and the length W1 of the third magnetic part 23 are controlled to be in the acceptable range. Moreover, after the length L2 of the first magnetic part 21 is precisely polished, the width W2 of the first magnetic part 21 is controlled to be in the acceptable range. Consequently, the L-shaped structure of the first magnetic part 21 and the third magnetic part 23 can be completely disposed within the substrate 3. Similarly, after the L-shaped structure of the second magnetic part 22 and the fourth magnetic part 24 is processed through the mold, the length L2 of the second magnetic part 22 and the width L4 of the fourth magnetic part 24 (i.e., the long side of the L-shaped structure) are precisely controlled, and the length W1 of the fourth magnetic part 24 and the width W2 of the second magnetic part 22 are precisely controlled. Consequently, the L-shaped structure of the second magnetic part 22 and the fourth magnetic part 24 can be completely disposed within the substrate 3.

Figure 7F:
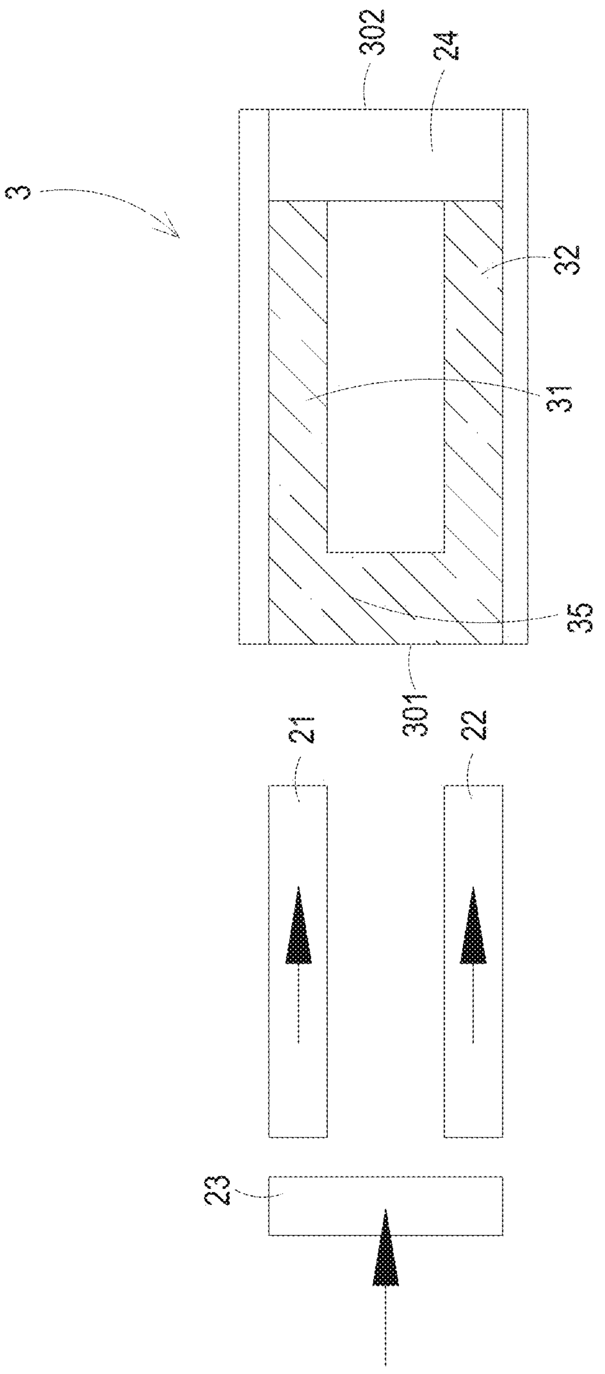
FIG. 7F schematically illustrates a sixth exemplary method for assembling the substrate and the magnetic core assembly of the magnetic element as shown in FIG. 2.

FIG. 7F schematically illustrates a sixth exemplary method for assembling the substrate and the magnetic core assembly of the magnetic element as shown in FIG. 2. In this embodiment, the second side 302 of the substrate 3 has no opening. For example, the fourth magnetic part 24 is pre-embedded in the substrate 3. The fourth magnetic part 24 is located at the second side 302 of the substrate 3. The first magnetic part 21, the second magnetic part 22 and the third magnetic part 23 are put into the substrate 3 through the first opening 35 at the first side 301 of the substrate 3.

According to the above embodiments of the magnetic element 1, the independent magnetic parts with high precision are produced. That is, the first magnetic part 21, the second magnetic part 22, the third magnetic part 23 and the fourth magnetic part 24 with high precision are individually disposed. For assembling the magnetic element 1, only the assembly precision between the first magnetic part 21, the second magnetic part 22, the third magnetic part 23 and the fourth magnetic part 24 and its corresponding accommodation space needs to be satisfied. After the first magnetic part 21, the second magnetic part 22, the third magnetic part 23 and the fourth magnetic part 24 are assembled with the substrate 3, the position tolerance between the first magnetic part 21 and the second magnetic part 22 is completely determined according to the first accommodation space 31 and the second accommodation space 32. In other words, the positions of the first accommodation space 31 and the second accommodation space 32 of the substrate 3 are determined according to the method of installing the first magnetic part 21 and the second magnetic part 22 in the first accommodation space 31 and the second accommodation space 32. Since the dimension precisions and the position precisions of the first accommodation space 31 and the second accommodation space 32 in the substrate 3 are very high, the tolerance of the relative position between the first magnetic part 21 and the second magnetic part 22 is very small. Consequently, when compared with the conventional technologies, the size of the magnetic element 1 of the present invention is reduced and the power density of the module is enhanced. In case that the size of the module is not changed, the cross-section area of the magnetic core can be increased and thus the magnetic loss will be effectively reduced.

In an embodiment, the first magnetic part 21, the second magnetic part 22, the third magnetic part 23 and the fourth magnetic part 24 of the magnetic core assembly 2 are made of stress-sensitive material. In addition, there is a certain gap between the magnetic core assembly 2 and the substrate 3. Consequently, during the fabricating process or the using process of the magnetic element 1, the interaction force between the substrate 3 and the magnetic core assembly 2 is reduced. Therefore, the magnetic loss of the magnetic core assembly 2 is reduced, the performance of the power module with the magnetic element 1 is enhanced.

A manufacturing method of the substrate 3 will be described as follows. For succinctness, only the process of manufacturing the portion of the substrate 3 for accommodating the first magnetic part 21 will be described. The process of manufacturing the portion of the substrate 3 for accommodating the second magnetic part 22 is similar, and not redundantly described herein. FIGS. 8A to 8G are schematic cross-sectional views illustrating a process of manufacturing a magnetic element according to a first embodiment of the present invention.

Figure 8A:
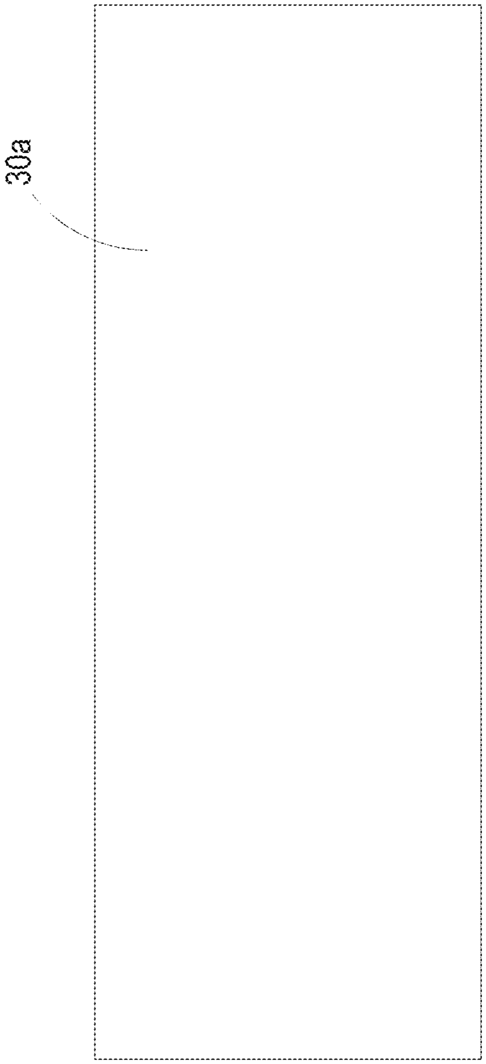
FIGS. 8A to 8G are schematic cross-sectional views illustrating a process of manufacturing a magnetic element according to a first embodiment of the present invention.

Please refer to FIG. 8A. Firstly, a base 30*a* is provided. For example, the base 30*a* is a printed circuit board.

Figure 8B:
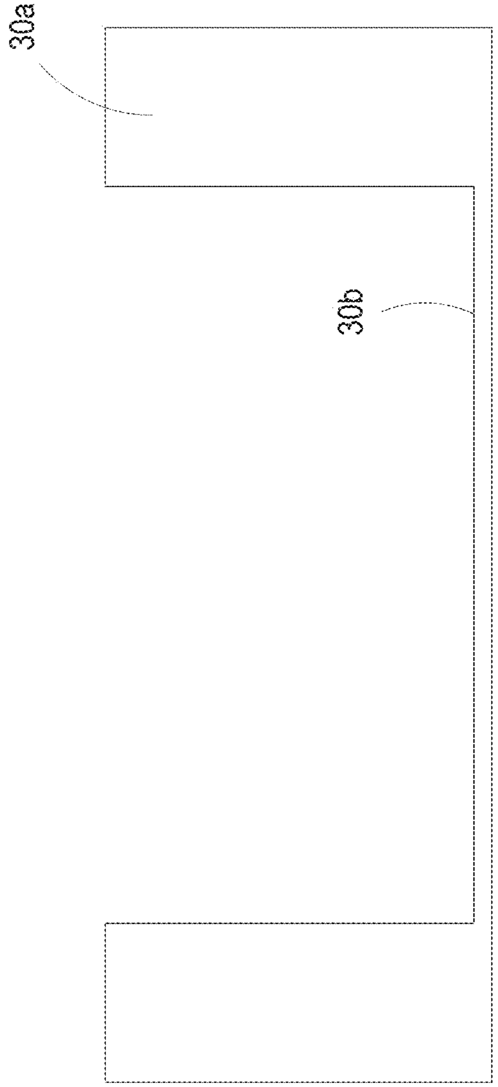

Please refer to FIG. 8B. Then, a recess 30*b* is formed in the base 30*a*. For example, the recess 30*b* is formed through a machining process or a laser drilling process.

Figure 8C:
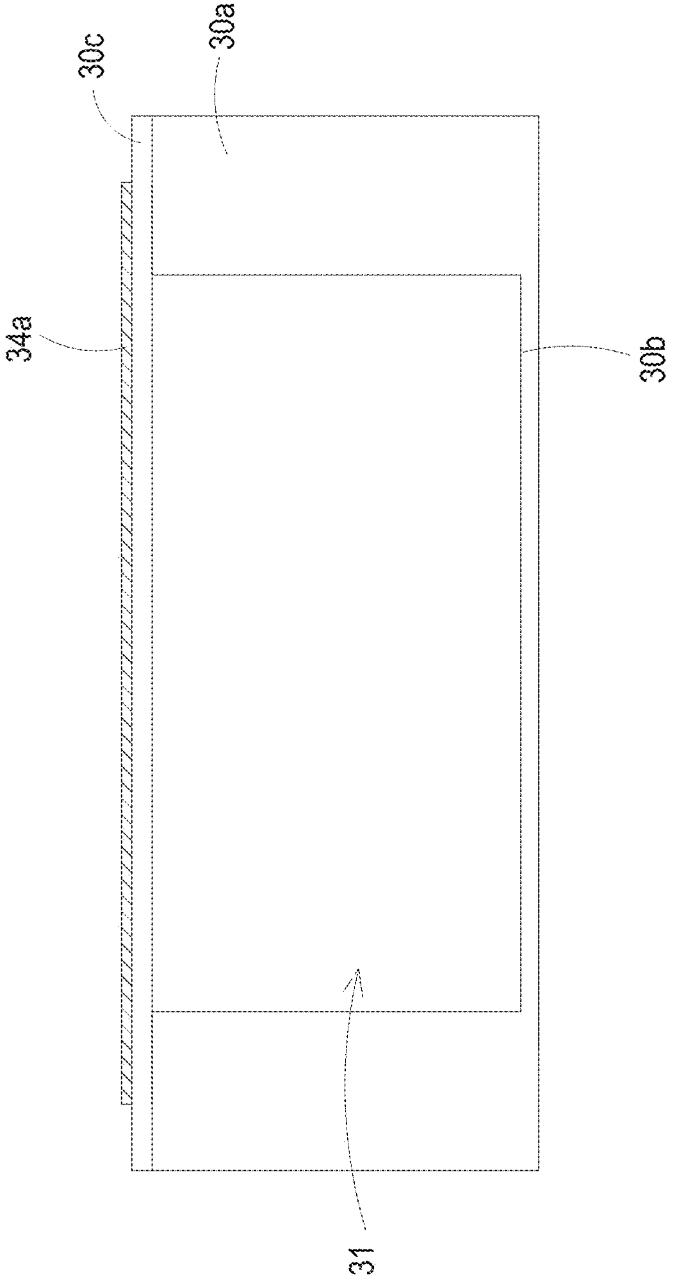

Please refer to FIG. 8C. Then, a top plate 30*c* is laminated on the base 30*a* to cover the recess 30*b*, and a first horizontal copper foil 34*a* is formed on the top plate 30*c*. A first accommodation space 31 is defined by the base 30*a* and the top plate 30*c* collaboratively. The top plate 30*c* is made of insulation material. In an embodiment, the top plate 30*c* is placed on the base 30*a* through insulation glue. At a high temperature, the top plate 30*c* is adhered on the base 30*a* through a cross-linking reaction of the insulation glue. The way of adhering the top plate 30*c* on the base 30*a* through the insulation glue will be described with reference to FIGS. 9A, 9B and 9C. In an embodiment, the top plate 30*c*, the insulating glue and the base 30*a* are all made of fiber-reinforced composite material.

Alternatively, the top plate 30*c* and the base 30*a* are made of fiber-reinforced composite material, and the insulating glue is made of epoxy resin.

The cross-section area of the first accommodation space 31 is determined according to the cross-section area of the first magnetic part 21. That is, there is a specified relationship between the cross-section area of the first accommodation space 31 and the cross-section area of the first magnetic part 21. For example, the cross-section area of the first accommodation space 31 is substantially equal to the cross-section area of the first magnetic part 21. When the tolerance is taken into consideration, the cross-section area of the first accommodation space 31 is slightly greater than the cross-section area of the first magnetic part 21. Consequently, the first magnetic part 21 can be completely disposed in the first accommodation space 31 while saving the installation space of the substrate 3.

Generally, if the lamination of the top plate 30*c* and the base 30*a* is subjected to curvy deformation, the volume of the first accommodation space 31 may be shrunken. For solving this problem, the overall thickness of the top plate 30*c* and the first horizontal copper foil 34*a* needs to be greater than or equal to a specified thickness (e.g., 0.2 mm). In some situations, original material forming the top plate 30*c* and the first horizontal copper foil 34*a* are too thin to meet the requirement of the current flow capacity. Under this circumstance, it is necessary to pretreat the top plate 30*c* before the top plate 30*c* and the base 30*a* are adhered to each other. There are three methods of pretreating the top plate 30*c* described later.

Figure 9A:
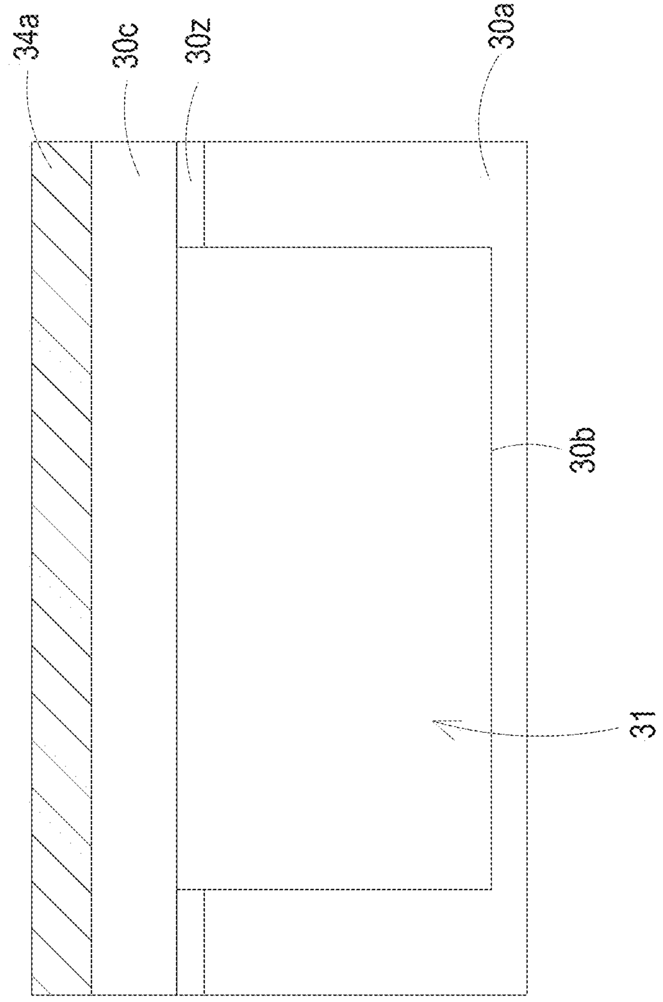
FIG. 9A is a schematic cross-sectional view illustrating a first exemplary example of forming the combination of the top plate and the base of the substrate in the step of FIG. 8C.

FIG. 9A is a schematic cross-sectional view illustrating a first exemplary example of forming the combination of the top plate and the base of the substrate in the step of FIG. 8C. As shown in FIG. 9A, after the top plate 30*c* is laminated on the base 30*a* through insulation glue 30*z*, the top plate 30*c* and the base 30*a* are combined together. Then, copper foil is continuously grown on the top plate 30*c* through a metallization process, so that the first horizontal copper foil 34*a* is formed. The thickness of the first horizontal copper foil 34*a* is 0.07 mm, and the thickness of the top plate 30*c* is 0.13 mm. Consequently, the overall thickness of the top plate 30*c* and the first horizontal copper foil 34*a* is 0.2 mm. Consequently, the requirement of the laminating process and the current flow capacity can be met.

Figure 9B:
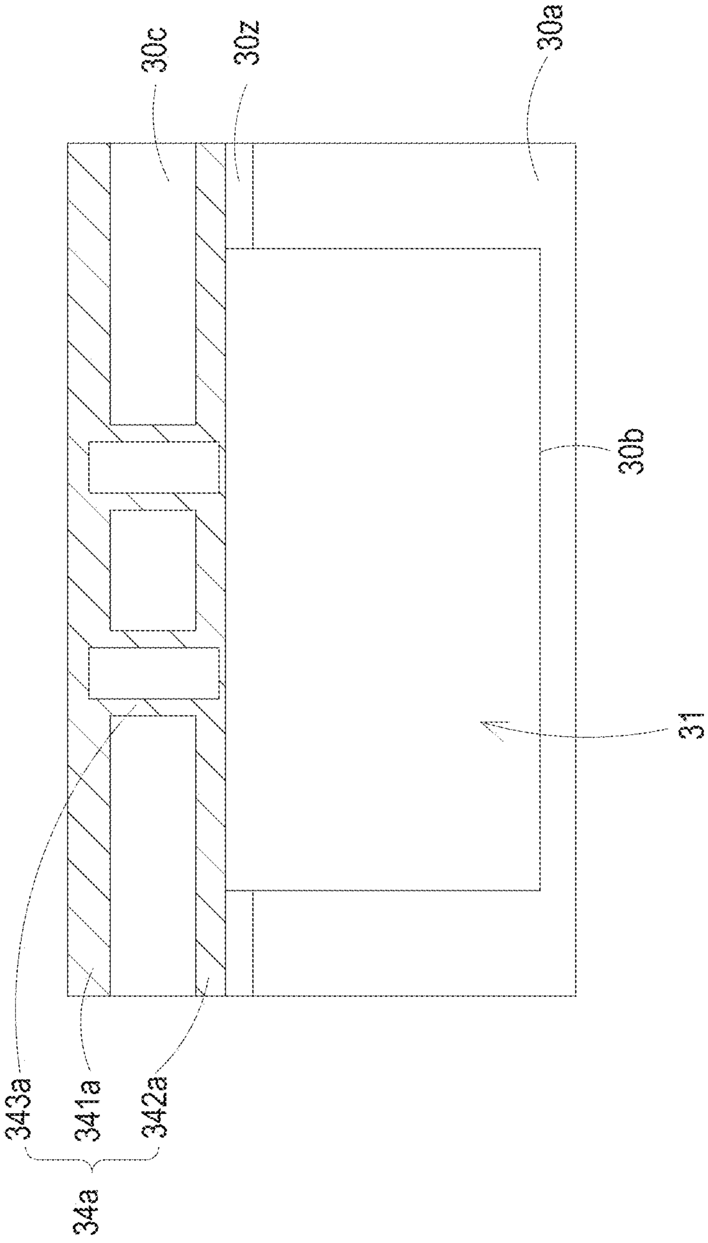
FIG. 9B is a schematic cross-sectional view illustrating a second exemplary example of forming the combination of the top plate and the base of the substrate in the step of FIG. 8C.

FIG. 9B is a schematic cross-sectional view illustrating a second exemplary example of forming the combination of the top plate and the base of the substrate in the step of FIG. 8C. As shown in FIG. 9B, the first horizontal copper foil 34*a* includes a first upper horizontal conductor part 341*a*, a first lower horizontal conductor part 342*a* and a first vertical conductor part 343*a*. The first upper horizontal conductor part 341*a* is formed on an upper side of the top plate 30*c*. The first lower horizontal conductor part 342*a* is formed on a lower side of the top plate 30*c*. The first lower horizontal conductor part 342*a* is laminated on the base 30*a* through insulation glue 30*z*. The first vertical conductor part 343*a* is penetrated through the top plate 30*c*. In addition, the first vertical conductor part 343*a* is connected between the first upper horizontal conductor part 341*a* and the first lower horizontal conductor part 342*a*. The first upper horizontal conductor part 341*a* and the first lower horizontal conductor part 342*a* are parallel. For example, in case that the thickness of the first upper horizontal conductor part 341*a* is 1 oz and the thickness of the first lower horizontal conductor part 342 is 1 oz, the current flow capacity corresponding to 2 oz can be achieved.

Figure 9C:
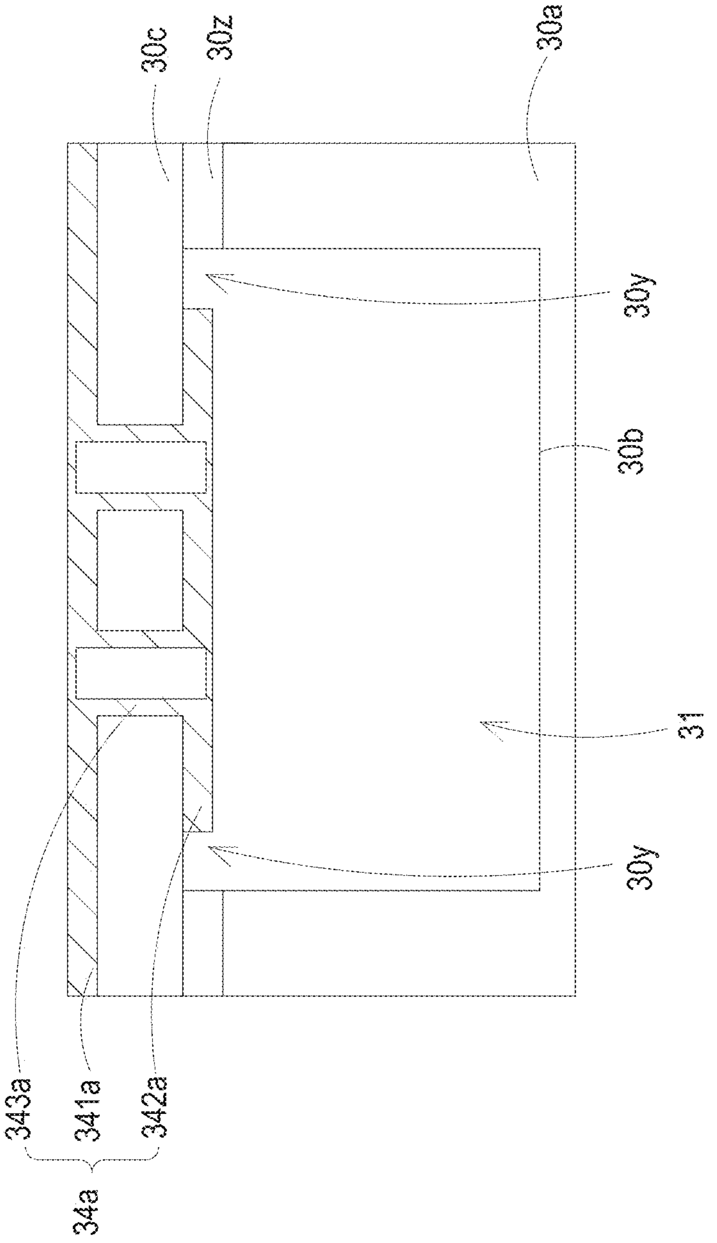
FIG. 9C is a schematic cross-sectional view illustrating a third exemplary example of forming the combination of the top plate and the base of the substrate in the step of FIG. 8C.

FIG. 9C is a schematic cross-sectional view illustrating a third exemplary example of forming the combination of the top plate and the base of the substrate in the step of FIG. 8C. In comparison with the embodiment of FIG. 9B, the top plate 30*c* of the embodiment of FIG. 9C is laminated on the base 30*a* through insulation glue 30*z*, and there is a gap 30*y* between the lateral side of the first lower horizontal conductor part 342*a* and the insulation glue 30*z*. The gap 30*y* is a space allowing the insulation glue 30*z* to flow therein. While the top plate 30*c* is laminated on the base 30*a*, the insulation glue 30*z* will not overflow to the first accommodation space 31. In other words, the available space of the first accommodation space 31 is not shrunken. The assembling of the magnetic element is easier.

The above metallization process includes an electroplating process or an electroless plating process. In case that the required thickness of the first metal structure 34 is small, the electroless plating process is feasible. In this situation, the current flow capacity is low. In case that the required current flow capacity is high, the electroplating process is needed. Optionally, before the electroplating process is performed, a seed layer is provided through an electroless plating process, a sputtering process or an evaporation process. Consequently, the functions of providing the surface conductivity and increasing the bonding force are achieved.

In case that the terminal load requires a lower voltage and a larger current, the demands on the high current flow capacity of the power supply module increase. Consequently, the thickness of the electroplated copper needs to be higher than or equal to a specified thickness (e.g., 70 μm). There are several approaches of forming the combination of the top plate and the base of the substrate as shown in FIGS. 9B and 9C. In accordance with the first approach, the first upper horizontal conductor part 341*a* and the first vertical conductor part 343*a* are formed by a single electroplating process. Generally, the surface electroplating rate is faster than the lateral electroplating rate. That is, the electroplating rate of the first upper horizontal conductor part 341*a* is faster than the electroplating rate of the first vertical conductor part 343*a*. Consequently, when the thickness of the first vertical conductor part 343*a* reaches 70 μm, the thickness of the first upper horizontal conductor part 341*a* is greater than 70 μm. The thickness of the substrate will be increased.

In accordance with a second approach, a leak hole electroplating technology is employed. Since the surface electroplating rate is faster than the lateral electroplating rate, the first upper horizontal conductor part 341*a* is usually much thicker than the first vertical conductor part 343*a*. The use of the leak hole electroplating technology can overcome the above problem. After a first electroplating process, the thickness of the first upper horizontal conductor part 341*a* and the thickness of the first vertical conductor part 343*a* are smaller than 70 μm. For example, the thickness of the first upper horizontal conductor part 341*a* is m, and the thickness of the first vertical conductor part 343*a* is smaller than 40 μm. Then, a covering film is placed on the surface of the first upper horizontal conductor part 341*a*, wherein a hollow region corresponding to the first vertical conductor part 343*a* is exposed. Then, the copper foil is continuously grown on the hollow region through a metallization process until the thickness of the first vertical conductor part 343*a* reaches 70 μm. Then, the covering film is removed. Then, the thickness of the first upper horizontal conductor part 341*a* reaches 70 μm by a second electroplating process. This approach can effectively control the thickness of the electroplated copper.

In accordance with a third approach, a hole-filling electroplating technology is employed. The electroplating rate of the first upper horizontal conductor part 341*a* is faster than the electroplating rate of the first vertical conductor part 343*a*. The copper foil is continuously grown on a hollow region corresponding to the first vertical conductor part 343*a* through a metallization process until the thickness of the first vertical conductor part 343*a* reaches 70 μm. Then, the first upper horizontal conductor part 341*a* is subjected to an electroplating process until the thickness of the first upper horizontal conductor part 341*a* reaches 70 μm.

Figure 8D:
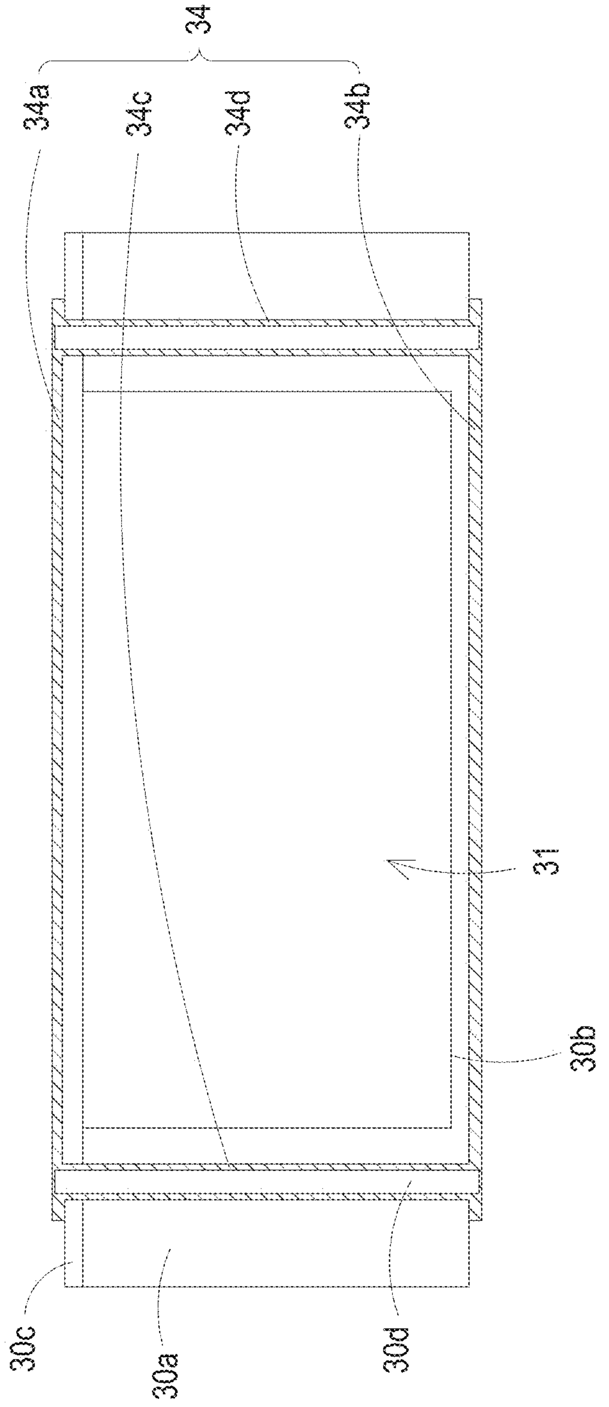

Please refer to FIG. 8D. A second horizontal copper foil 34*b* is formed on a bottom side of the base 30*a*. The first horizontal copper foil 34*a* and the second horizontal copper foil 34*b* are opposite to each other with respect to the first accommodation space 31. The base 30*a* further includes a plurality of first through holes 30*d*. The first through holes 30*d* run through the top plate 30*c* and the base 30*a*. In addition, the first through holes 30*d* are arranged between the first horizontal copper foil 34*a* and the second horizontal copper foil 34*b*. For succinctness, only two first through holes 30*d* are shown. Moreover, a first connection copper foil 34*c* and a second connection copper foil 34*d* are formed in the inner walls of the corresponding first through holes 30*d* and penetrated through the top plate 30*c* and the base 30*a*. The first connection copper foil 34*c* is connected with a first end of the first horizontal copper foil 34*a* and a first end of the second horizontal copper foil 34*b*. The second connection copper foil 34*d* is connected with a second end of the first horizontal copper foil 34*a* and a second end of the second horizontal copper foil 34*b*. The first connection copper foil 34*c*, the second connection copper foil 34*d*, the first horizontal copper foil 34*a* and the second horizontal copper foil 34*b* are collaboratively defined as a first metal structure 34. The portions of the base 30*a* and the top plate 30*c* that are covered by the first metal structure 34 are collaboratively formed as a first insulation structure. In this embodiment, for achieving the stability and maintaining the distance between the first through hole 30*d* and the first accommodation space 31, the shortest distance between the first through hole 30*d* and the first accommodation space 31 is greater than 0.2 mm. Consequently, when the first through holes 30*d* are drilled, glass fibers of the insulation material will not affect the magnetic part located within the first accommodation space 31 along the drilling direction. Therefore, the magnetic part will not be disrupted and the tolerance of the drilling process will be reduced.

Figure 8E:
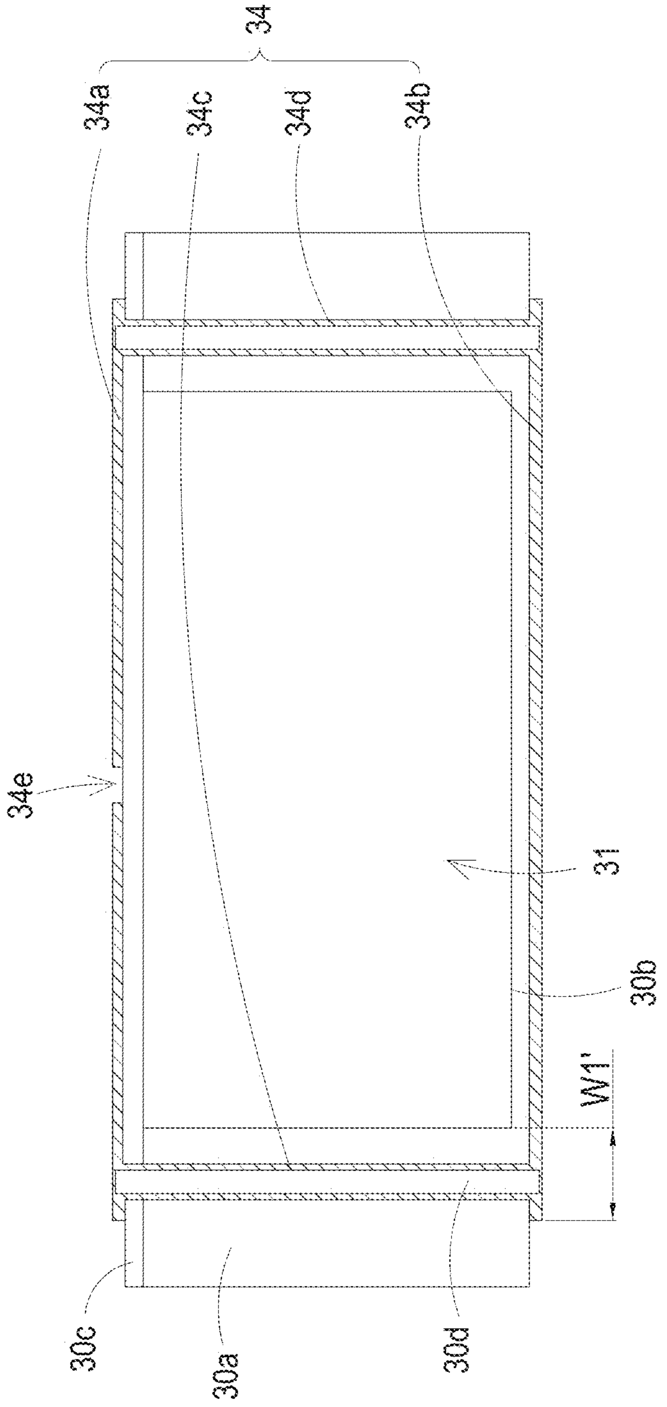

Please refer to FIG. 8E. Then, a chemical etching process is performed to form an etch hole 34*e* in the first horizontal copper foil 34*a*.

Figure 8F:
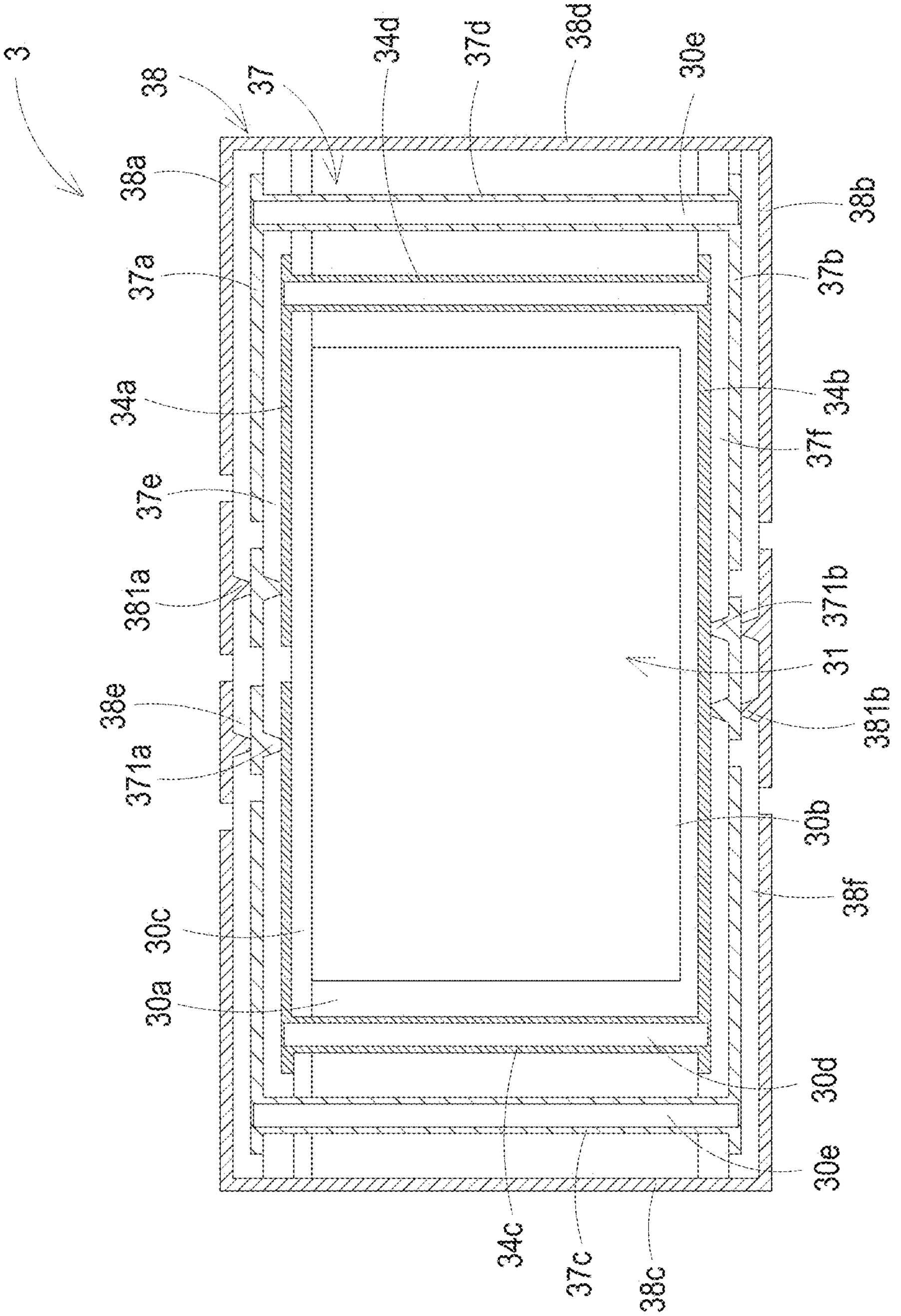

Please refer to FIG. 8F. Then, a first insulation layer 37*e* and a third horizontal copper foil 37*a* are sequentially formed on the first horizontal copper foil 34*a*. The first insulation layer 37*e* is arranged between the third horizontal copper foil 37*a* and the first horizontal copper foil 34*a*. In addition, a second insulation layer 37*f* and a fourth horizontal copper foil 37*b* are sequentially formed on the second horizontal copper foil 34*b*. The second insulation layer 37*f* is arranged between the fourth horizontal copper foil 37*b* and the second horizontal copper foil 34*b*. In this embodiment, the third horizontal copper foil 37*a* and the fourth horizontal copper foil 37*b* are opposite to each other with respect to the first accommodation space 31.

The base 30*a* further includes a plurality of second through holes 30*e*. The second through holes 30*e* run through the top plate 30*c* and the base 30*a*. In addition, the second through holes 30*e* are arranged between the third horizontal copper foil 37*a* and the fourth horizontal copper foil 37*b*. For succinctness, only two second through holes 30*e* are shown. Moreover, a third connection copper foil 37*c* and a fourth connection copper foil 37*d* are formed in the inner walls of the corresponding second through holes 30*e* and penetrated through the top plate 30*c* and the base 30*a*. The third connection copper foil 37*c* is connected with a first end of the third horizontal copper foil 37*a* and a first end of the fourth horizontal copper foil 37*b*. The fourth connection copper foil 37*d* is connected with a second end of the third horizontal copper foil 37*a* and a second end of the fourth horizontal copper foil 37*b*. The third connection copper foil 37*c*, the fourth connection copper foil 37*d*, the third horizontal copper foil 37*a* and the fourth horizontal copper foil 37*b* are collaboratively defined as a second metal structure 37. The portions of the first insulation layer 37*e*, the second insulation layer 37*f*, the base 30*a* and the top plate 30*c* that are covered by the second metal structure 37 are collaboratively formed as a second insulation structure. That is, the second insulation structure is arranged between the first metal structure 34 and the second metal structure 37.

As shown in FIG. 8F, a plurality of conductive posts 371*a* are connected between the third horizontal copper foil 37*a* and the first horizontal copper foil 34*a*. The conductive posts 371*a* also run through the first insulation layer 37*e* to connect the first horizontal copper foil 34*a*. Moreover, a plurality of conductive posts 371*b* are connected between the fourth horizontal copper foil 37*b* and the second horizontal copper foil 34*b*. The conductive posts 371*b* also run through the second insulation layer 37*f* to connect the second horizontal copper foil 34*b*.

Then, a fifth horizontal copper foil 38*a*, a sixth horizontal copper foil 38*b*, a fifth connection copper foil 38*c*, a sixth connection copper foil 38*d*, a third insulation layer 38*e* and a fourth insulation layer 38*f* are disposed on the outside of the second metal structure 37. The third insulation layer 38*e* is arranged between the fifth horizontal copper foil 38*a* and the third horizontal copper foil 37*a*. The fourth insulation layer 38*f* is arranged between the sixth horizontal copper foil 38*b* and the fourth horizontal copper foil 37*b*. The fifth connection copper foil 38*c* is connected between a first end of the fifth horizontal copper foil 38*a* and a first end of the sixth horizontal copper foil 38*b*. The sixth connection copper foil 38*d* is connected between a second end of the fifth horizontal copper foil 38*a* and a second end of the sixth horizontal copper foil 38*b*. The fifth horizontal copper foil 38*a*, the sixth horizontal copper foil 38*b*, the fifth connection copper foil 38*c* and the sixth connection copper foil 38*d* are collaboratively formed as a third metal structure 38. The portions of the third insulation layer 38*e*, the fourth insulation layer 38*f*, the base 30*a* and the top plate 30*c* that are covered by the third metal structure 38 are collaboratively formed as a third insulation structure. That is, the third insulation structure is arranged between the third metal structure 38 and the second metal structure 37.

As shown in FIG. 8F, a plurality of conductive posts 381*a* are connected between the fifth horizontal copper foil 38*a* and the third horizontal copper foil 37*a*. The conductive posts 381*a* also run through the third insulation layer 38*e* to connect the third horizontal copper foil 37*a*. Moreover, a plurality of conductive posts 381*b* are connected between the sixth horizontal copper foil 38*b* and the fourth horizontal copper foil 37*b*. The conductive posts 381*b* also run through the fourth insulation layer 38*f* to connect the fourth horizontal copper foil 37*b*.

The resulting structure of FIG. 8F is the substrate 3.

Figure 8G:
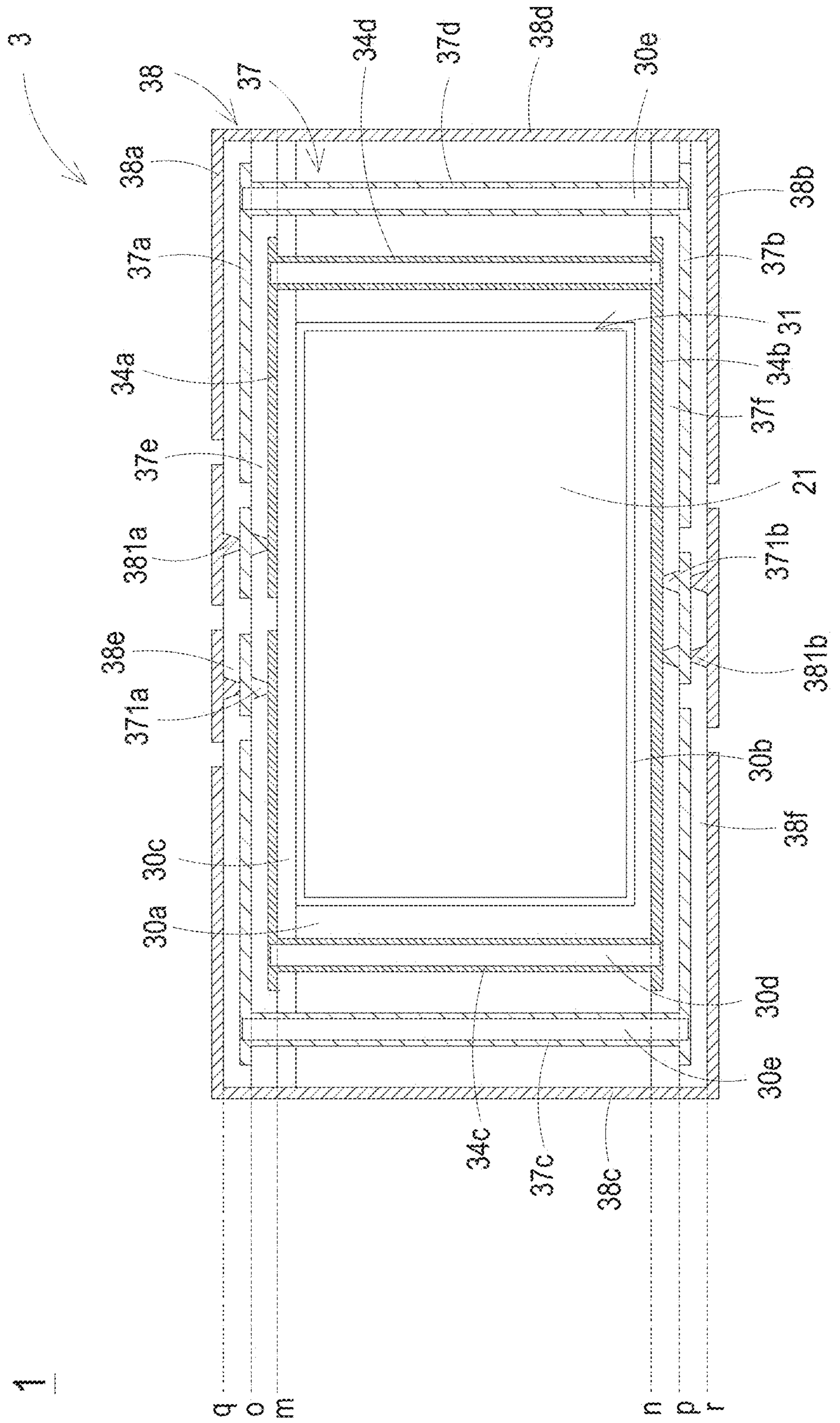

Please refer to FIG. 8G. Then, a first magnetic part 21 is disposed within the first accommodation space 31 of the substrate 3. Consequently, a portion of the magnetic element 1 is produced. The first magnetic part 21 is enclosed by the first horizontal copper foil 34*a*, the first connection copper foil 34*c*, the second horizontal copper foil 34*b* and the second connection copper foil 34*d*.

Please refer to FIG. 8G again. The first horizontal copper foil 34*a* is formed in a first horizontal wiring layer m. The second horizontal copper foil 34*b* is formed in a second horizontal wiring layer n. The first horizontal wiring layer m and the second horizontal wiring layer n are opposite to each other with respect to the first magnetic part 21. The third horizontal copper foil 37*a* is formed in a third horizontal wiring layer o. The fourth horizontal copper foil 37*b* is formed in a fourth horizontal wiring layer p. The third horizontal wiring layer o and the fourth horizontal wiring layer p are opposite to each other with respect to the first magnetic part 21. Moreover, the third horizontal wiring layer o is located at the side of the first horizontal wiring layer m away from the first accommodation space 31. The fourth horizontal wiring layer p is located at the side of the second horizontal wiring layer n away from the first accommodation space 31. The fifth horizontal copper foil 38*a* is formed in a fifth horizontal wiring layer q. The sixth horizontal copper foil 38*b* is formed in a sixth horizontal wiring layer r. The fifth horizontal wiring layer q and the sixth horizontal wiring layer r are opposite to each other with respect to the first magnetic part 21. The fifth horizontal wiring layer q is located at the side of the third horizontal wiring layer o away from the first accommodation space 31. The sixth horizontal wiring layer r is located at the side of the fourth horizontal wiring layer p away from the first accommodation space 31.

In this embodiment, a portion of the fifth horizontal copper foil 38*a*, the fifth connection copper foil 38*c*, a portion of the sixth horizontal copper foil 38*b*, the conductive posts 381*a*, a portion of the third horizontal copper foil 37*a*, the conductive posts 371*a*, a portion of the first horizontal copper foil 34*a*, the second connection copper foil 34*d*, a portion of the second horizontal copper foil 34*b*, the conductive posts 371*b*, a portion of the fourth horizontal copper foil 37*b* and the conductive posts 381*b* are collaboratively defined as a first winding of the magnetic element 1. Moreover, a portion of the third horizontal copper foil 37*a*, the third connection copper foil 37*c*, a portion of the fourth horizontal copper foil 37*b* and the fourth connection copper foil 37*d* are collaboratively defined as a second winding of the magnetic element. The connection relationships between the constituents of the third winding are similar to the connection relationships between the constituents of the first winding. In some embodiments, the second winding is arranged between the first winding and the third winding. Consequently, the second horizontal wiring layer n is connected with the third horizontal wiring layer o through conductive posts, i.e., connected to the solder pads (not shown) on the surface of the magnetic element 1. The connection between the copper foil segments of each winding will be described later.

In an embodiment, the first metal structure 34 is formed as the first winding, the second metal structure 37 is formed as the second winding, and the third metal structure 38 is formed as the third winding. In another embodiment, the magnetic element 1 includes the first winding only, or the magnetic element 1 includes the first winding and the second winding only. In another embodiment, a first portion of the first metal structure 34 and a first portion of the second metal structure 37 are formed as the first winding, and a second portion of the first metal structure 34 and a second portion of the second metal structure 37 are formed as the second winding. Moreover, the second winding and the third winding are wound around the first magnetic part 21. In another embodiment, a first portion of the first metal structure 34 and a first portion of the third metal structure 38 are formed as the first winding, and a second portion of the first metal structure 34 and a second portion of the third metal structure 38 are formed as the third winding. The first portion of the first metal structure 34 and the first portion of the third metal structure 38 are connected with each other through a conductive post. The second portion of the first metal structure 34 and the second portion of the third metal structure 38 are connected with each other through another conductive post.

Figure 10:
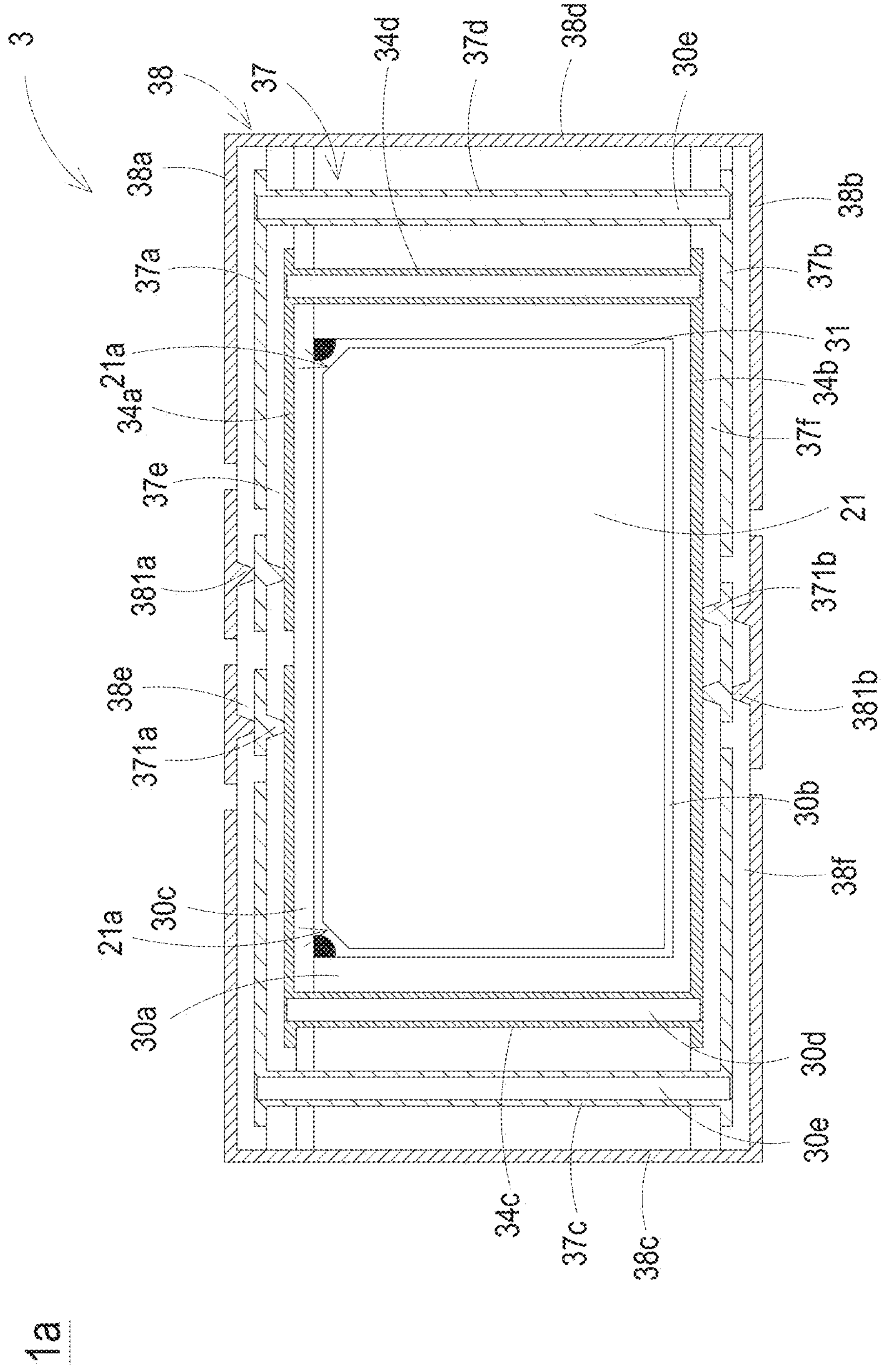
FIG. 10 is a schematic cross-sectional view illustrating a magnetic element according to a second embodiment of the present invention.

FIG. 10 is a schematic cross-sectional view illustrating a magnetic element according to a second embodiment of the present invention. In comparison with the magnetic element of FIG. 8G, at least one edge of the first magnetic part 21 is provided with a chamfer 21*a*, and the chamfer 21*a* is located beside the corner of the first metal structure 34. When the top plate 30*c* is laminated on the base 30*a* through the insulation glue, a portion of the insulation glue (e.g., the two quarter black circles as shown in FIG. 10) may flow into the first accommodation space 31. Due to the chamfer 21*a*, the insulation glue is not contacted with the first magnetic part 21.

Figure 11:
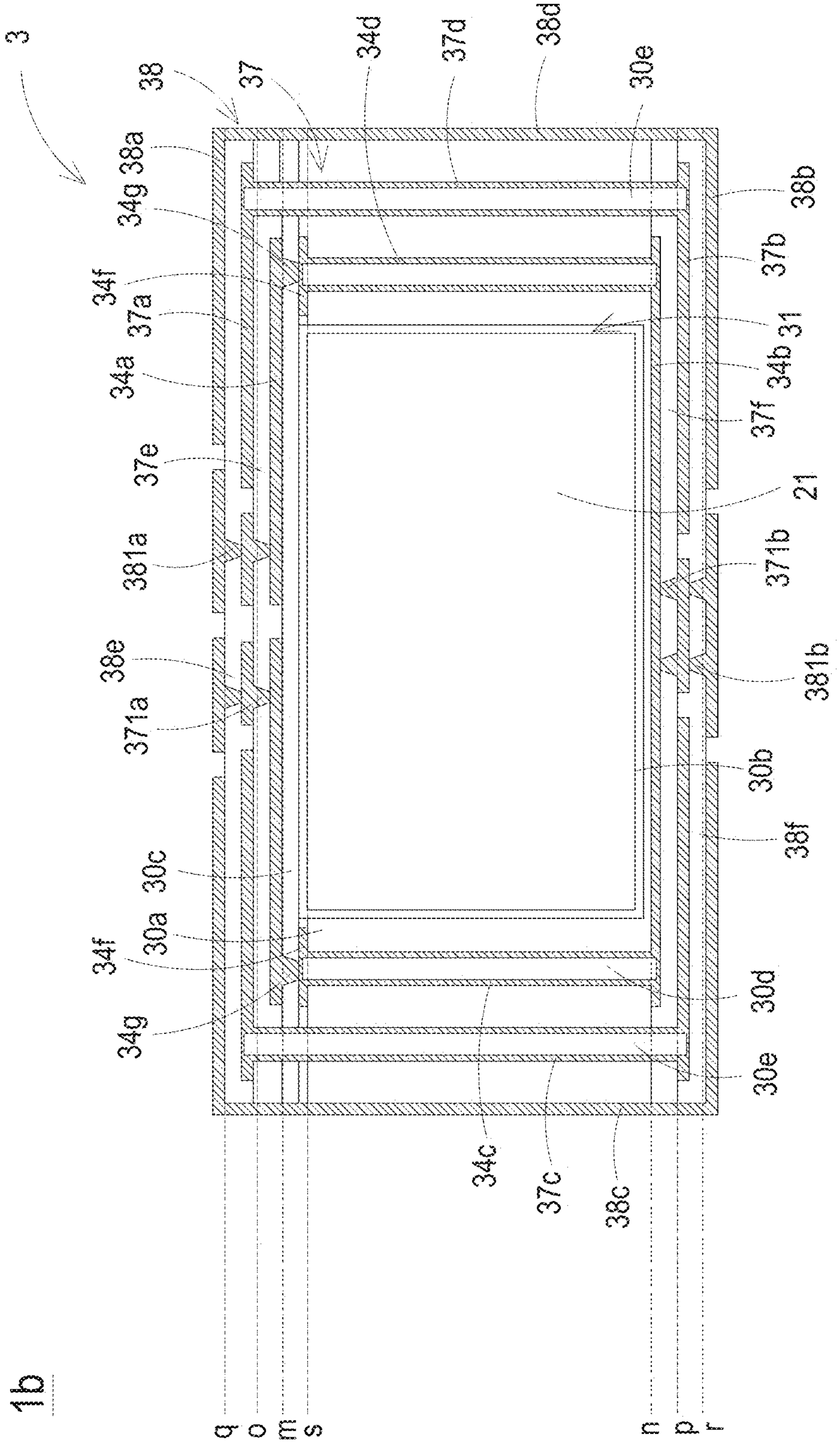
FIG. 11 is a schematic cross-sectional view illustrating a magnetic element according to a third embodiment of the present invention.

However, in some situations, the machine drilling process may result in the deformation of the first accommodation space 31. Because of the deformation of the first accommodation space 31, the dimension tolerance of the first accommodation space 31 is larger. For solving these drawbacks, a plurality of horizontal transition structures and a plurality of conductive posts to be connected with the first connection copper foil 34*c* and the second connection copper foil 34*d* are previously formed on the base 30*a*. Consequently, the possibility of causing the deformation from the machine drilling process is reduced. FIG. 11 is a schematic cross-sectional view illustrating a magnetic element according to a third embodiment of the present invention. In comparison with the magnetic element of FIG. 8G, the substrate 3 of this embodiment further includes a seventh horizontal wiring layer s. The seventh horizontal wiring layer s is arranged between the first horizontal wiring layer m and the second horizontal wiring layer n. The seventh horizontal wiring layer s is located beside the top plate 30*c*. The first metal structure 34 also includes the first horizontal copper foil 34*a*, the second horizontal copper foil 34*b*, the first connection copper foil 34*c* and the second connection copper foil 34*d*. Moreover, the first metal structure 34 further includes two first horizontal transition structures 34*f*. The two first horizontal transition structures 34*f* are formed in the seventh horizontal wiring layer s. Moreover, the two first horizontal transition structures 34*f* are arranged between the base 30*a* and the top plate 30*c*. In some embodiments, the two horizontal transition structures 34*f* are located at two sides of the first magnetic part 21. The two horizontal transition structures 34*f* are respectively connected with two ends of the first horizontal copper foil 34*a* through the corresponding first conductive posts 34*g*. Moreover, the two first horizontal transition structures 34*f* are connected with the first connection copper foil 34*c* and the second connection copper foil 34*d*, respectively.

FIGS. 12A to 12G are schematic cross-sectional views illustrating a process of manufacturing a magnetic element according to a fourth embodiment of the present invention.

Figure 12A:
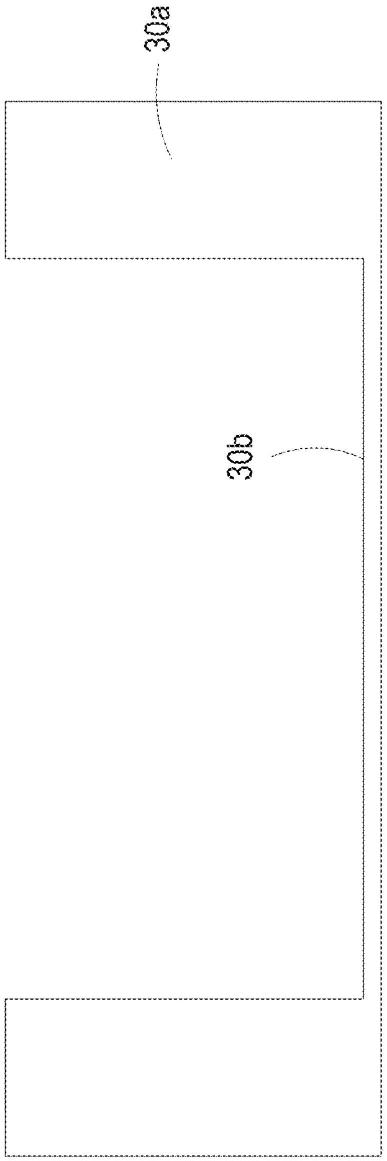
FIGS. 12A to 12G are schematic cross-sectional views illustrating a process of manufacturing a magnetic element according to a fourth embodiment of the present invention.

Please refer to FIG. 12A. Firstly, a base 30*a* with a recess 30*b* is provided. For example, the base 30*a* is a printed circuit board, and the recess 30*b* is formed through a machining process or a laser drilling process. In an embodiment, the recess 30*b* is formed by a controlled-depth drilling process, and the aspect ratio of the recess 30*b* is smaller than 1. Consequently, the copper plating quality and the copper thickness are satisfied.

Figure 12B:
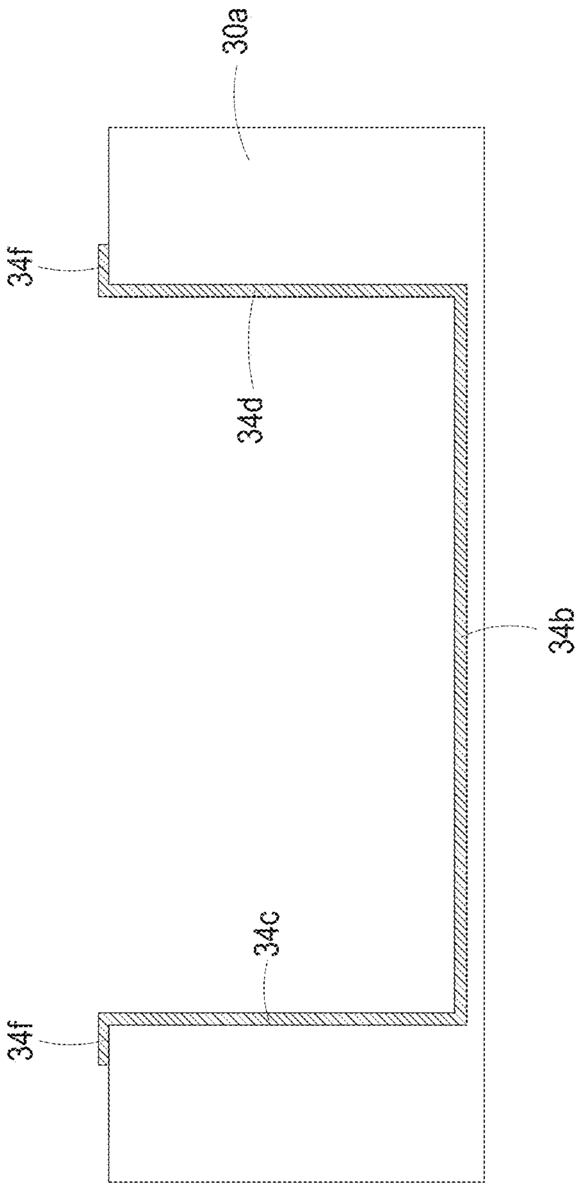

Please refer to FIG. 12B. Then, a second horizontal copper foil 34*b*, a first connection copper foil 34*c* and a second connection copper foil 34*d* are formed on an inner wall of the recess 30*b*. In an embodiment, the second horizontal copper foil 34*b*, the first connection copper foil 34*c* and the second connection copper foil 34*d* are disposed on a plurality of lateral surfaces of the inner wall of the recess 30*b*. The two ends of the second horizontal copper foil 34*b* are connected with a first end of the first connection copper foil 34*c* and a first end of the second connection copper foil 34*d*, respectively. Moreover, two first horizontal transition structures 34*f* are disposed on a top side of the base 30*a*, i.e., outside the recess 30*b*. One of the two first horizontal transition structures 34*f* is connected with a second end of the first connection copper foil 34*c*. The other first horizontal transition structure 34*f* is connected with a second end of the second connection copper foil 34*d*.

Figure 12C:
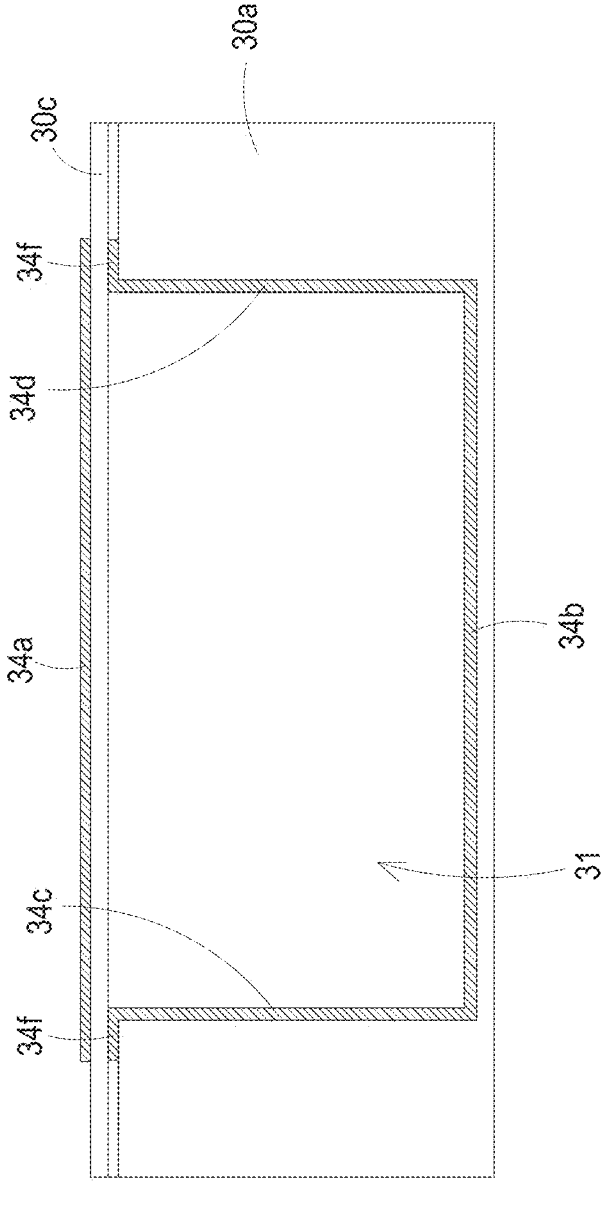

Please refer to FIG. 12C. Then, a top plate 30*c* is laminated on the base 30*a* to cover the recess 30*b*. Consequently, the two first horizontal transition structures 34*f* are arranged between the top plate 30*c* and the base 30*a*. A first accommodation space 31 is defined by the base 30*a* and the top plate 30*c* collaboratively. The second horizontal copper foil 34*b*, the first connection copper foil 34*c* and the second connection copper foil 34*d* are formed on the inner wall of the first accommodation space 31. Then, a first horizontal copper foil 34*a* is formed on the top plate 30*c*. In other words, the first horizontal copper foil 34*a*, the second horizontal copper foil 34*b*, the first connection copper foil 34*c* and the second connection copper foil 34*d* are disposed on a plurality of lateral surfaces of the inner wall of the first accommodation space 31.

Figure 12D:
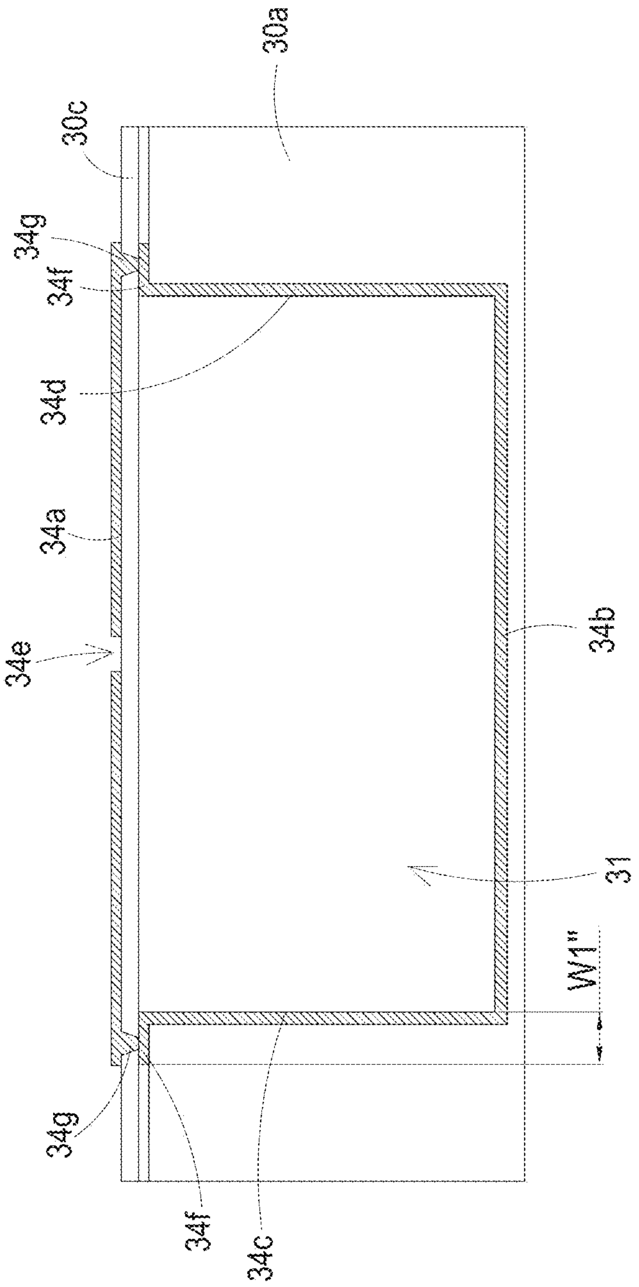

Please refer to FIG. 12D. The two ends of the first horizontal copper foil 34*a* are respectively connected with the corresponding first horizontal transition structures 34*f* through the corresponding first conductive posts 34*g*. The first connection copper foil 34*c*, the second connection copper foil 34*d*, the second horizontal copper foil 34*b*, the two first horizontal transition structures 34*f*, the first horizontal copper foil 34*a* and the two first conductive posts 34*g* are collaboratively defined as a first metal structure 34. In addition, only a portion of the first metal structure 34 is disposed on the inner wall of the first accommodation space 31, especially on the plurality of lateral surfaces of the inner wall of the first accommodation space 31. Then, a chemical etching process is performed to form an etch hole 34*e* in the first horizontal copper foil 34*a*.

Figure 12E:
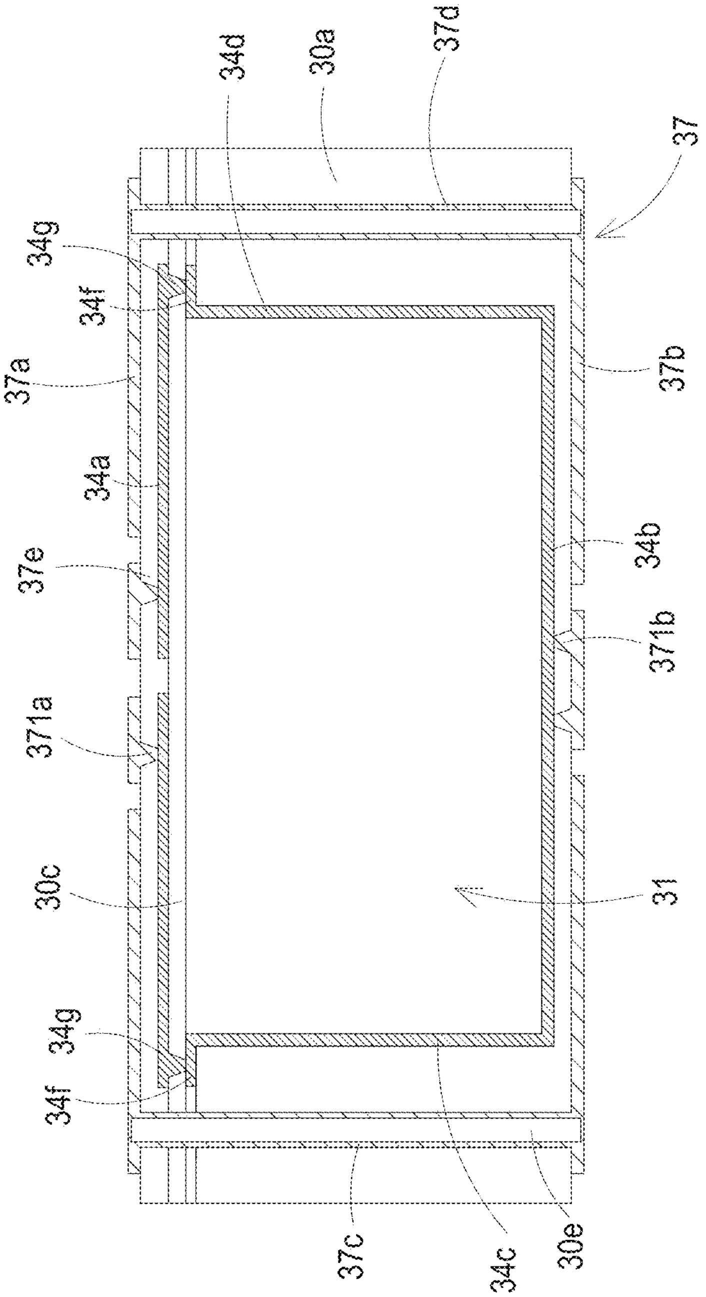
Figure 12F:
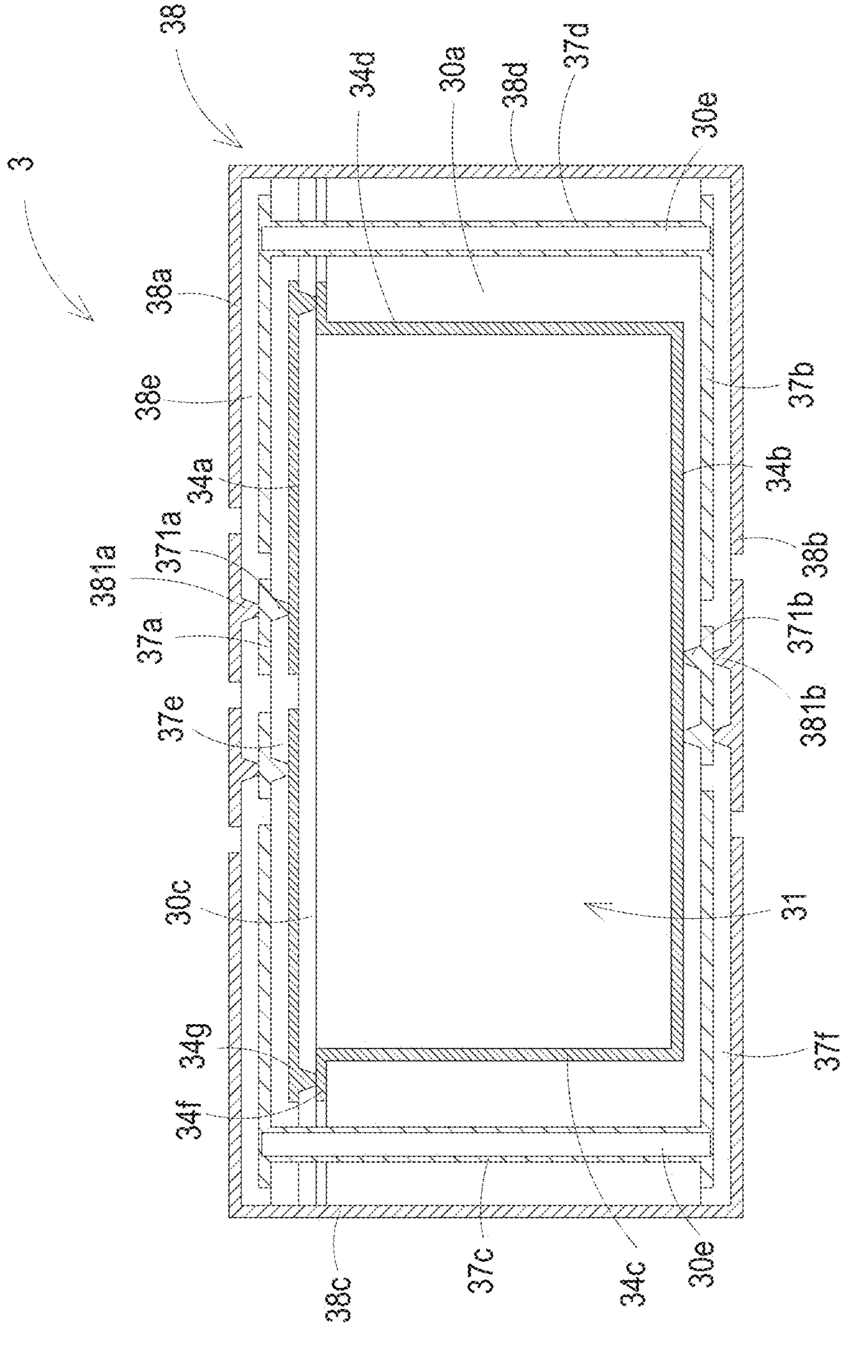
Figure 12G:
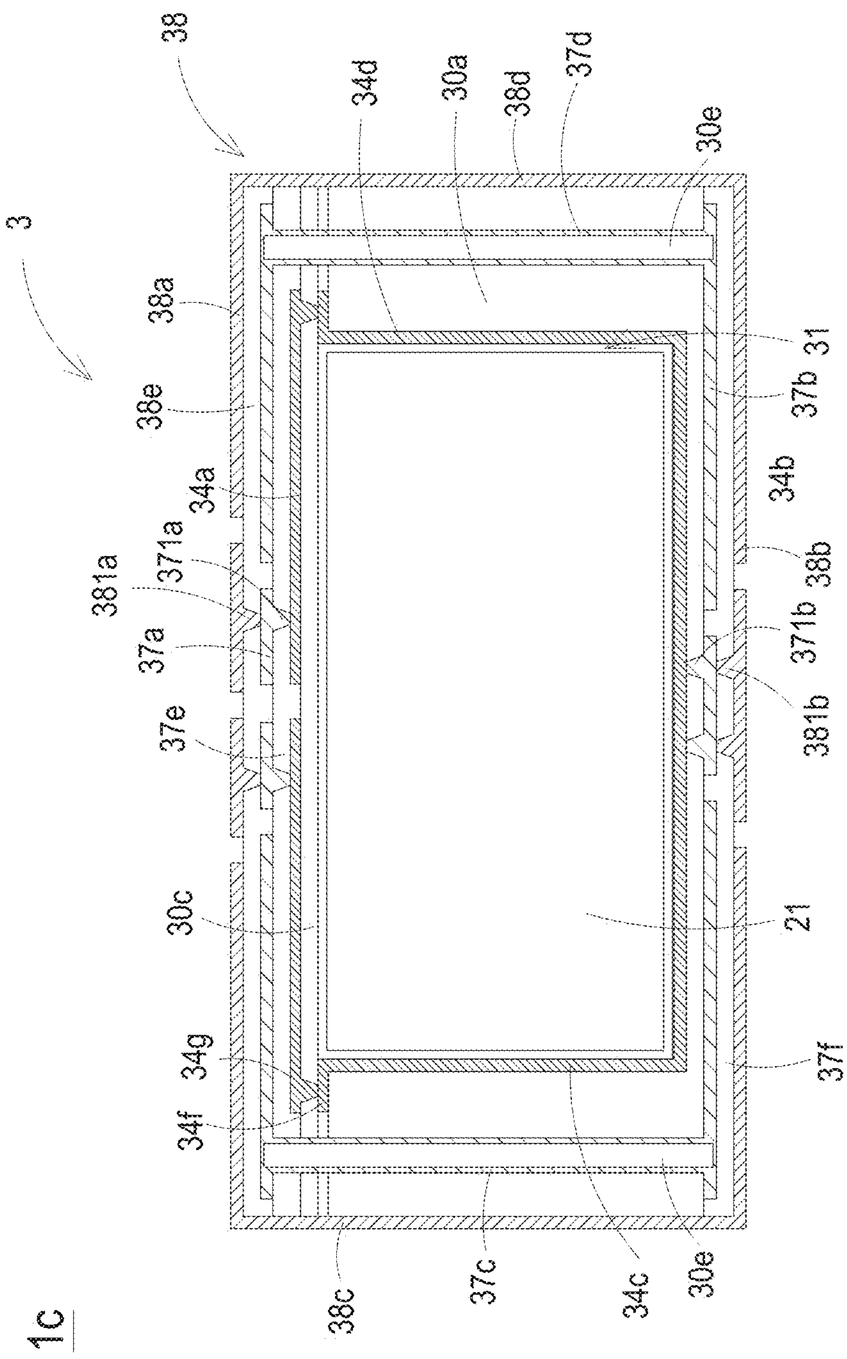

The steps of FIGS. 12E to 12G are similar to the steps of FIG. 8F to 8G, and not redundantly described herein.

In the magnetic element 1 as shown in FIG. 8E, the width of the first metal structure 34 beside the first accommodation space 31 is W1'. In the magnetic element 1*c* of this embodiment, the first connection copper foil 34*c* and the second connection copper foil 34*d* are directly formed on the inner wall of the first accommodation space 31. As shown in FIG. 12D, the width of the first metal structure 34 beside the first accommodation space 31 is W1". W1' is the required width through the mechanical drilling process. W1" is the required width through laser blind hole process. Since the dimension of the laser blind hole is smaller than the mechanical hole and the precision of the blind hole is higher than the precision of the mechanical hole, W" is smaller than W'. Similarly, the width of the first metal structure 34 on another side of the first accommodation space 31 is correspondingly reduced. Consequently, the dimension of the overall module is reduced, and the power density of the magnetic element 1*c* is enhanced. Since the width of the magnetic element 1*c* is reduced, the current path is shortened, the magnetic loss is reduced, and the efficiency is enhanced.

In this embodiment, the second horizontal copper foil 34*b*, the first connection copper foil 34*c* and the second connection copper foil 34*d* are disposed on the inner wall of the first accommodation space 31. In other words, only a portion of the first metal structure 34 is disposed on the inner wall of the first accommodation space 31. In some embodiments, only portions of the second horizontal copper foil 34*b*, the first connection copper foil 34*c* and the second connection copper foil 34*d* are disposed on the inner wall of the first accommodation space 31. For example, only the first connection copper foil 34*c* and the second connection copper foil 34*d* are disposed on the inner wall of the first accommodation space 31. Alternatively, only a portion of the first connection copper foil 34*c* is disposed on the inner wall of the first accommodation space 31.

In some embodiments, a thin insulation layer (not shown) is formed on the surface of the first metal structure 34 through a spraying process, a dipping process, an electrophoresis process, an electrostatic spraying process, a chemical vapor deposition process, a physical vapor deposition process, a sputtering process, an evaporation process or a printing process. The thickness of the thin insulation layer is smaller than a half of the thickness of the second insulation structure. Similarly, the portions of the first insulation layer 37*e*, the second insulation layer 37*f*, the base 30*a* and the top plate 30*c* that are covered by the second metal structure 37 are collaboratively formed as the second insulation structure. Due to the thin insulation layer, the possibility of causing the oxidation of the first metal structure 34 is minimized and the insulation between the first metal structure 34 and the first magnetic part 21 is enhanced.

Figure 13:
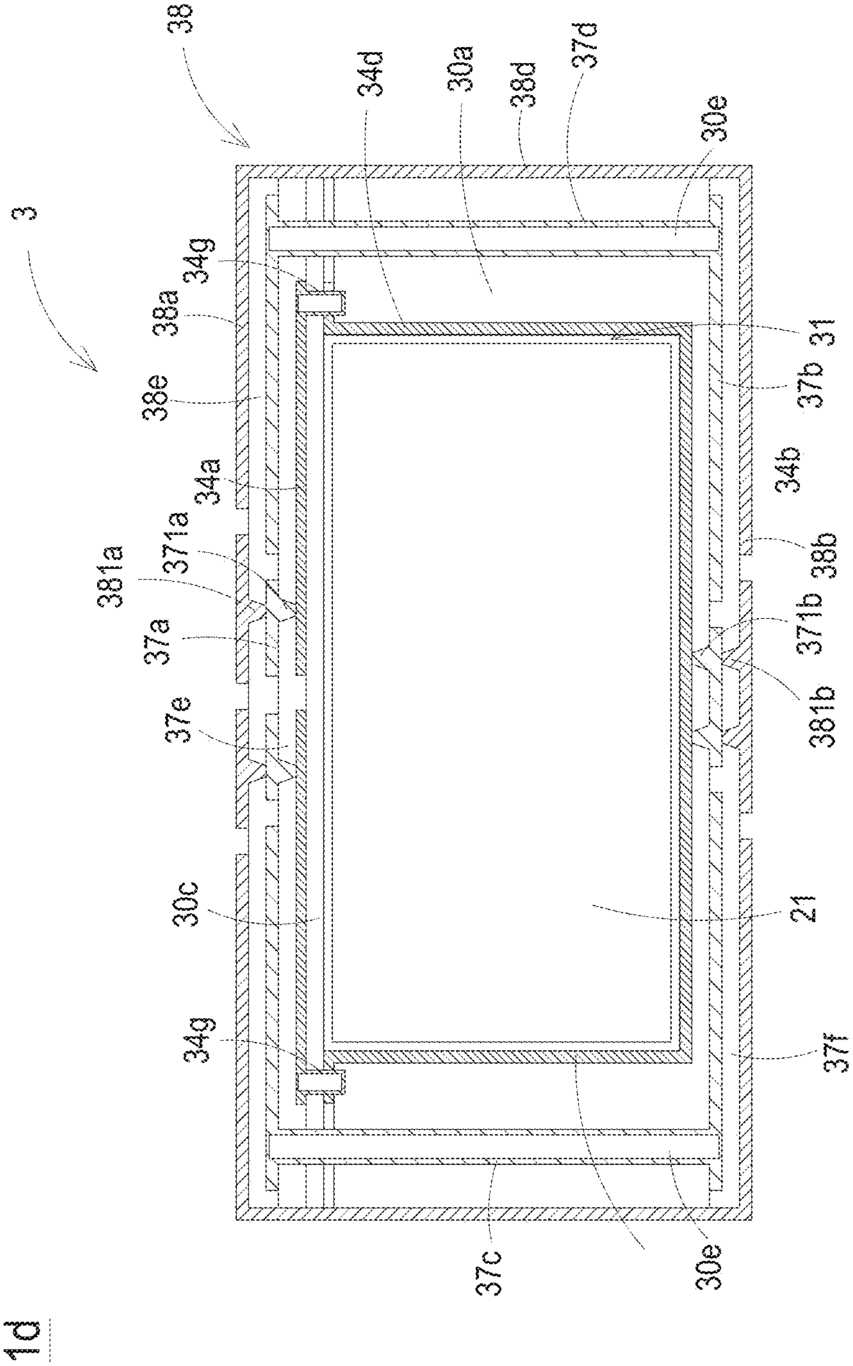
FIG. 13 is a schematic cross-sectional view illustrating a magnetic element according to a fifth embodiment of the present invention.

FIG. 13 is a schematic cross-sectional view illustrating a magnetic element according to a fifth embodiment of the present invention. In comparison with the magnetic element 1*c* of the fourth embodiment, the holes for accommodating the first conductive posts 34*g* in the magnetic element 1*d* of this embodiment are blind holes that are formed by using a machined process. For example, the machined process is a depth-controlled drilling process or a depth-controlled milling process. After the blind holes are formed, the first conductive posts 34*g* are formed through a metallization process.

FIGS. 14A to 14G are schematic cross-sectional views illustrating a process of manufacturing a magnetic element according to a sixth embodiment of the present invention.

Figure 14A:
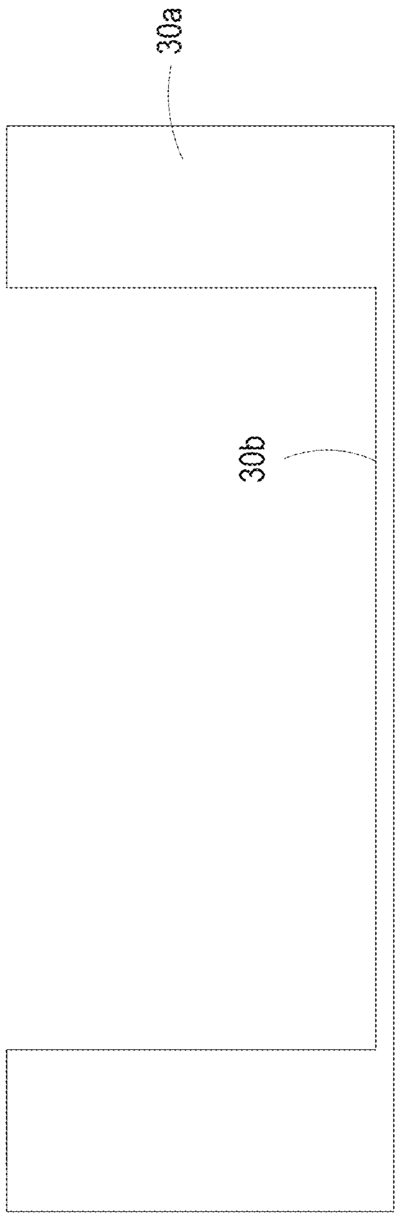
FIGS. 14A to 14G are schematic cross-sectional views illustrating a process of manufacturing a magnetic element according to a sixth embodiment of the present invention.

Please refer to FIG. 14A. Firstly, a base 30*a* with a recess 30*b* is provided. The step of FIG. 14A is similar to the step of FIG. 12A.

Figure 14B:
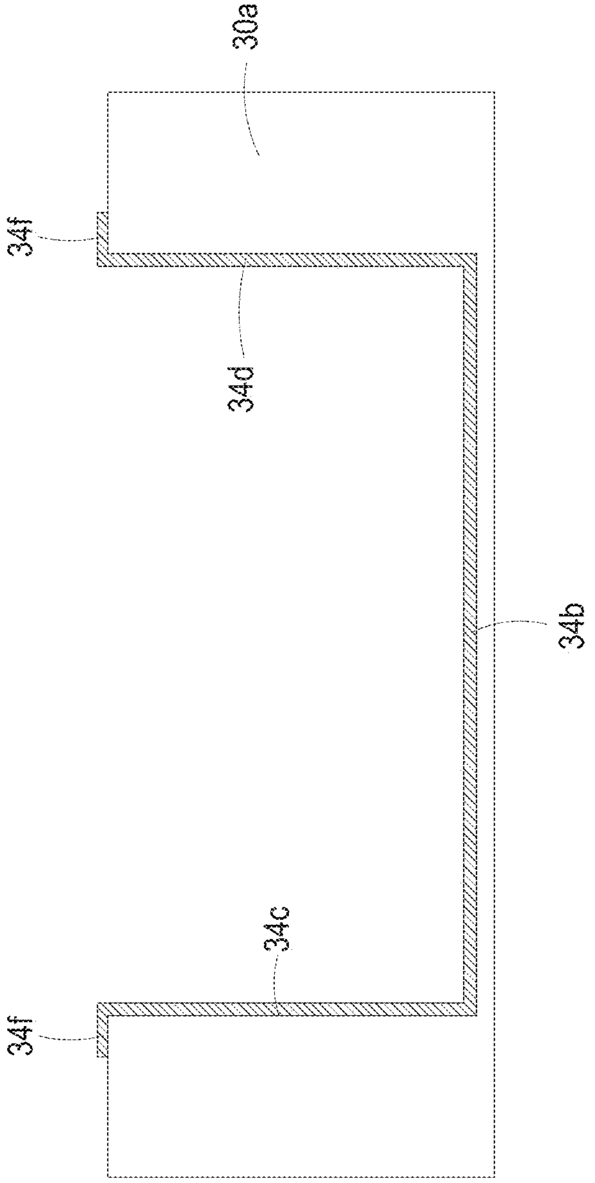

Please refer to FIG. 14B. Then, a second horizontal copper foil 34*b*, a first connection copper foil 34*c* and a second connection copper foil 34*d* are formed on an inner wall of the recess 30*b*. Moreover, two first horizontal transition structures 34*f* are disposed on a top side of the base 30*a*, i.e., outside the recess 30*b*. The step of FIG. 14B is similar to the step of FIG. 12B.

Figure 14C:
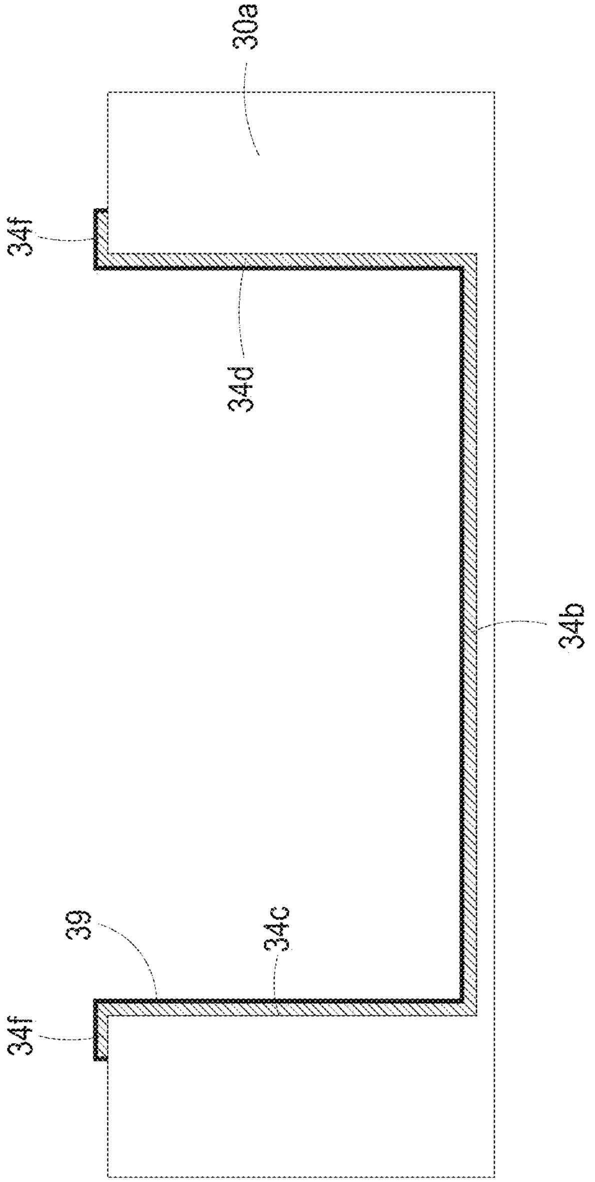

Please refer to FIG. 14C. Then, a metallic protective layer 39 is formed on the second horizontal copper foil 34*b*, the first connection copper foil 34*c*, the second connection copper foil 34*d* and the two first horizontal transition structures 34*f*. In an embodiment, the metallic protective layer 39 is made of tin because tin has a very slow reaction rate in the strong oxidizing solvent and has an excellent protection effect. Alternatively, the metallic protective layer 39 is made of tin alloy, gold or gold alloy. For patterning the following patterned structure of the first metal structure 34 around the first accommodation space 31, the metallic protective layer 39 is formed through an electroplating process or an electroless plating process. Consequently, the metallic protective layer 39 has a better surface covering ability, the bubble generated by using the organic material is avoided, and it is not necessary to clean the organic material. The thickness of the metallic protective layer 39 may be determined according to the protective capacity of the material. For example, in case that the metallic protective layer 39 is made of tin or tin alloy, the thickness of the metallic protective layer 39 is in the range between 1 μm and 20 μm. In case that the metallic protective layer 39 is made of gold or gold alloy, the thickness of the metallic protective layer 39 is in the range between 0.1 μm and 2 μm.

Figure 14D:
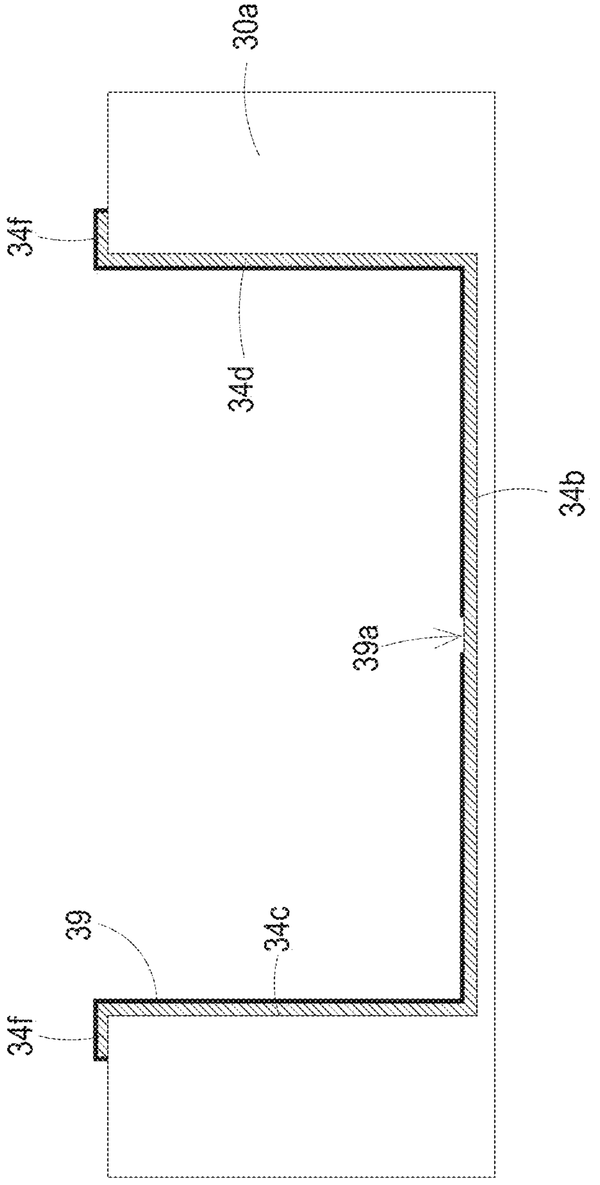

Please refer to FIG. 14D. Then, a direct writing technology is used to remove a portion of the metallic protective layer 39 to define a surface pattern 39*a*. Consequently, a portion of the second horizontal copper foil 34*b* of the first metal structure 34 is exposed. For example, the direct writing technology is a laser direct writing technology. The laser direct writing technology uses focused beams, electron beams or ion beams to directly define the patterns without the need of using masks. Consequently, the production flexibility is enhanced. Moreover, serialized products can be produced according to different application requirements, and the marketability of products will be increased. Moreover, before the direct writing technology is performed, an optical recognition technology is performed to accurately locate the sample and the surface state of the sample. Consequently, the direct writing path of each sample can be optimized separately to increase the yield, reduce the requirements for the previous process and increase the product competitiveness. Since the metallic protective layer 39 is formed on the first metal structure 34, the first metal structure 34 has a good thermal isolation effect during the laser direct writing process. Consequently, the influence of the heat on the first magnetic part is reduced.

Figure 14E:
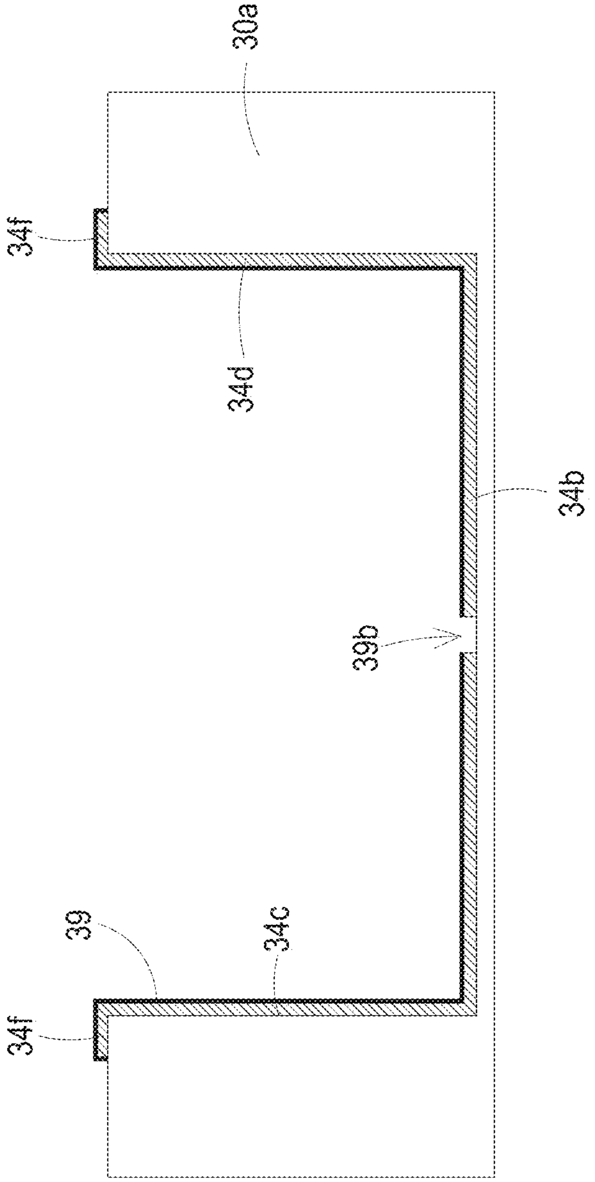

Please refer to FIG. 14E. Then, the exposed portion of the second horizontal copper foil 34*b* of the first metal structure 34 corresponding to the surface pattern 39*a* is etched. Consequently, a patterned structure 39*b* is formed, and a portion of the base 30*a* is exposed. The second horizontal copper foil 34*b* of the first metal structure 34 is divided into two segments by the patterned structure 39*b*. That is, the portion of the first metal structure 34 on the inner wall of the first accommodation space 31 is divided into a plurality of segments.

Figure 14F:
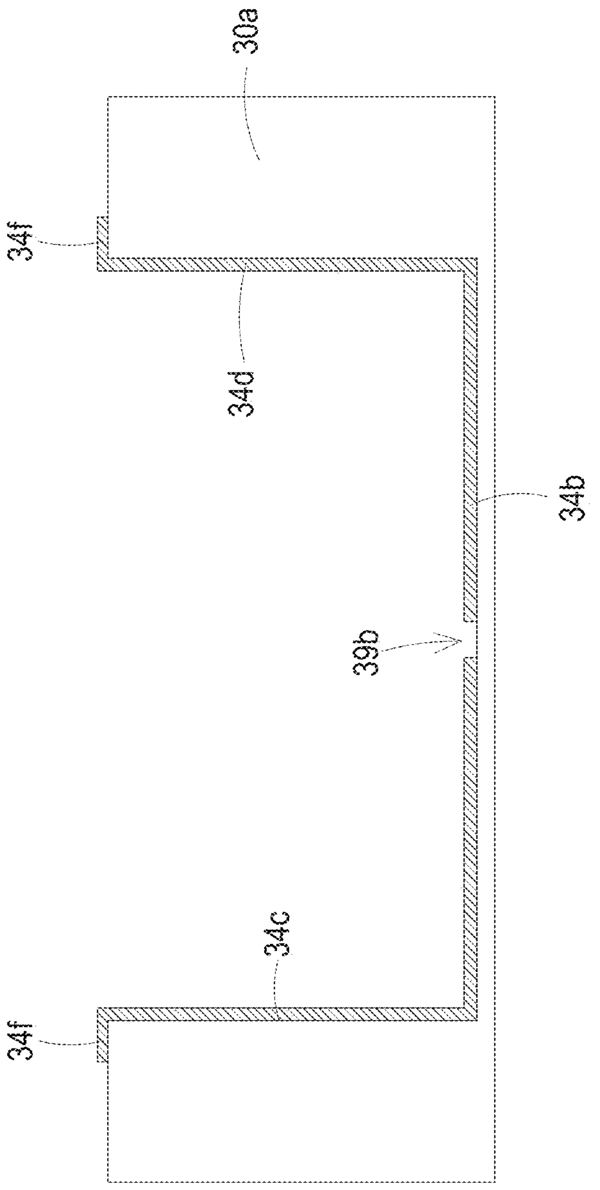

Please refer to FIG. 14F. Then, the remaining metallic protective layer 39 is removed. However, the step of removing the metallic protective layer 39 may be selectively done according to the material of the metallic protective layer 39. For example, if the metallic protective layer 39 is made of tin, the metallic protective layer 39 may be removed through an etching solution according to the demands after the pattern on the first metal structure 34 is etched. If the metallic protective layer 39 is made of gold, the metallic protective layer 39 may be retained. The metallic protective layer 39 made of gold is very thin. Optionally, the periphery region of the metallic protective layer 39 may be removed through a water jet process, a sandblasting process or an ultrasound process. In the other embodiment, the first metal structure 34 is divided through a mechanical process.

Figure 14G:
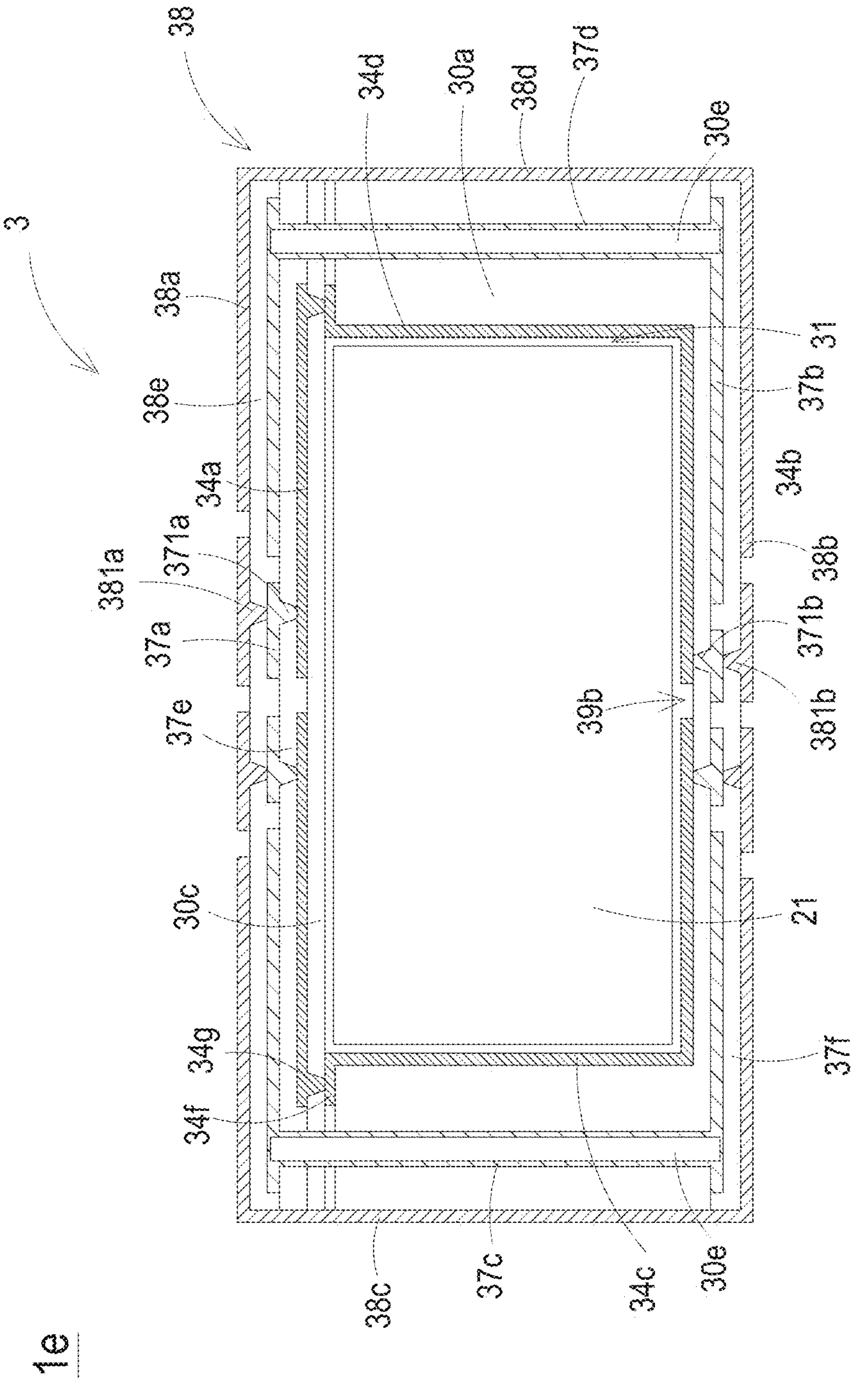

The step of FIG. 14G is similar to the steps of FIG. 12C to 12G, and not redundantly described herein.

FIGS. 15A to 15G are schematic cross-sectional views illustrating a process of manufacturing a magnetic element according to a seventh embodiment of the present invention.

Figure 15A:
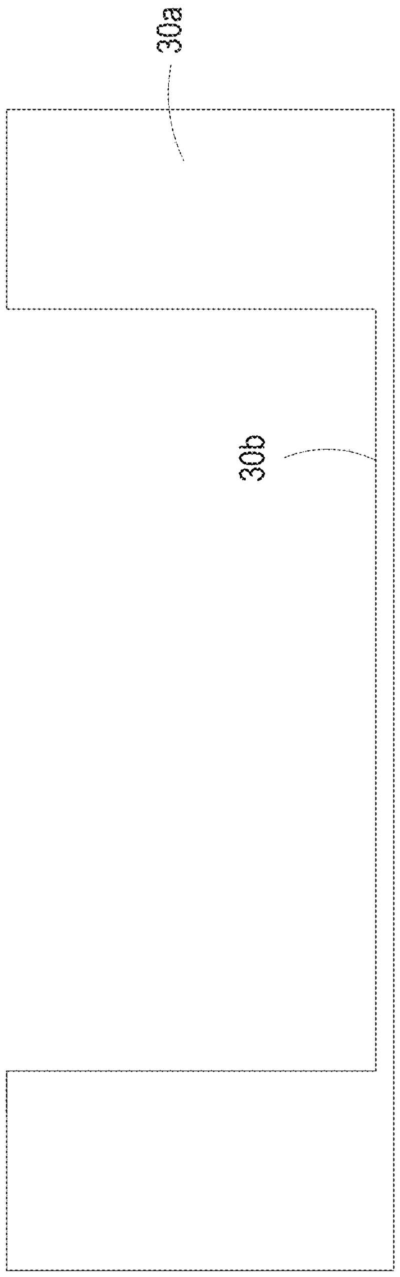
FIGS. 15A to 15G are schematic cross-sectional views illustrating a process of manufacturing a magnetic element according to a seventh embodiment of the present invention.

Please refer to FIG. 15A. Firstly, a base 30*a* with a recess 30*b* is provided. The step of FIG. 15A is similar to the step of FIG. 12A.

Figure 15B:
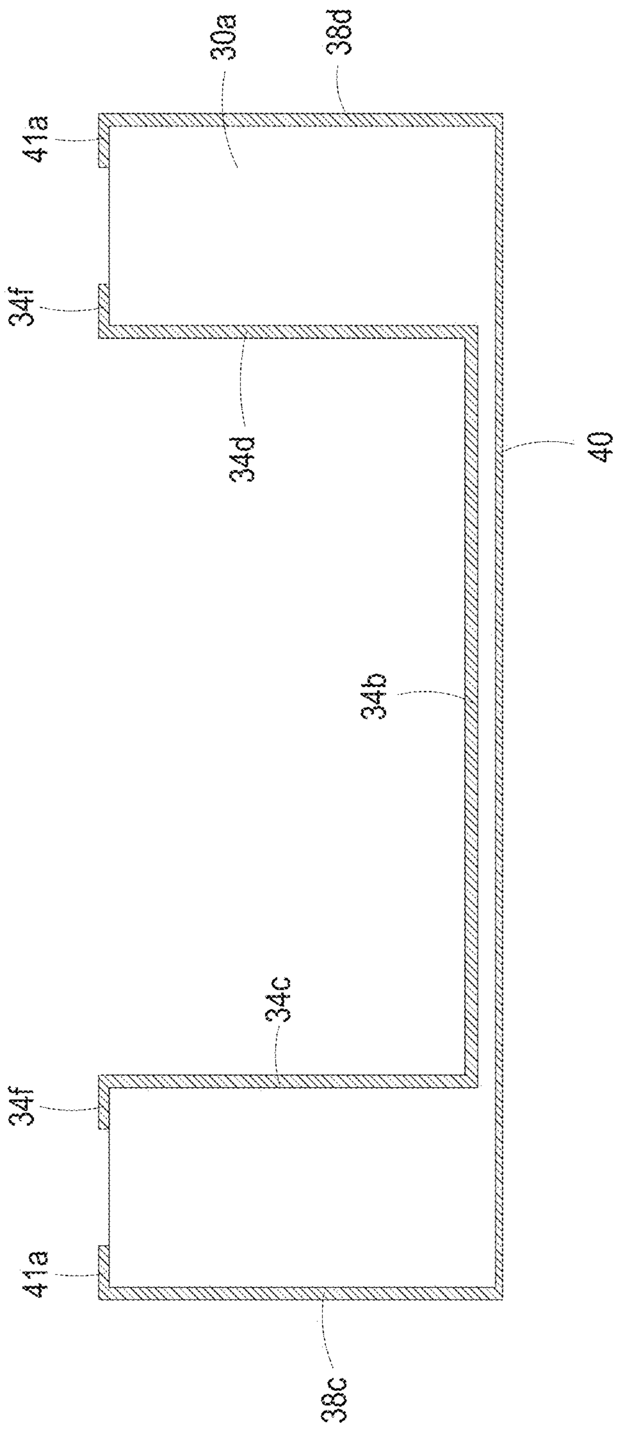

Please refer to FIG. 15B. Then, a second horizontal copper foil 34*b*, a first connection copper foil 34*c* and a second connection copper foil 34*d* are formed on an inner wall of the recess 30*b*. The two ends of the second horizontal copper foil 34*b* are connected with a first end of the first connection copper foil 34*c* and a first end of the second connection copper foil 34*d*. Moreover, two first horizontal transition structures 34*f* are disposed on a top side of the base 30*a*, i.e., outside the recess 30*b*. One of the two first horizontal transition structures 34*f* is connected with a second end of the first connection copper foil 34*c*. The other first horizontal transition structure 34*f* is connected with a second end of the second connection copper foil 34*d*. Moreover, a fifth connection copper foil 38*c*, a sixth connection copper foil 38*d*, a seventh horizontal copper foil 40 and two second horizontal transition structures 41*a* are formed on the outer side of the base 30*a*. The fifth connection copper foil 38*c* and the sixth connection copper foil 38*d* are opposite to each other with respect to the base 30*a*. The two ends of the seventh horizontal copper foil 40 are connected with a first end of the fifth connection copper foil 38*c* and a first end of the sixth connection copper foil 38*d*. One of the two second horizontal transition structures 41*a* is connected with a second end of the fifth connection copper foil 38*c*. The other second horizontal transition structure 41*a* is connected with a second end of the sixth connection copper foil 38*d*.

In the step of FIG. 15B, a covering film is formed on the top surface of the base 30*a* (i.e., between the second horizontal transition structures 41*a* and the corresponding first horizontal transition structures 34*f*), and a metallic wiring layer is formed on the lateral surface of the base 30*a*, the bottom surface of the base 30*a* and the inner lateral wall of the recess 30*b* through a metallization process. As setting a covering film on the bottom surface of the base 30*a*, the copper foil would not be formed on the bottom surface of the base, i.e., only the base copper foil is reserved. After an etching process, the fifth connection copper foil 38*c*, the sixth connection copper foil 38*d*, the seventh horizontal copper foil 40 and the second horizontal transition structures 41*a* are formed.

Figure 15C:
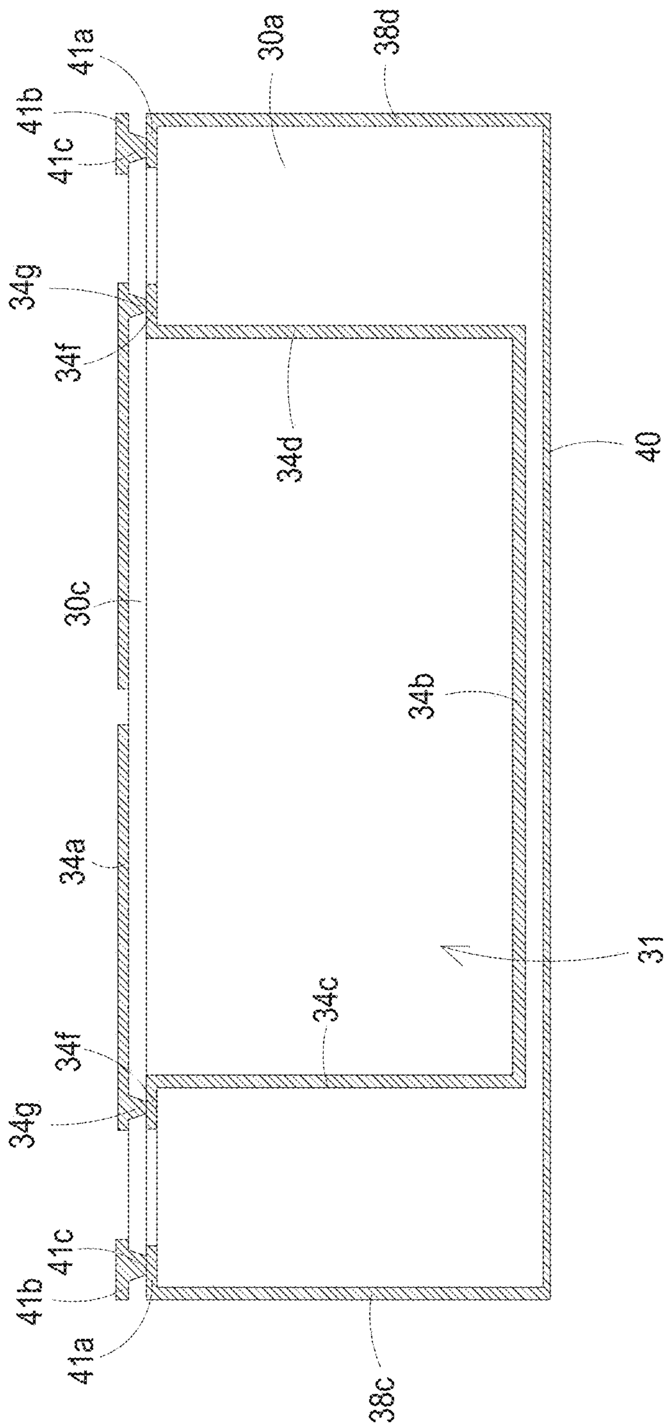

Please refer to FIG. 15C. Then, a top plate 30*c* is laminated on the base 30*a* to cover the recess 30*b*. Consequently, the two first horizontal transition structures 34*f* and the two second horizontal transition structures 41*a* are also covered by the top plate 30*c*. A first accommodation space 31 is defined by the base 30*a* and the top plate 30*c* collaboratively. Then, a first horizontal copper foil 34*a* is formed on the top plate 30*c*. The two ends of the first horizontal copper foil 34*a* are connected with the corresponding horizontal transition structures 34*f* through the corresponding first conductive posts 34*g*. The first connection copper foil 34*c*, the second connection copper foil 34*d*, the second horizontal copper foil 34*b*, the two first horizontal transition structures 34*f*, the first horizontal copper foil 34*a* and the two first conductive posts 34*g* are collaboratively defined as a first metal structure 34. Then, two third horizontal transition structures 41*b* are formed on the top plate 30*c*. The two third horizontal transition structures 41*b* are connected with the corresponding second horizontal transition structures 41*a* through corresponding second conductive posts 41*c*. The second horizontal copper foil 34*b*, the first connection copper foil 34*c* and the second connection copper foil 34*d* are formed on the inner wall of the first accommodation space 31.

Figure 15D:
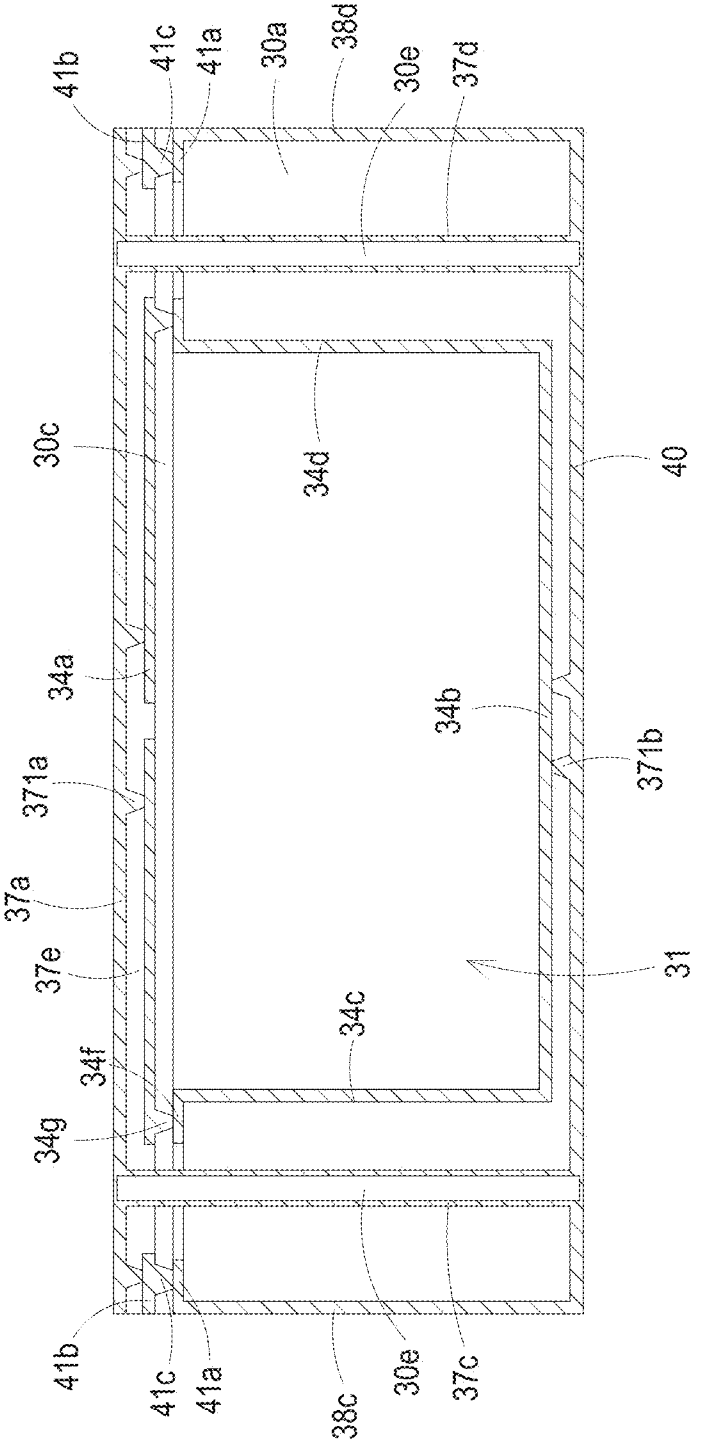

Please refer to FIG. 15D. Then, a first insulation layer 37*e* and a third horizontal copper foil 37*a* are sequentially formed on the first horizontal copper foil 34*a*. The first insulation layer 37*e* is arranged between the third horizontal copper foil 37*a* and the first horizontal copper foil 34*a*. The base 30*a* further includes a plurality of second through holes 30*e*. The second through holes 30*e* run through the top plate 30*c* and the base 30*a*. In addition, the second through holes 30*e* are arranged between the third horizontal copper foil 37*a* and the seventh horizontal copper foil 40. For succinctness, only two second through holes 30*e* are shown. Moreover, a third connection copper foil 37*c* and a fourth connection copper foil 37*d* are formed on the inner walls of the corresponding second through holes 30*e* and penetrated through the top plate 30*c* and the base 30*a*. The third connection copper foil 37*c* is connected with a first end of the third horizontal copper foil 37*a* and a first end of the seventh horizontal copper foil 40. The fourth connection copper foil 37*d* is connected with a second end of the third horizontal copper foil 37*a* and a second end of the seventh horizontal copper foil 40. Moreover, a plurality of conductive posts 371*a* are connected between the third horizontal copper foil 37*a* and the first horizontal copper foil 34*a*. The conductive posts 371*a* also run through the first insulation layer 37*e* to connect the first horizontal copper foil 34*a*. Moreover, a plurality of conductive posts 371*b* are connected between the fourth horizontal copper foil 37*b* and the second horizontal copper foil 34*b*. The conductive posts 371*b* also run through the second insulation layer 37*f* to connect the second horizontal copper foil 34*b*.

Figure 15E:
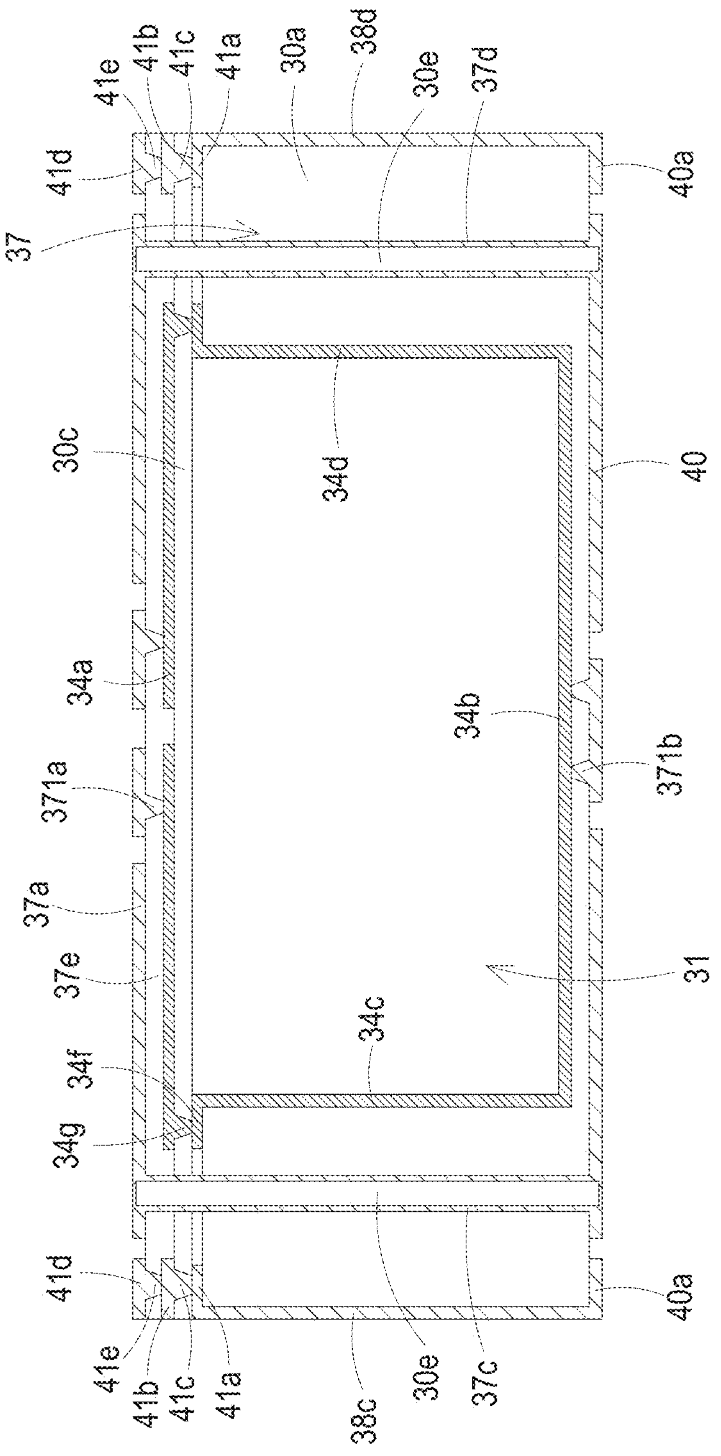

Please refer to FIG. 15E. Then, the two ends of the third horizontal copper foil 37*a* are cut off through an etching process. Consequently, two fourth horizontal transition structures 41*d* are formed on the two ends of the third horizontal copper foil 37*a*. The two fourth horizontal transition structures 41*d* are connected with the corresponding third horizontal transition structures 41*b* through corresponding third conductive posts 41*e*. Moreover, the seventh horizontal copper foil 40 is divided into a fourth horizontal copper foil 37*b* and two fifth horizontal transition structures 40*a*. One of the two fifth horizontal transition structures 40*a* is connected with the fifth connection copper foil 38*c*. The other fifth horizontal transition structure 40*a* is connected with the sixth connection copper foil 38*d*. The fourth horizontal copper foil 37*b* is arranged between the two fifth horizontal transition structures 40*a*. The third connection copper foil 37*c*, the fourth connection copper foil 37*d*, the third horizontal copper foil 37*a* and the fourth horizontal copper foil 37*b* are collaboratively defined as a second metal structure 37.

Figure 15F:
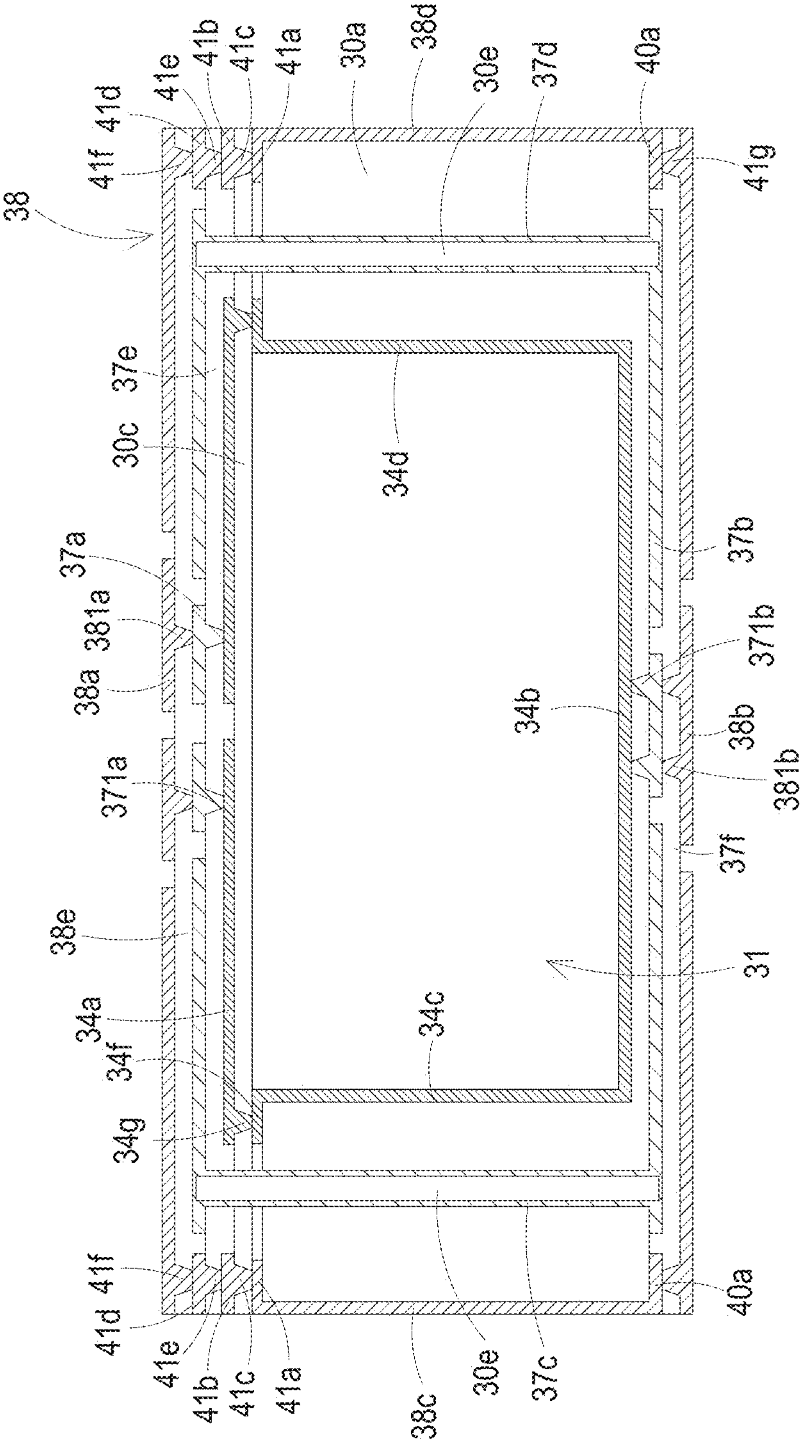

Please refer to FIG. 15F. Then, a fifth horizontal copper foil 38*a* and a third insulation layer 38*e* are formed on the third horizontal copper foil 37*a* and the two fourth horizontal transition structures 41*d*. A portion of the third insulation layer 38*e* is arranged between the fifth horizontal copper foil 38*a* and the third horizontal copper foil 37*a*. Another portion of the third insulation layer 38*e* is arranged between the fifth horizontal copper foil 38*a* and the two fourth horizontal transition structures 41*d*. The fifth horizontal copper foil 38*a* is connected with the corresponding fourth horizontal transition structures 41*d* through two fourth conductive posts 41*f*. Moreover, a sixth horizontal copper foil 38*b* and a second insulation layer 37*f* are formed on the fourth horizontal copper foil 37*b* and the two fifth horizontal transition structures 40*a*. A portion of the second insulation layer 37*f* is arranged between the sixth horizontal copper foil 38*b* and the fourth horizontal copper foil 37*b*. Another portion of the second insulation layer 37*f* is arranged between the sixth horizontal copper foil 38*b* and the two fifth horizontal transition structures 40*a*. The sixth horizontal copper foil 38*b* is connected with the corresponding fifth horizontal transition structures 40*a* through corresponding fifth conductive posts 41*g*. The fifth horizontal copper foil 38*a*, the sixth horizontal copper foil 38*b*, the fifth connection copper foil 38*c*, the sixth connection copper foil 38*d*, the two fifth horizontal transition structures 40*a*, the two second horizontal transition structures 41*a*, the two third horizontal transition structures 41*b*, the two second conductive posts 41*c*, the two fourth horizontal transition structures 41*d*, the two third conductive posts 41*e*, the two fourth conductive posts 41*f* and the two fifth conductive posts 41*g* are collaboratively formed as a third metal structure 38. In this embodiment, a portion of the first metal structure 34 and a portion of the third metal structure 38 are simultaneously formed by using a single electroplating process. Consequently, the fabricating time and the fabricating cost are reduced.

In other words, one of the two second horizontal transition structures 41*a*, one of the two third horizontal transition structures 41*b*, one of the two fourth horizontal transition structures 41*d* and one end of the fifth horizontal copper foil 38*a* are connected with each other through a first conductive part. One of the two second conductive posts 41*c*, one of the two third conductive posts 41*e* and one of the two fourth conductive posts 41*f* are formed as the first conductive part. One of the two fifth horizontal transition structures 40*a* and the sixth horizontal copper foil 38*b* are connected with each other through a second conductive part. One of the two fifth conductive posts 41*g* is formed as the second conductive part. The other second horizontal transition structure 41*a*, the other third horizontal transition structure 41*b*, the other fourth horizontal transition structure 41*d*, the other end of the fifth horizontal copper foil 38*a* are connected with each other through a third conductive part. The other second conductive post 41*c*, the other third conductive post 41*e* and the other fourth conductive post 41*f* are formed as the third conductive part. The other fifth horizontal transition structure 40*a* and the sixth horizontal copper foil 38*b* are connected with each other through a fourth conductive part. The other fifth conductive post 41*g* is formed as the fourth conductive part.

Figure 15G:
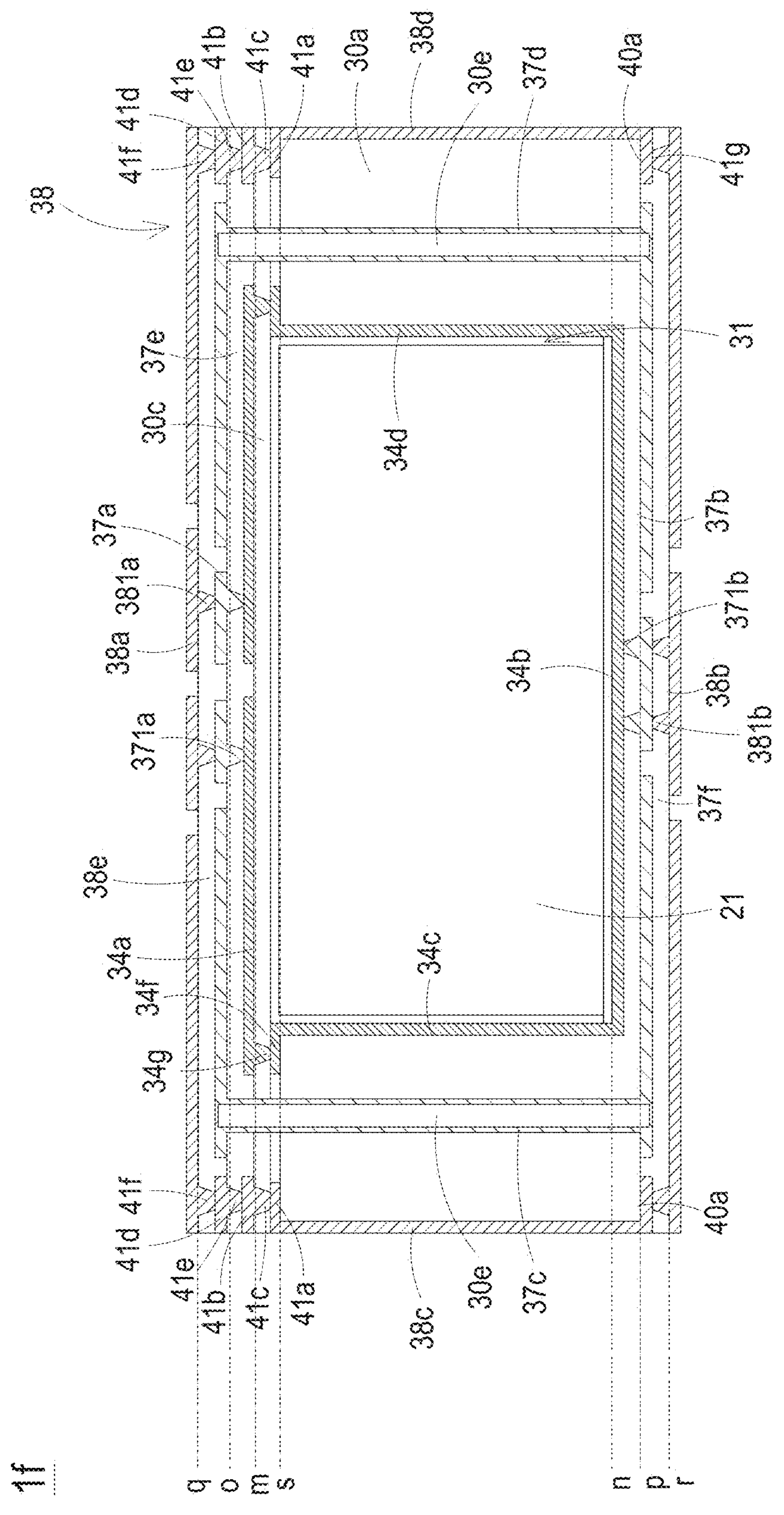

Please refer to FIG. 15G. Then, a first magnetic part 21 is disposed within the first accommodation space 31 of the substrate 3. Consequently, a portion of the magnetic element if is produced.

The first horizontal copper foil 34*a* and the two third horizontal transition structures 41*b* are formed in a first horizontal wiring layer m. Moreover, the first horizontal copper foil 34*a* is arranged between the two third horizontal transition structures 41*b*. The second horizontal copper foil 34*b* is formed in a second horizontal wiring layer n. The first horizontal wiring layer m and the second horizontal wiring layer n are opposite to each other with respect to the first magnetic part 21. The third horizontal copper foil 37*a* and the two fourth horizontal transition structures 41*d* are formed in a third horizontal wiring layer o. Moreover, the third horizontal copper foil 37*a* is arranged between the two fourth horizontal transition structures 41*d*. The fourth horizontal copper foil 37*b* and the two fifth horizontal transition structures 40*a* are formed in a fourth horizontal wiring layer p. Moreover, the fourth horizontal copper foil 37*b* is arranged between the two fifth horizontal transition structures 40*a*. The third horizontal wiring layer o and the fourth horizontal wiring layer p are opposite to each other with respect to the first magnetic part 21. Moreover, the third horizontal wiring layer o is located at the side of the first horizontal wiring layer m away from the first accommodation space 31. The fourth horizontal wiring layer p is located at the outer side of the second horizontal wiring layer n. The fifth horizontal copper foil 38*a* is formed in a fifth horizontal wiring layer q. The sixth horizontal copper foil 38*b* is formed in a sixth horizontal wiring layer r. The fifth horizontal wiring layer q and the sixth horizontal wiring layer r are opposite to each other with respect to the first magnetic part 21. The fifth horizontal wiring layer q is located at the outer side of the third horizontal wiring layer o. The sixth horizontal wiring layer r is located at the side of the fourth horizontal wiring layer p away from the first accommodation space 31. The two second horizontal transition structures 41*a* and the two first horizontal transition structures 34*f* are formed in a seventh horizontal wiring layer s. The seventh horizontal wiring layer s is arranged between the first horizontal wiring layer m and the second horizontal wiring layer n. The seventh horizontal wiring layer s is located beside the top plate 30*c*. Moreover, the two first horizontal transition structures 34*f* are arranged between the two second horizontal transition structures 41*a*.

Figure 16:
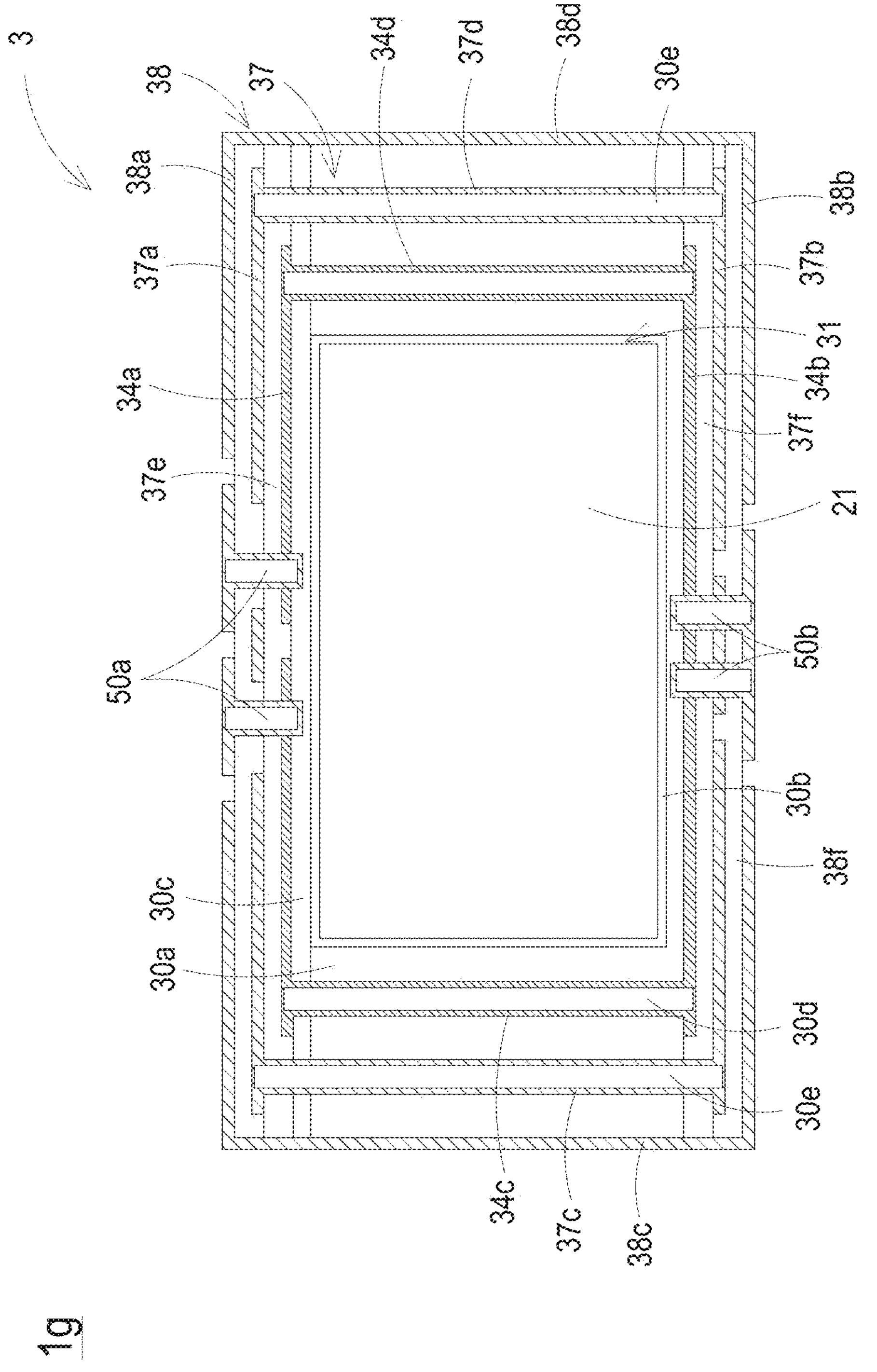
FIG. 16 is a schematic cross-sectional view illustrating a magnetic element according to an eighth embodiment of the present invention.

FIG. 16 is a schematic cross-sectional view illustrating a magnetic element according to an eighth embodiment of the present invention. In comparison with the magnetic element 1 of FIG. 8G, the substrate 3 of the magnetic element 1*g* of this embodiment includes first mechanical blind holes 50*a* and second mechanical blind holes 50*b*. The fifth horizontal copper foil 38*a* and the first horizontal copper foil 34*a* are connected with each other through the first mechanical blind holes 50*a*. The sixth horizontal copper foil 38*b* and the second horizontal copper foil 34*b* are connected with each other through the second mechanical blind holes 50*b*. Due to the arrangement of the mechanical blind holes, the allowable thickness of the substrate 3 is increased. Consequently, the applications are expanded.

Figure 17:
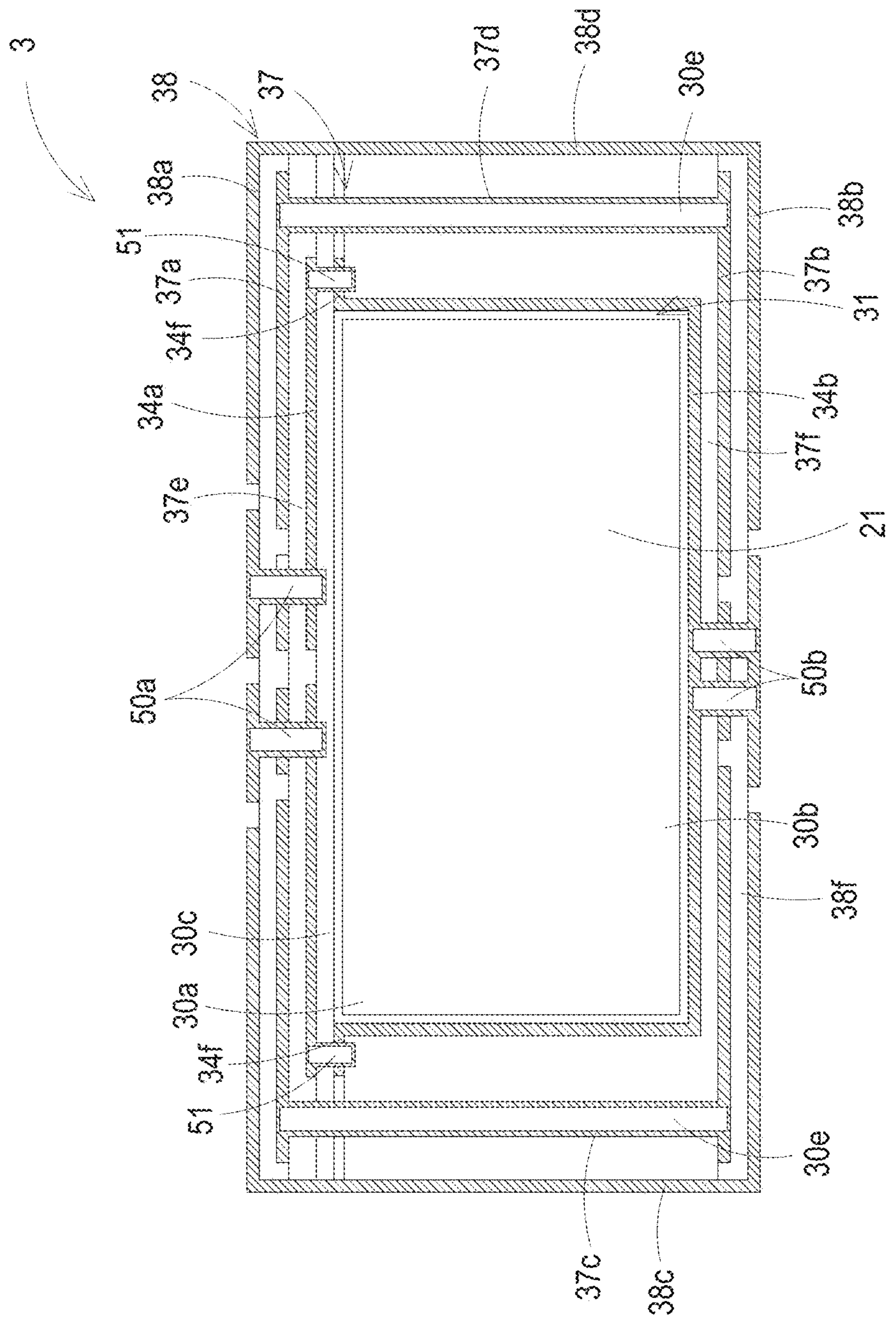
FIG. 17 is a schematic cross-sectional view illustrating a magnetic element according to a ninth embodiment of the present invention.

FIG. 17 is a schematic cross-sectional view illustrating a magnetic element according to a ninth embodiment of the present invention. In comparison with the magnetic element 1*c* of FIG. 12G, the substrate 3 of the magnetic element 1*h* of this embodiment includes first mechanical blind holes 50*a*, second mechanical blind holes 50*b* and third mechanical blind holes 51. The fifth horizontal copper foil 38*a* and the first horizontal copper foil 34*a* are connected with each other through the first mechanical blind holes 50*a*. The sixth horizontal copper foil 38*b* and the second horizontal copper foil 34*b* are connected with each other through the second mechanical blind holes 50*b*. The first horizontal copper foil 34*a* and the corresponding first horizontal transition structures 34*f* are connected with each other through the third mechanical blind holes 51. Due to the arrangement of the mechanical blind holes, the allowable thickness of the substrate 3 is increased. Consequently, the applications are expanded.

FIGS. 18A to 18F are schematic cross-sectional views illustrating a process of manufacturing a magnetic element according to a tenth embodiment of the present invention.

Figure 18A:
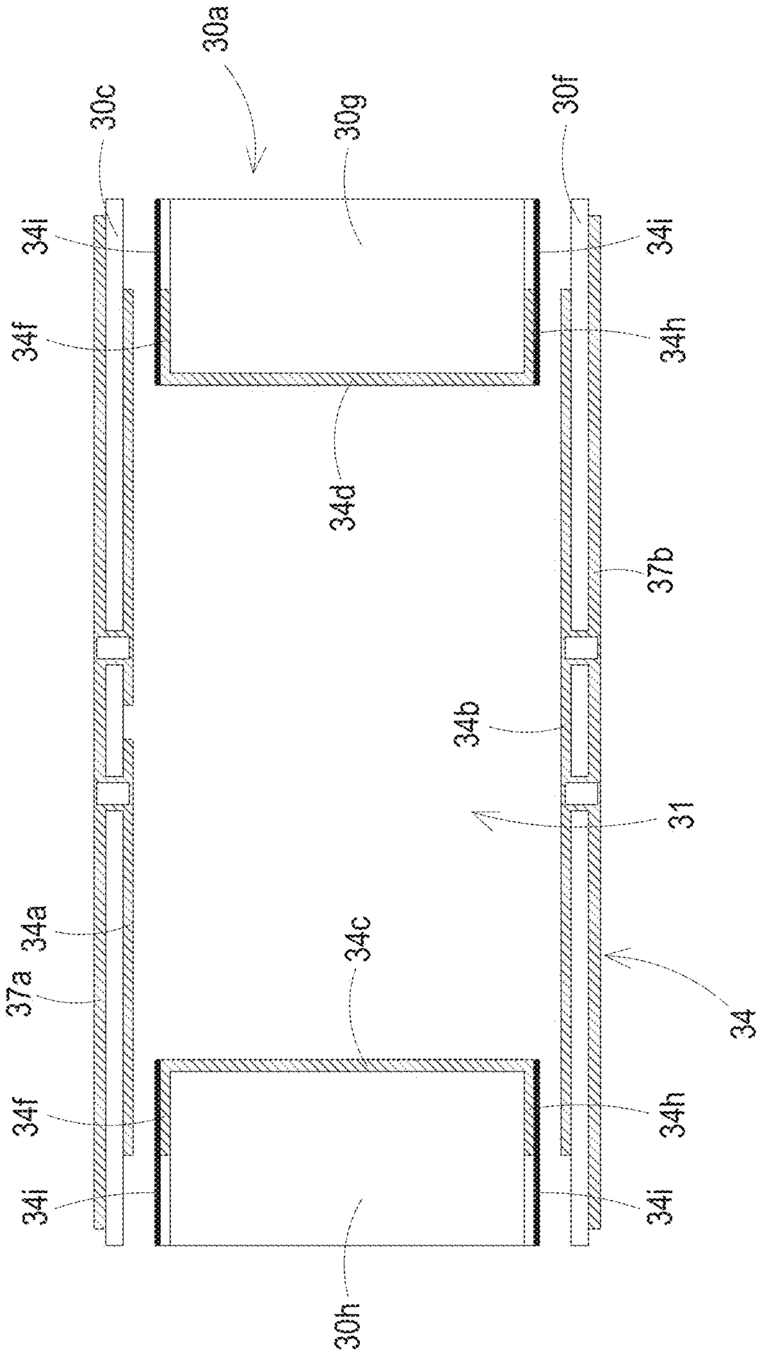
FIGS. 18A to 18F are schematic cross-sectional views illustrating a process of manufacturing a magnetic element according to a tenth embodiment of the present invention.

Please refer to FIG. 18A. Firstly, a top plate 30*c* and a base 30*a* are provided. The base 30*a* includes a bottom structure 30*f*, a first lateral wall 30*g* and a second lateral wall 30*h*. The first lateral wall 30*g* and the second lateral wall 30*h* are arranged between the top plate 30*c* and the bottom structure 30*f*. In this embodiment, two first horizontal transition structures 34*f*, two sixth horizontal transition structures 34*h*, a first connection copper foil 34*c* and a second connection copper foil 34*d* are formed. One of the two first horizontal transition structures 34*f* is arranged between the top plate 30*c* and the first lateral wall 30*g*. The other first horizontal transition structure 34*f* is arranged between the top plate 30*c* and the second lateral wall 30*h*. One of the two sixth horizontal transition structures 34*h* is arranged between the bottom structure 30*f* and the first lateral wall 30*g*. The other sixth horizontal transition structure 34*h* is arranged between the bottom structure 30*f* and the second lateral wall 30*h*. The first connection copper foil 34*c* is formed on the inner surface of the first lateral wall 30*g* and connected between the corresponding first horizontal transition structure 34*f* and the corresponding sixth horizontal transition structure 34*h*. The second connection copper foil 34*d* is formed on the inner surface of the second lateral wall 30*h* and connected between the corresponding first horizontal transition structure 34*f* and the corresponding sixth horizontal transition structure 34*h*.

Please refer to FIG. 18A again. Then, a first horizontal copper foil 34*a* and a third horizontal copper foil 37*a* are formed on two sides of the top plate 30*c*. The first horizontal copper foil 34*a* is arranged between the top plate 30*c* and the two first horizontal transition structures 34*f*. Moreover, a second horizontal copper foil 34*b* and a fourth horizontal copper foil 37*b* are formed on two sides of the bottom structure 30*f*. The second horizontal copper foil 34*b* is arranged between the bottom structure 30*f* and the two sixth horizontal transition structures 34*h*. The top plate 30*c*, the bottom structure 30*f*, the first lateral wall 30*g* and the second lateral wall 30*h* are laminated as an integral structure through bonding material (not shown) in order to define a first accommodation space. In an embodiment, the first lateral wall 30*g* and the second lateral wall 30*h* are combined with the top plate 30*c* and the bottom structure 30*f* through connecting ribs 34*i*.

Figure 18B:
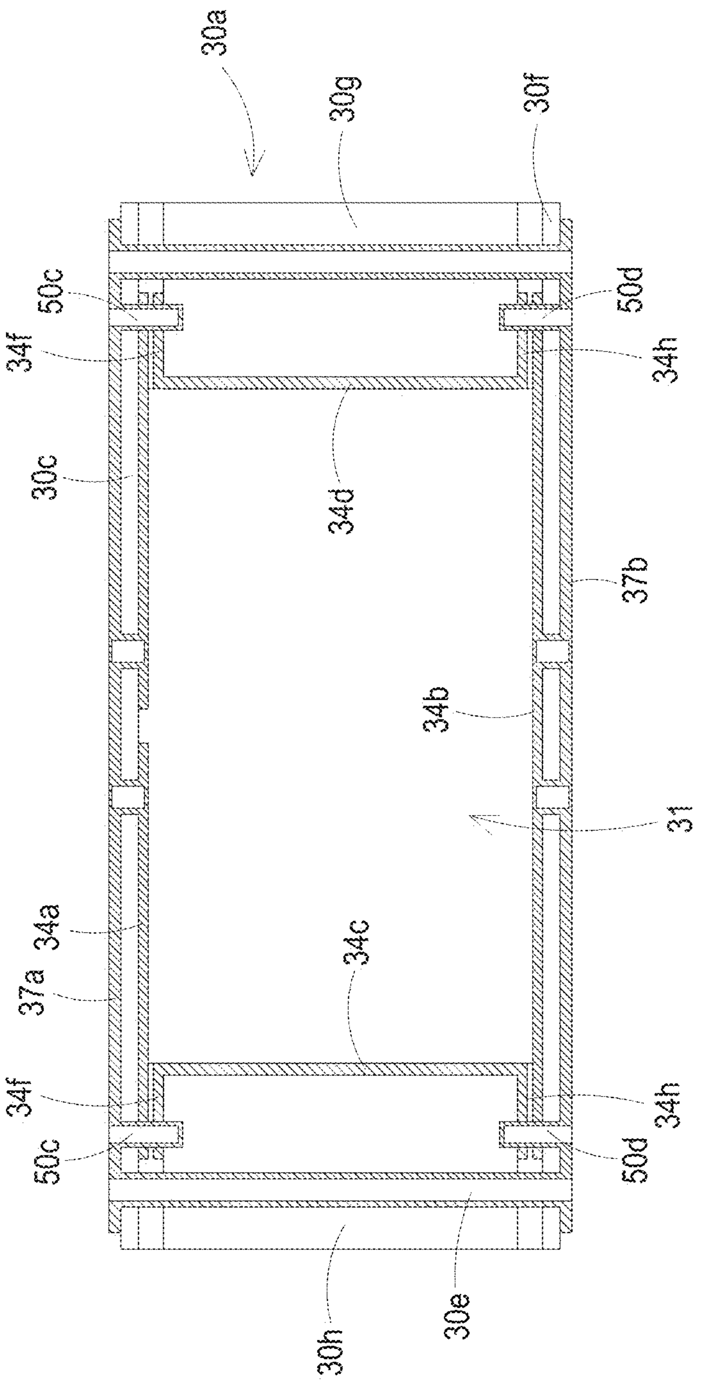

Please refer to FIG. 18B. Then, a plurality of second through holes 30*e*, a plurality of first blind holes 50*c* and a plurality of second blind holes 50*d* are formed. The second through holes 30*e* are connected between the third horizontal copper foil 37*a* and the fourth horizontal copper foil 37*b*. The first blind holes 50*c* are connected between the third horizontal copper foil 37*a*, the first horizontal copper foil 34*a* and the corresponding first horizontal transition structures 34*f*. The second blind holes 50*d* are connected between the fourth horizontal copper foil 37*b*, the second horizontal copper foil 34*b* and the corresponding sixth horizontal transition structures 34*h*. In an embodiment, conductive posts are disposed within the second through holes 30*e*, the first blind holes 50*c* and the second blind holes 50*d*.

Figure 18C:
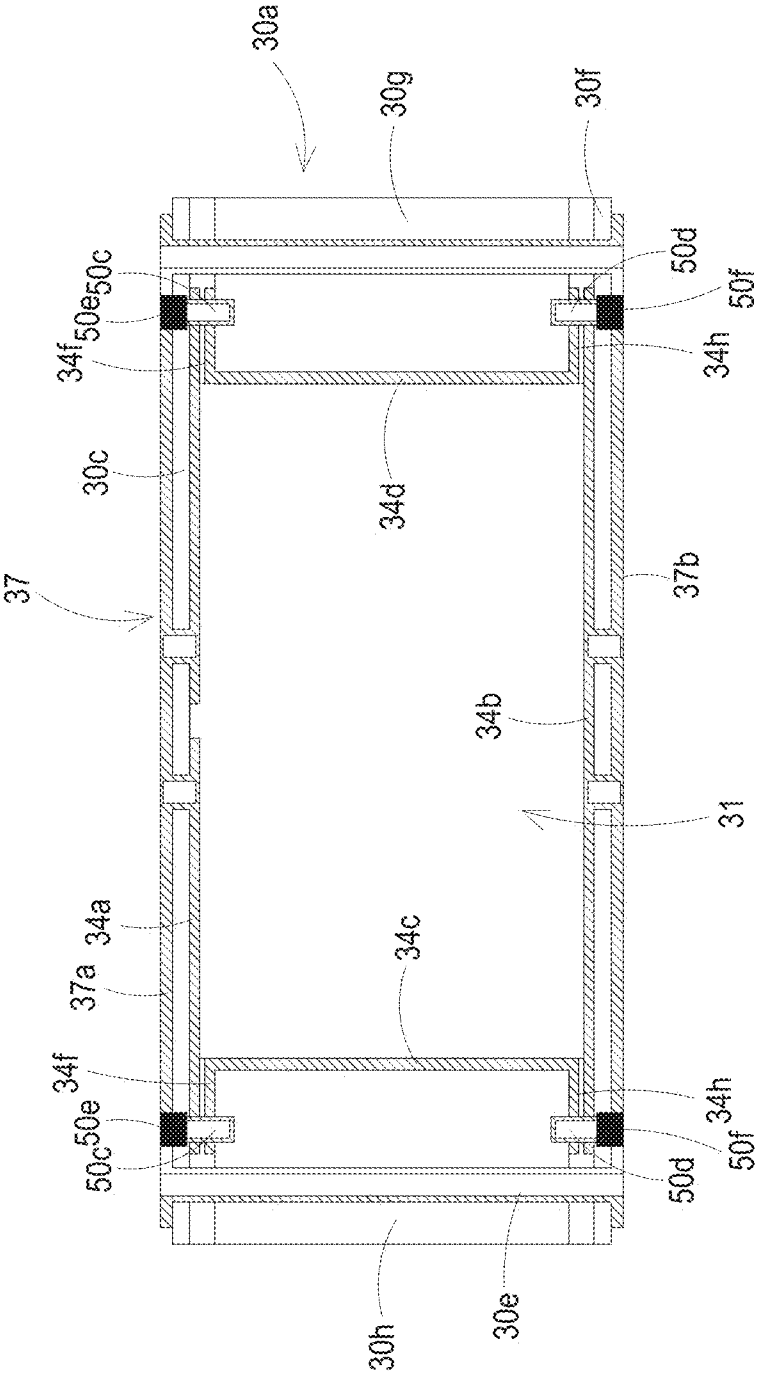

Please refer to FIG. 18C. Then, portions of the conductive posts in the plurality of first blind holes 50*c* are removed through a back-drilling process. Consequently, a plurality of first back-drill holes 50*e* are formed, and the third horizontal copper foil 37*a* and the first horizontal copper foil 34*a* are not electrically connected with each other. Moreover, portions of the conductive posts in the plurality of second blind holes 50*d* are removed through a back-drilling process. Consequently, a plurality of second back-drill holes 50*f* are formed, and the fourth horizontal copper foil 37*b* and the second horizontal copper foil 34*b* are not electrically connected with each other. The first horizontal copper foil 34*a*, the second horizontal copper foil 34*b*, the first horizontal transition structures 34*f*, the sixth horizontal transition structures 34*h*, the first connection copper foil 34*c* and the second connection copper foil 34*d* are collaboratively formed as a first metal structure 34. The third horizontal copper foil 37*a*, the fourth horizontal copper foil 37*b* and the conductive posts in the plurality of second through holes 30*e* are collaboratively formed as a second metal structure 37. Alternatively, the plurality of first back-drill holes 50*e* and the plurality of second back-drill holes 50*f* are plugged through a hole-plugging process such as a resin hole-plugging process or a green oil hole-plugging process. The first back-drill holes 50*e* and the second back-drill holes 50*f* are mechanical blind holes. Consequently, a certain precision level can be assured. For example, the precision level is within +/−50 μm.

Figure 18D:
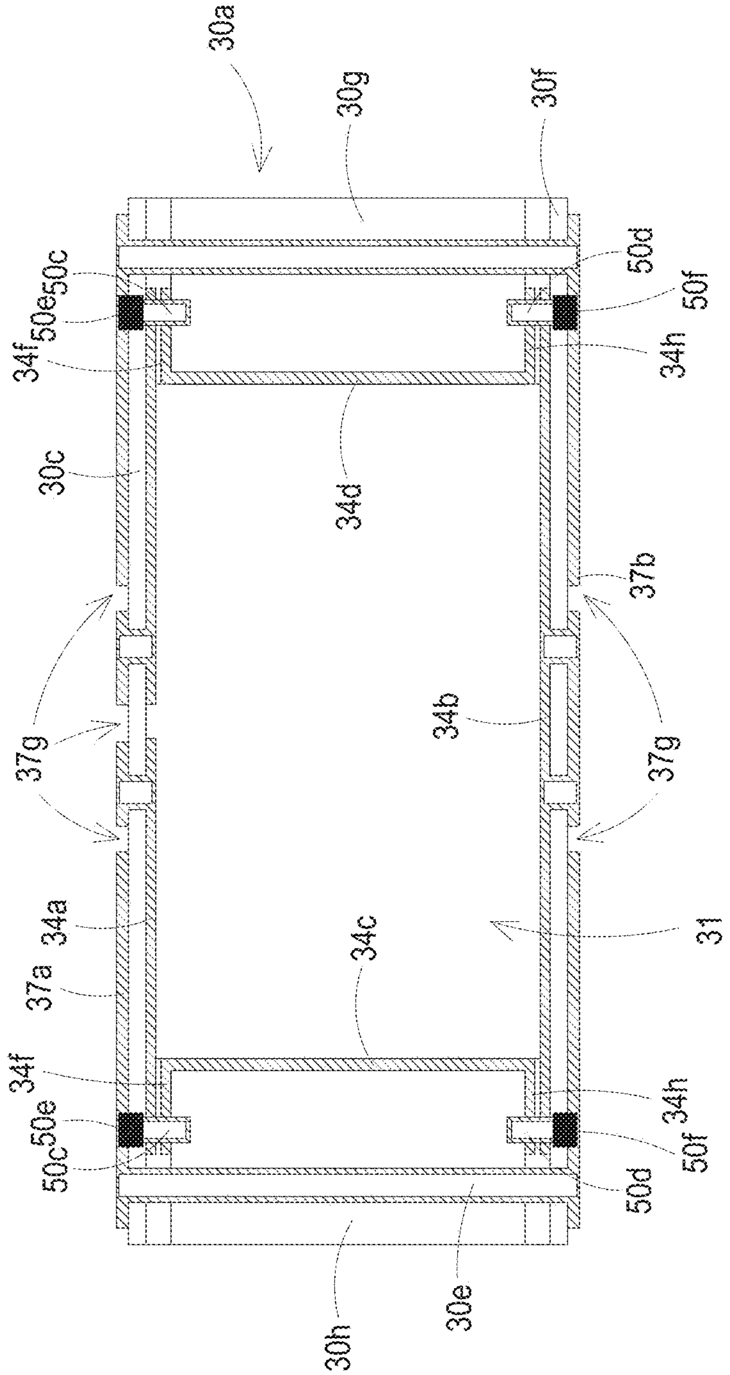

Please refer to FIG. 18D. Then, a metallization process is performed to form etch holes 37*g* in the third horizontal copper foil 37*a* and the fourth horizontal copper foil 37*b*.

Figure 18E:
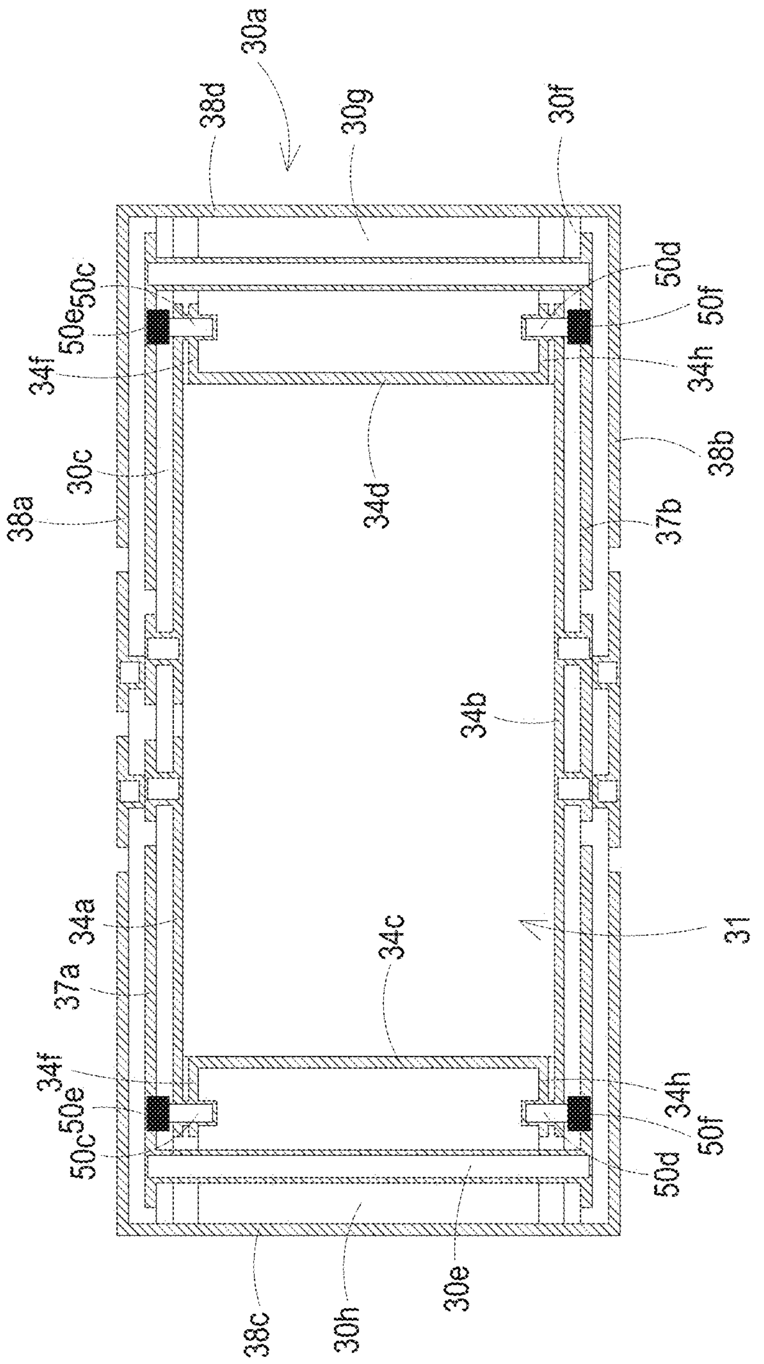
Figure 18F:
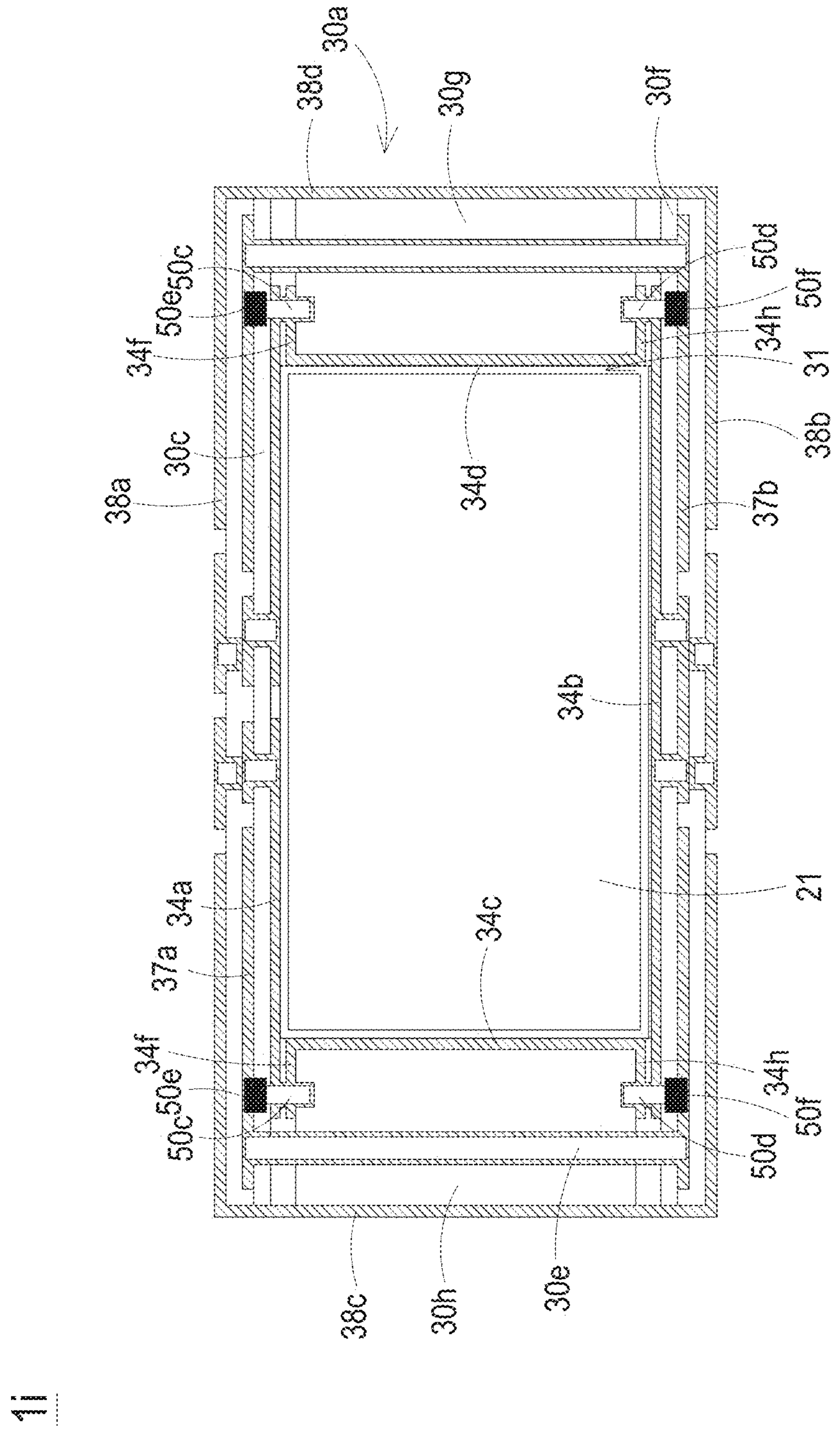

The steps of FIGS. 18E and 18F are similar to the steps of FIGS. 8F and 8G.

In an embodiment, the first metal structure 34 and the second metal structure 37 are formed simultaneously after the first back-drill holes 50*e* and the second back-drill holes 50*f* are formed. Consequently, the fabricating process is simplified, and the cost is reduced. Moreover, the first back-drill holes 50*e* and the second back-drill holes 50*f* are mechanical through holes or mechanical blind holes. When compared with the laser drilling method for the high density interconnector (HDI) board, the technology of the present invention is the ordinary printed circuit board technology and the production line is very mature. Consequently, the fabricating cost is further reduced. In this embodiment, the first metal structure 34 is formed on the four lateral surfaces of the inner wall of the first accommodation space 31. When compared with the structure of FIG. 17, the portion of the substrate 3 of this embodiment overlying the first magnetic part 31 is largely reduced. In case that the overall thickness of the magnetic element is not changed, the height and the cross-sectional area of the magnetic part can be increased. Consequently, the magnetic loss is reduced, and the efficiency is largely increased.

It is noted that numerous modifications and alterations may be made while retaining the teachings of the invention. For example, in the first embodiment to the tenth embodiment, the substrate 3 is equipped with the first metal structure 34 and the second metal structure 37, but is not equipped with the third metal structure.

FIGS. 19A to 19F are schematic cross-sectional views illustrating a process of manufacturing a magnetic element according to an eleventh embodiment of the present invention.

Figure 19A:
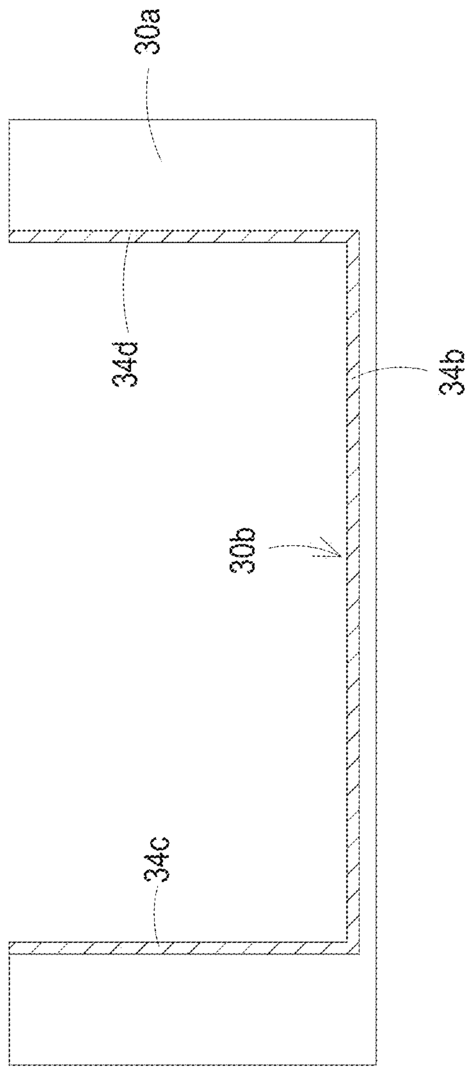
FIGS. 19A to 19F are schematic cross-sectional views illustrating a process of manufacturing a magnetic element according to an eleventh embodiment of the present invention.

Please refer to FIG. 19A. Firstly, a base 30*a* with a recess 30*b* is provided. Then, a second horizontal copper foil 34*b*, a first connection copper foil 34*c* and a second connection copper foil 34*d* are formed on an inner wall of the recess 30*b*.

Figure 19B:
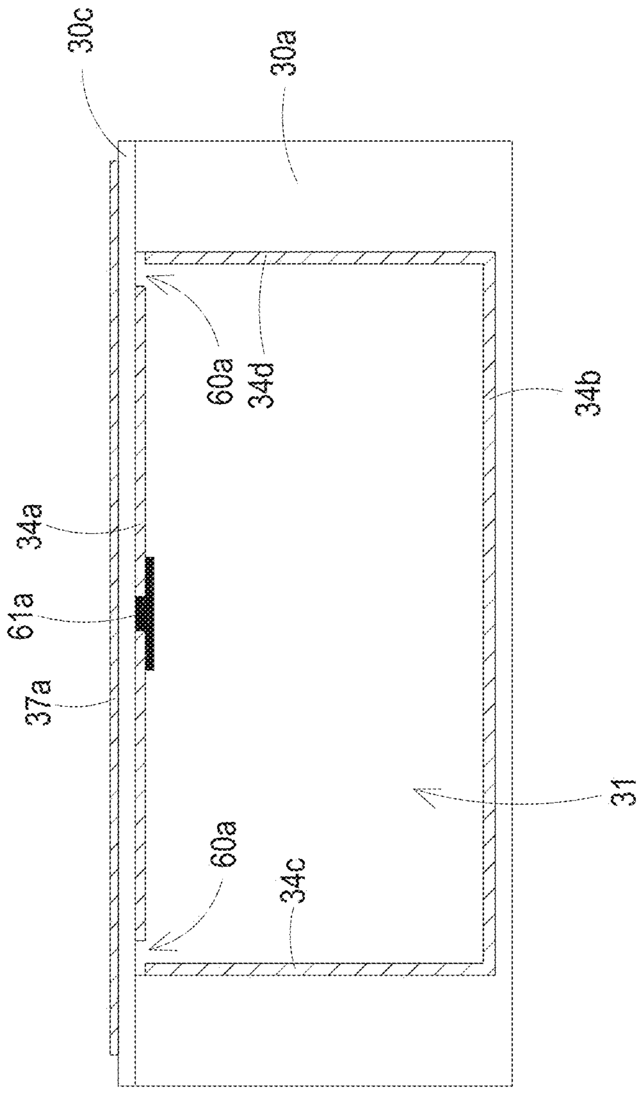

Please refer to FIG. 19B. Then, a top plate 30*c*, an electroless-plating resistant layer 61*a*, a first horizontal copper foil 34*a* and a third horizontal copper foil 37*a* are provided. The third horizontal copper foil 37*a* is disposed on a first side of the top plate 30*c*. The electroless-plating resistant layer 61*a* and the first horizontal copper foil 34*a* are disposed on a second side of the top plate 30*c*. The first horizontal copper foil 34*a* is divided into two segments by the electroless-plating resistant layer 61*a*. Then, the top plate 30*c* and the base 30*a* are laminated together. Consequently, a first accommodation space 31 is defined by the base 30*a* and the top plate 30*c* collaboratively. The first horizontal copper foil 34*a*, the second horizontal copper foil 34*b*, the first connection copper foil 34*c*, the second connection copper foil 34*d* and the electroless-plating resistant layer 61*a* are disposed within the first accommodation space 31. There is a gap 60*a* between a first portion of the first horizontal copper foil 34*a* and the first connection copper foil 34*c*. There is another gap 60*a* between a second portion of the first horizontal copper foil 34*a* and the second connection copper foil 34*d*. Due to the electroless-plating resistant layer 61*a*, the excessive copper is not electroplated on the first horizontal copper foil 34*a* during the copper electroplating process. Consequently, the two segments of the first horizontal copper foil 34*a* are located besides two opposite sides of the electroless-plating resistant layer 61*a*.

Figure 19C:
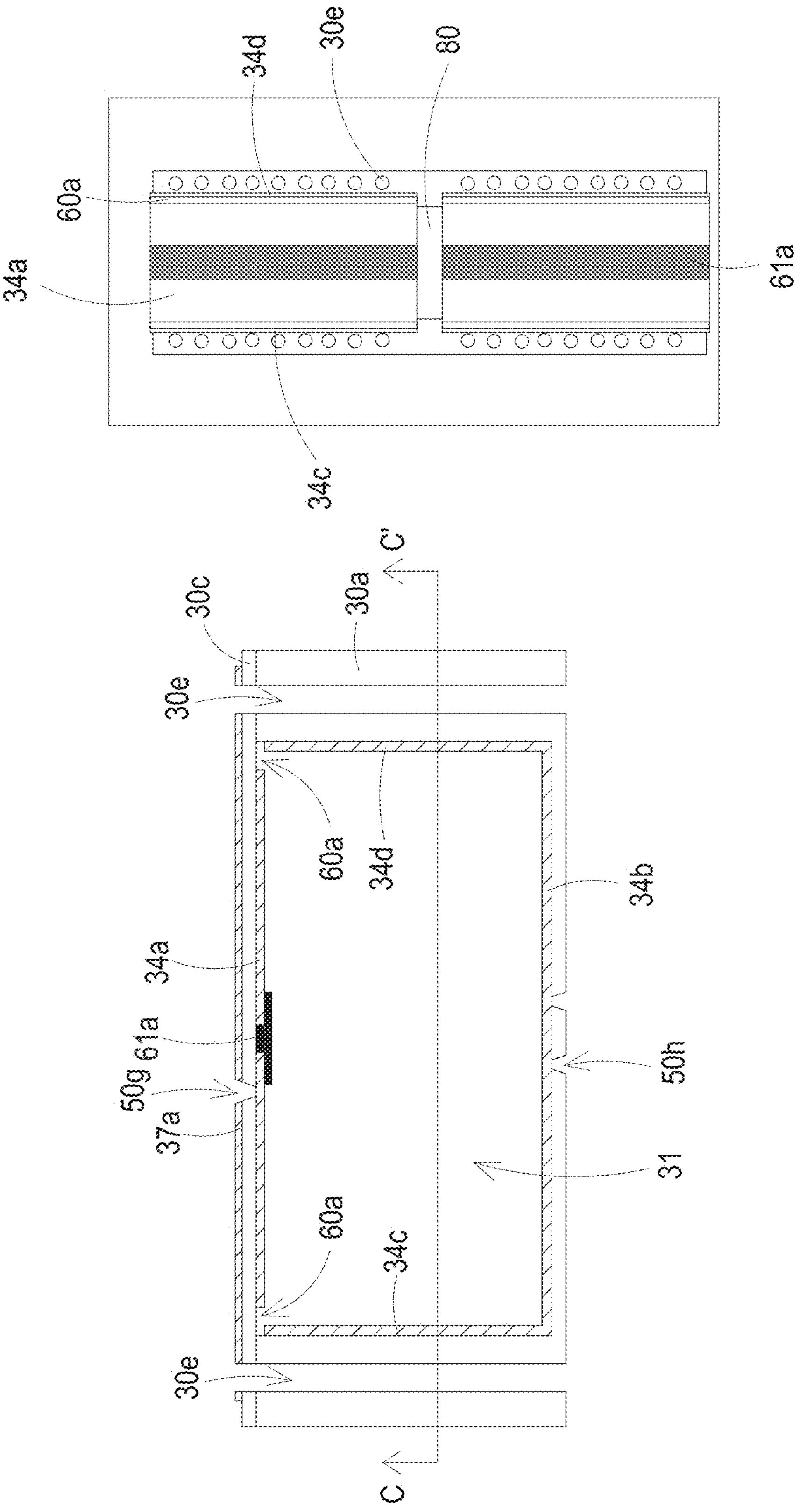

As shown in the left part of FIG. 19C, a plurality of second through holes 30*e* are formed in the base 30*a* through a hole-drilling process. The second through holes 30*e* also run through the top plate 30*c* and the third horizontal copper foil 37*a*. For example, the hole-drilling process is a mechanical hole-drilling process. In some embodiments, a third blind hole 50*g* is formed in the top plate 30*c* and the third horizontal copper foil 37*a*, and a fourth blind hole 50*h* is formed in the base 30*a* through a hole-drilling process. For example, the hole-drilling process is a laser hole-drilling process. The right part of FIG. 19C is a schematic cross-sectional view of the left part of FIG. 19C and taken along the line C-C'. As shown in the right part of FIG. 19C, the substrate 3 further includes a waist-shaped groove 80. The waist-shaped groove 80 is in communication with the first accommodation space 31.

Figure 19D:
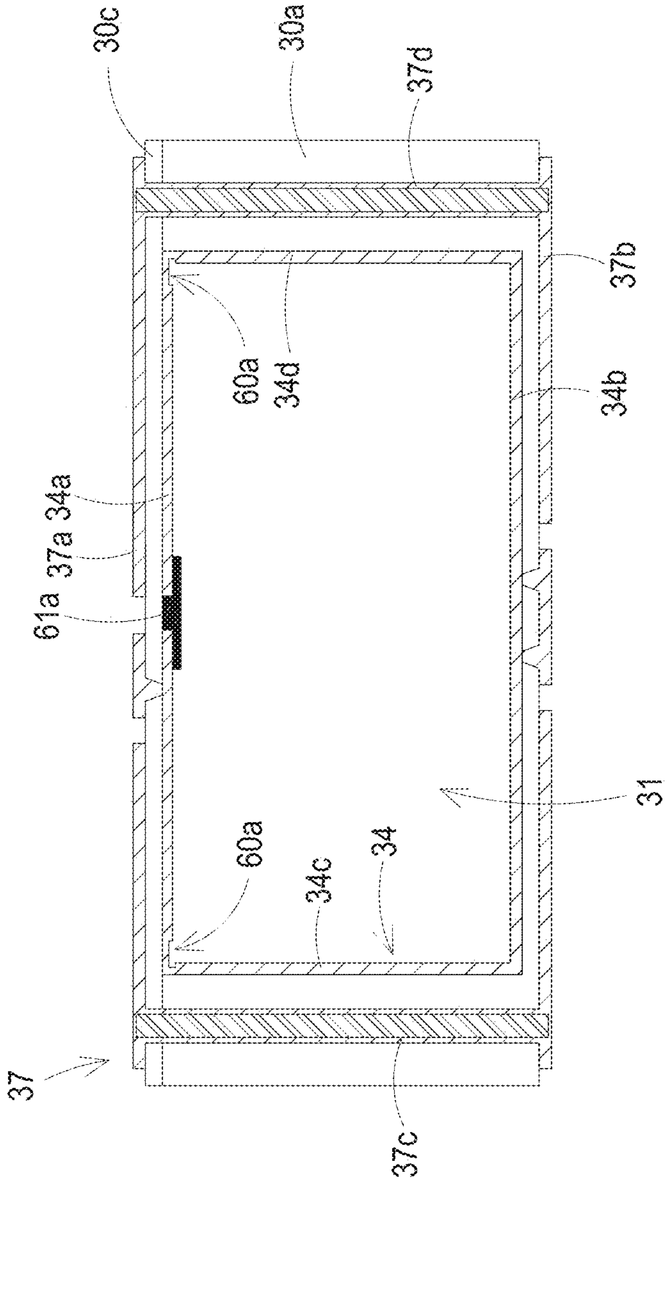

Please refer to FIG. 19D. Then, a fourth horizontal copper foil 37*b* is formed on the base 30*a*. The fourth horizontal copper foil 37*b* and the third horizontal copper foil 37*a* are opposite to each other with respect to the first accommodation space 31. Moreover, a third connection copper foil 37*c* and a fourth connection copper foil 37*d* are formed in the corresponding second through holes 30*e*. The third connection copper foil 37*c* is connected with a first end of the third horizontal copper foil 37*a* and a first end of the fourth horizontal copper foil 37*b*. The fourth connection copper foil 37*d* is connected with a second end of the third horizontal copper foil 37*a* and a second end of the fourth horizontal copper foil 37*b*. Since the gaps 60 are filled with copper foil, the first horizontal copper foil 34*a* is connected with the first connection copper foil 34*c* and the second connection copper foil 34*d*. The first connection copper foil 34*c*, the second connection copper foil 34*d*, the first horizontal copper foil 34*a* and the second horizontal copper foil 34*b* are collaboratively defined as a first metal structure 34. The third connection copper foil 37*c*, the fourth connection copper foil 37*d*, the third horizontal copper foil 37*a* and the fourth horizontal copper foil 37*b* are collaboratively defined as a second metal structure 37. In this embodiment, the entire of the first metal structure 34 is disposed on the inner wall of the first accommodation space 31. Due to the arrangement of the electroless-plating resistant layer 61*a*, the seed copper is not formed on the position of the electroless-plating resistant layer 61*a* during the copper electroplating process, and the connection copper foil is not formed on the position of the electroless-plating resistant layer 61*a* during the copper electroplating process.

Figure 19E:
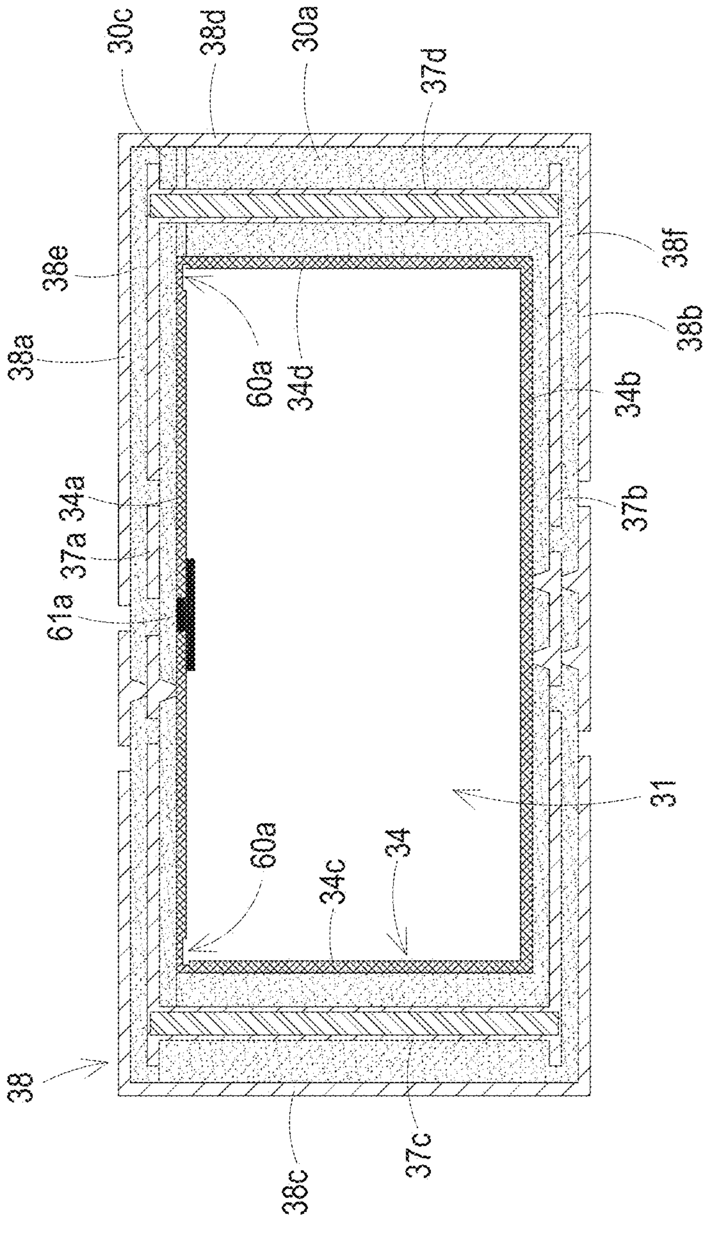

Please refer to FIG. 19E. Then, a fifth horizontal copper foil 38*a*, a sixth horizontal copper foil 38*b*, a fifth connection copper foil 38*c*, a sixth connection copper foil 38*d*, a third insulation layer 38*e* and a fourth insulation layer 38*f* are disposed on the outside of the second metal structure 37. The third insulation layer 38*e* is arranged between the fifth horizontal copper foil 38*a* and the third horizontal copper foil 37*a*. The fourth insulation layer 38*f* is arranged between the sixth horizontal copper foil 38*b* and the fourth horizontal copper foil 37*b*. The fifth connection copper foil 38*c* is connected between a first end of the fifth horizontal copper foil 38*a* and a first end of the sixth horizontal copper foil 38*b*. The sixth connection copper foil 38*d* is connected between a second end of the fifth horizontal copper foil 38*a* and a second end of the sixth horizontal copper foil 38*b*. The fifth horizontal copper foil 38*a*, the sixth horizontal copper foil 38*b*, the fifth connection copper foil 38*c* and the sixth connection copper foil 38*d* are collaboratively formed as a third metal structure 38. In this embodiment, the third metal structure 38 is formed through a hole drilling process or a metallization process. The first metal structure 34 and the second metal structure 37 are connected with each other through conductive posts. The second metal structure 37 and the third metal structure 38 are connected with each other through conductive posts. The conductive posts are formed through formed through a machining process or a laser drilling process. In some embodiments, each of the fifth connection copper foil 38*c* and the sixth connection copper foil 38*d* is formed by cutting a conductive post that are shared by two adjacent substrates 3.

Figure 19F:
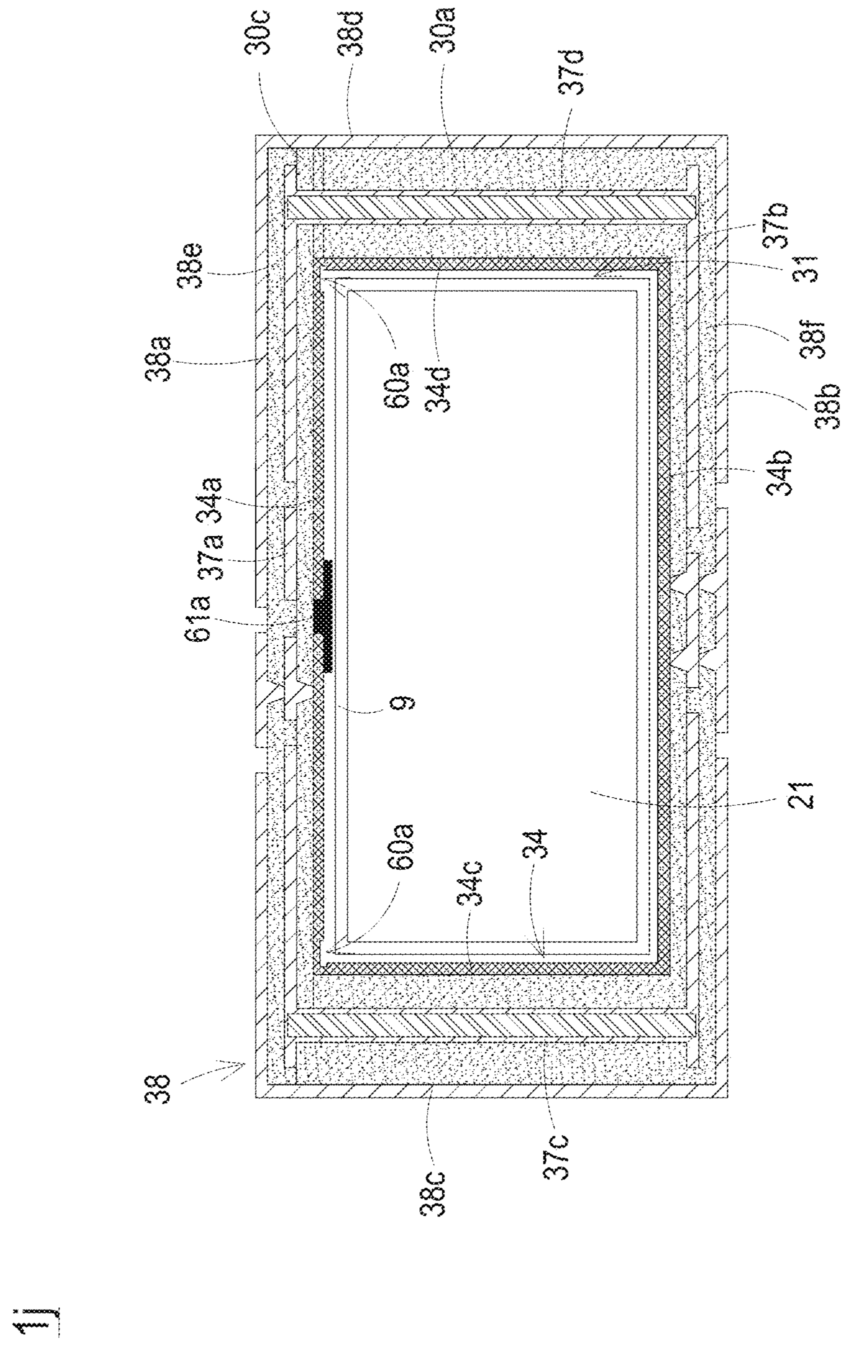

Please refer to FIG. 19F. Then, a first magnetic part 21 is disposed within the first accommodation space 31 of the substrate 3. Consequently, the magnetic element 1*j* is produced. In an embodiment, the magnetic element 1*j* is equipped with the first metal structure 34 and the third metal structure 38, but not equipped with the second metal structure 37. In another embodiment, the magnetic element 1*j* is equipped with the first metal structure 34, but not equipped with the second metal structure 37 and the third metal structure 38.

In this embodiment, the entire of the first metal structure 34 is formed on the inner wall of the first accommodation space 31 of the magnetic element 1*j*. Consequently, it is not necessary to connect other metal parts with other metal structures (e.g., horizontal transition structures). In addition, it is not necessary to provide an additional insulation structure to separate the first metal structure from other metal structures. Since the width and the height of the first metal structure 34 are smaller, the dimension of the magnetic element 1*j* can be further reduced, and the power density of the magnetic element 1*j* can be enhanced. In case that the dimension of the magnetic element 1*j* is not changed, the dimension of the magnetic core assembly can be increased. Consequently, the magnetic loss can be effectively reduced, and the efficiency of the magnetic element 1*j* can be increased.

As mentioned above, the entire of the first metal structure 34 is formed on the inner wall of the first accommodation space 31. However, the first horizontal copper foil 34*a* of the first metal structure 34 is still formed in the first horizontal wiring layer, and the second horizontal copper foil 34*b* of the first metal structure 34 is still formed in a second horizontal wiring layer.

FIGS. 20A to 20E are schematic cross-sectional views illustrating a process of manufacturing a magnetic element according to a twelfth embodiment of the present invention.

Figure 20A:
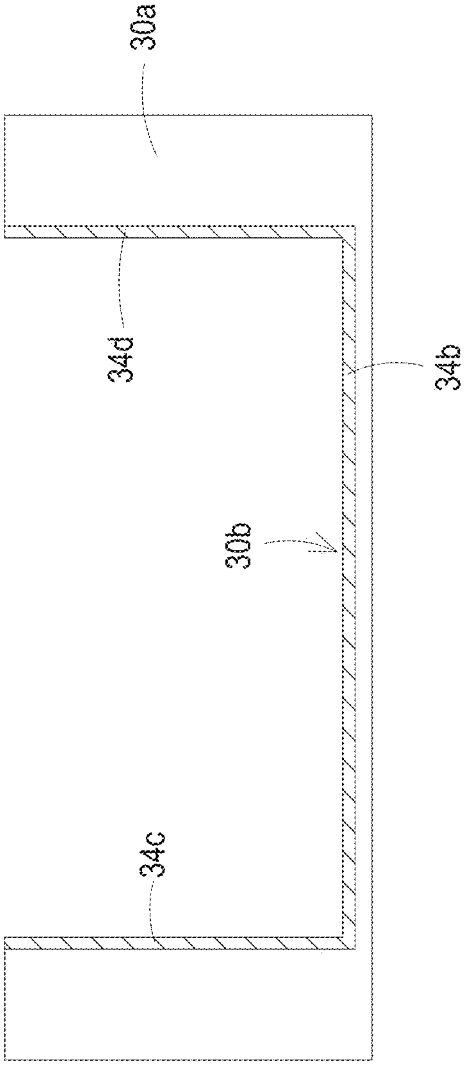
FIGS. 20A to 20E are schematic cross-sectional views illustrating a process of manufacturing a magnetic element according to a twelfth embodiment of the present invention.

Please refer to FIG. 20A. Firstly, a base 30*a* with a recess 30*b* is provided. Then, a second horizontal copper foil 34*b*, a first connection copper foil 34*c* and a second connection copper foil 34*d* are formed on an inner wall of the recess 30*b*.

Figure 20B:
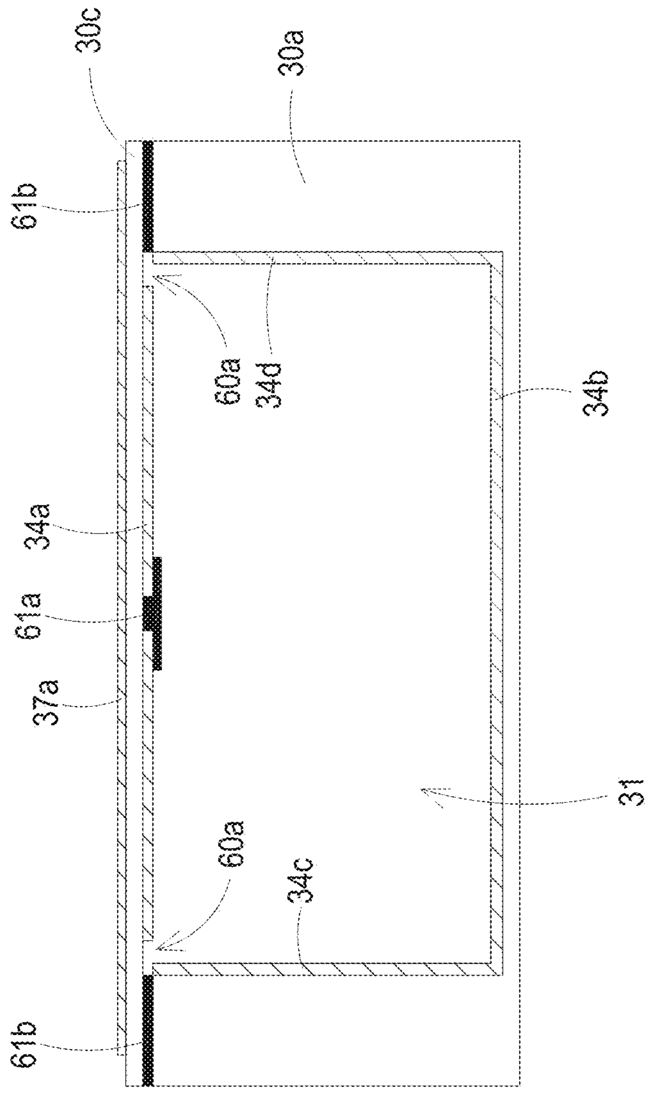

Then, the step of FIG. 20B is performed. The step of FIG. 20B is similar to the step of FIG. 19B. However, as shown in FIG. 20B, the substrate 3 further includes two insulation layers 61*b*. One of the two insulation layers 61*b* is arranged between the top plate 30*c* and a first end of the base 30*a*. The other insulation layer 61*b* is arranged between the top plate 30*c* and a second end of the base 30*a*.

Figure 20C:
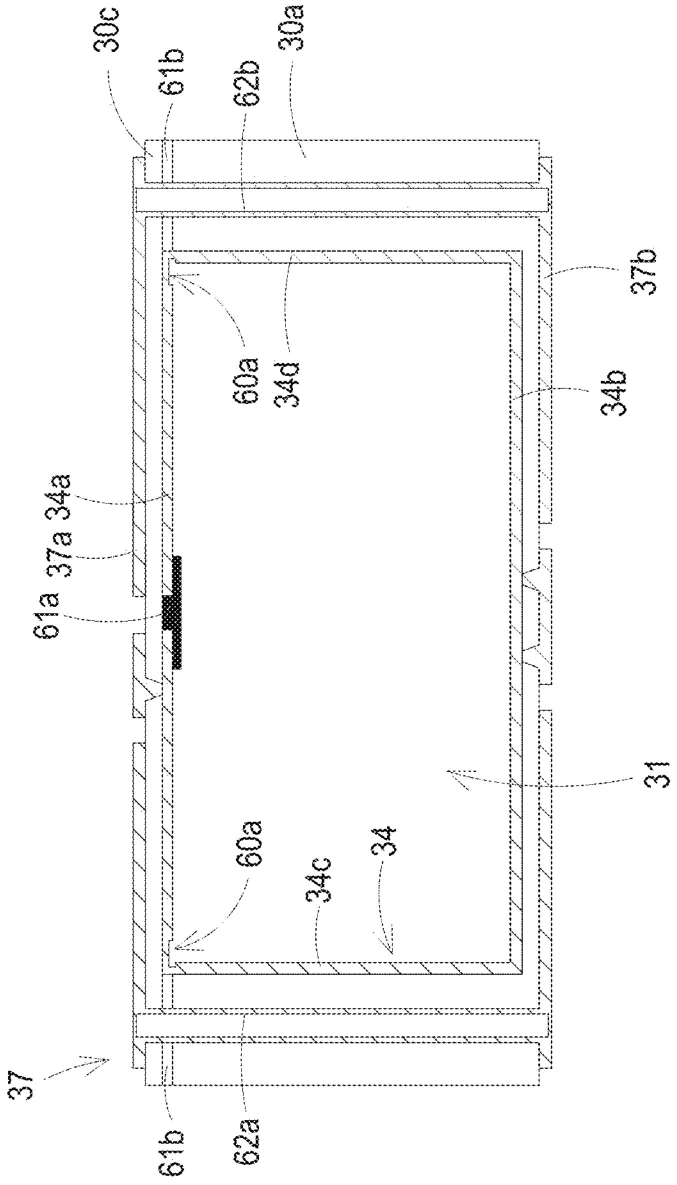

Please refer to FIG. 20C. Then, a fourth horizontal copper foil 37*b* is formed on the base 30*a*. The fourth horizontal copper foil 37*b* and the third horizontal copper foil 37*a* are opposite to each other with respect to the first accommodation space 31. Then, a first shared conductive post 62*a* and a second shared conductive post 62*b* are formed. The first shared conductive post 62*a* is connected with a first end of the third horizontal copper foil 37*a* and a first end of the fourth horizontal copper foil 37*b*, and the first shared conductive post 62*a* is penetrated through the corresponding insulation layer 61*b*. The second shared conductive post 62*b* is connected with a second end of the third horizontal copper foil 37*a* and a second end of the fourth horizontal copper foil 37*b*, and the second shared conductive post 62*b* is penetrated through the corresponding insulation layer 61*b*.

Figure 20D:
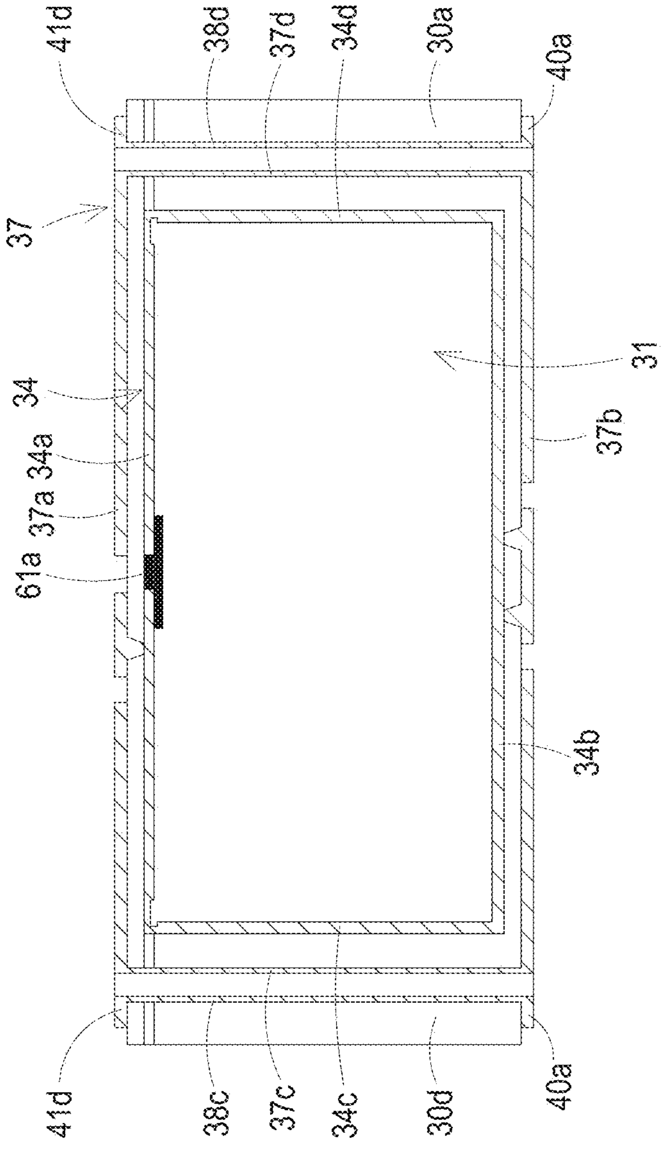

Please refer to FIG. 20D. The first shared conductive post 62*a* and the second shared conductive post 62*b* are respectively cut by a mechanical cutting process. Then, the first shared conductive post 62*a* is cut into a third connection copper foil 37*c* and a fifth connection copper foil 38*c*, and the second shared conductive post 62*b* is cut into a fourth connection copper foil 37*d* and a sixth connection copper foil 38*c*. In this step, the two ends of the third horizontal copper foil 37*a* are cut off, and two fourth horizontal transition structures 41*d* are formed on the two ends of the third horizontal copper foil 37*a*. In addition, the two ends of the fourth horizontal copper foil 37*b* are cut off, and two fifth horizontal transition structures 40*a* are formed on the two ends of the fourth horizontal copper foil 37*b*. The first horizontal copper foil 34*a*, the second horizontal copper foil 34*b*, the first connection copper foil 34*c* and the second connection copper foil 34*d* are collaboratively defined as a first metal structure 34. The third connection copper foil 37*c*, the fourth connection copper foil 37*d*, the third horizontal copper foil 37*a* and the fourth horizontal copper foil 37*b* are collaboratively defined as a second metal structure 37.

Figure 20E:
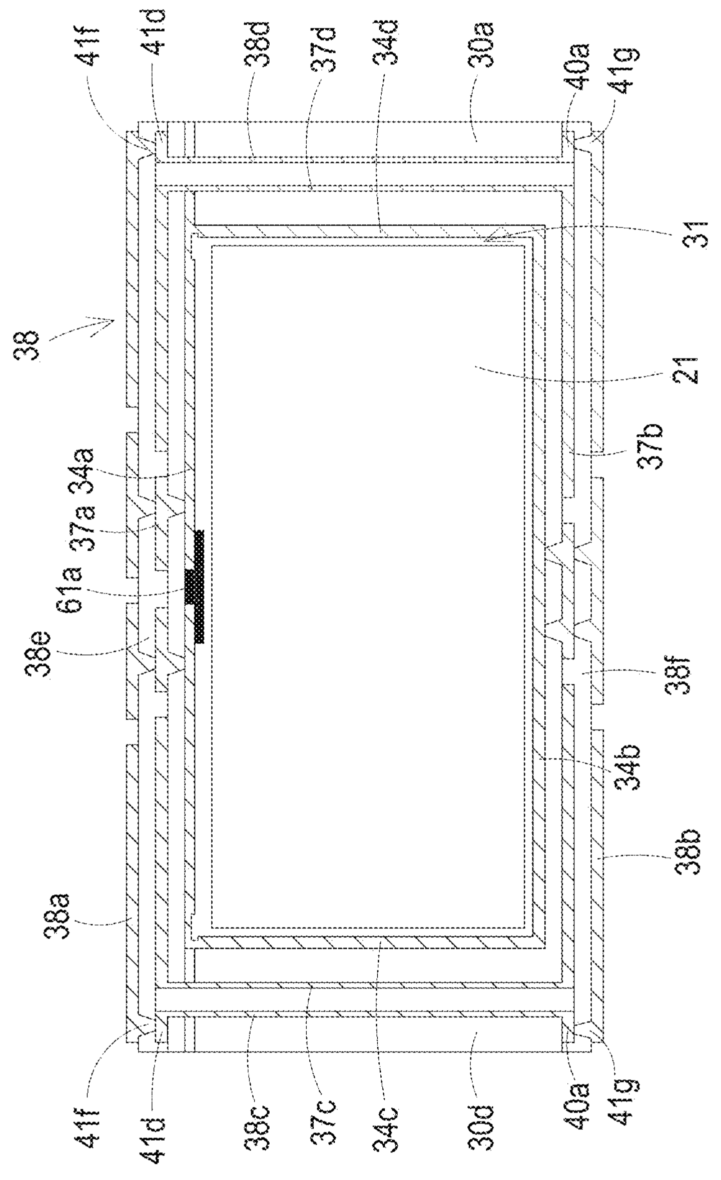

Please refer to FIG. 20E. Then, a fifth horizontal copper foil 38*a* and a third insulation layer 38*e* are formed on the third horizontal copper foil 37*a*. The third insulation layer 38*e* is arranged between the fifth horizontal copper foil 38*a* and the third horizontal copper foil 37*a*. The two ends of the fifth horizontal copper foil 38*a* are connected with the corresponding fourth horizontal transition structures 41*d* through two fourth conductive posts 41*f* respectively. Moreover, a sixth horizontal copper foil 38*b* and a fourth insulation layer 38*f* are formed on the fourth horizontal copper foil 37*b*. The fourth insulation layer 38*f* is arranged between the sixth horizontal copper foil 38*b* and the fourth horizontal copper foil 37*b*. The two ends of the sixth horizontal copper foil 38*b* are connected with the corresponding fifth horizontal transition structures 40*a* through corresponding fifth conductive posts 41*g* respectively. The fifth horizontal copper foil 38*a*, the sixth horizontal copper foil 38*b*, the fifth connection copper foil 38*c*, the sixth connection copper foil 38*d*, the two fifth horizontal transition structures 40*a*, the two fourth horizontal transition structures 41*d*, the two fourth conductive posts 41*f* and the two fifth conductive posts 41*g* are collaboratively formed as a third metal structure 38. Then, a first magnetic part 21 is disposed within the first accommodation space 31 of the substrate 3. Consequently, the magnetic element 1*k* is produced. In this embodiment, the first shared conductive post 62*a* and the second shared conductive post 62*b* are cut through a mechanical cutting process.

Figure 21B:
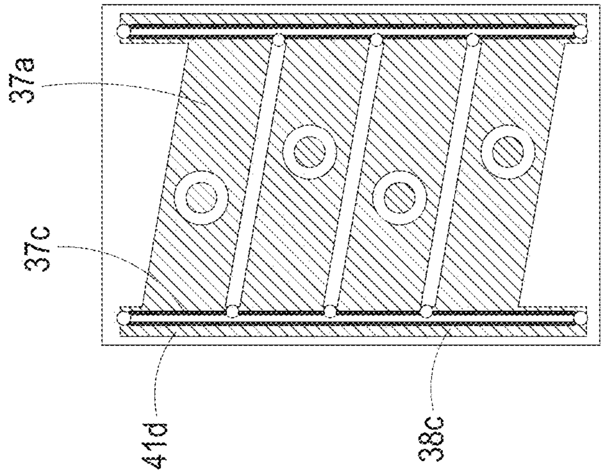
FIG. 21B is a schematic top view of the structure as shown in FIG. 20D.
Figure 21A:
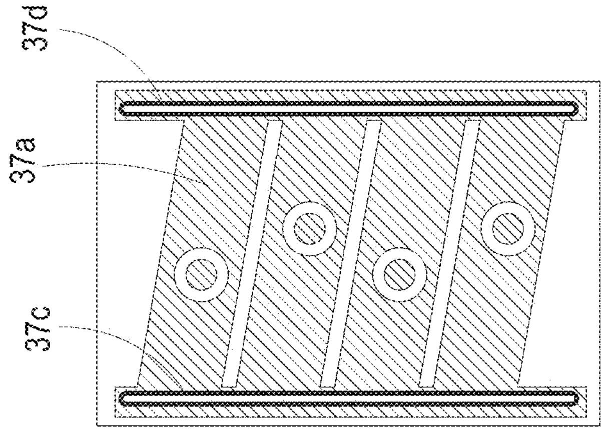
FIG. 21A is a schematic top view of the structure as shown in FIG. 20C.

FIG. 21A is a schematic top view of the structure as shown in FIG. 20C. FIG. 21B is a schematic top view of the structure as shown in FIG. 20D. In this embodiment, the third connection copper foil 37*c* and the fourth connection copper foil 37*d* of the second metal structure 37 are lateral copper structures. Consequently, the width of the second metal structure 37 of the magnetic element 1*k* is smaller and the fabricating process is well-established fabricating process. If the panelization technology is used, the benefit of mass production is achieved. Moreover, the third connection copper foil 37*c* and the fourth connection copper foil 37*d* of the second metal structure 37 and the fifth connection copper foil 38*c* and the sixth connection copper foil 38*d* of the third metal structure 38 are formed through a single electroplating process and a mechanical cutting process. Consequently, the fabricating time and the cost are reduced. In this embodiment, the first metal structure 34 is formed on the four lateral sides of the inner wall of the first accommodation space 31.

Figure 22:
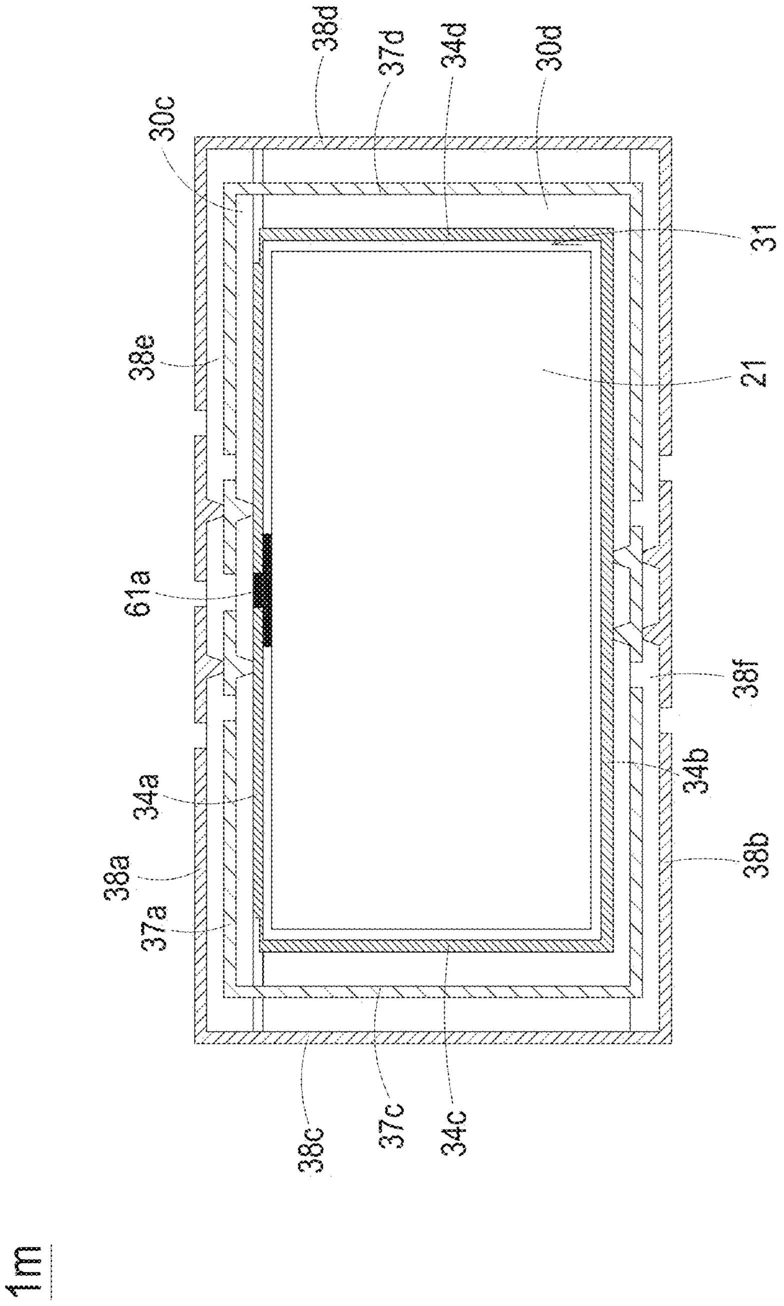
FIG. 22 is a schematic cross-sectional view illustrating a magnetic element according to a thirteenth embodiment of the present invention.

FIG. 22 is a schematic cross-sectional view illustrating a magnetic element according to a thirteenth embodiment of the present invention. In comparison with the magnetic element 1*k* of FIG. 20E, the substrate 3 of the magnetic element 1*m* of this embodiment is not equipped with the two fourth horizontal transition structures 41*d* and the two fifth horizontal transition structures 40*a*. In this embodiment, the two ends of the fifth horizontal copper foil 38*a* are directly connected with a first end of the fifth connection copper foil 38*c* and a first end of the sixth connection copper foil 38*d*, and the two ends of the sixth horizontal copper foil 38*b* are directly connected with a second end of the fifth connection copper foil 38*c* and a second end of the sixth connection copper foil 38*d*. Since the fourth horizontal transition structures and the fifth horizontal transition structures are omitted, the overall dimension of the substrate 3 is reduced. In some embodiments, the fourth horizontal transition structures and the fifth horizontal transition structures are removed through a slot-milling process.

FIGS. 23A to 23F are schematic cross-sectional views illustrating a process of manufacturing a magnetic element according to a fourteenth embodiment of the present invention.

Figure 23A:
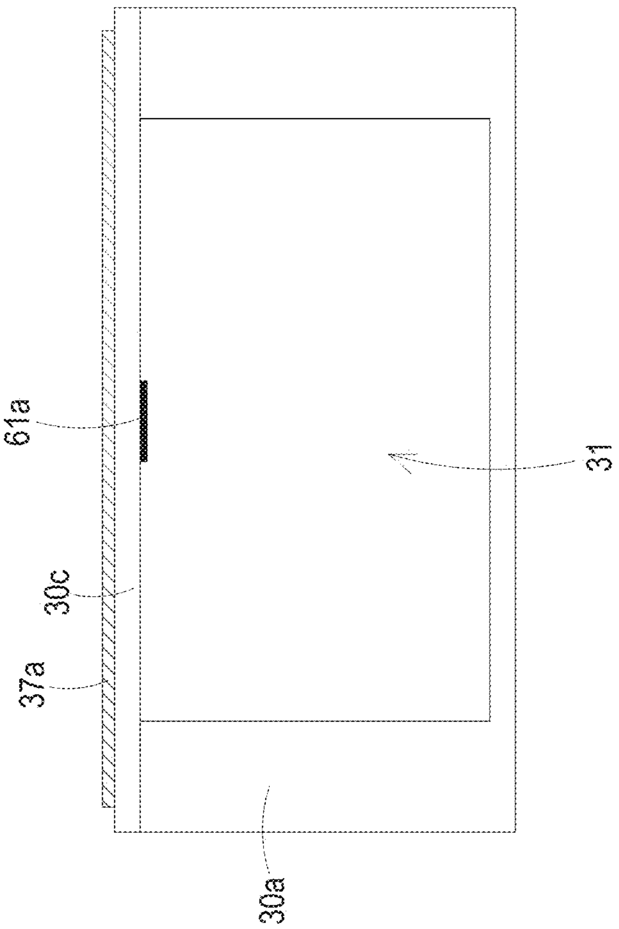
FIGS. 23A to 23F are schematic cross-sectional views illustrating a process of manufacturing a magnetic element according to a fourteenth embodiment of the present invention.

Please refer to FIG. 23A. Firstly, a top plate 30*c*, a base 30*a*, a third horizontal copper foil 37*a* and an electroless-plating resistant layer 61*a* are provided. The top plate 30*c* is disposed on the base 30*a*. Consequently, a first accommodation space 31 is defined by the base 30*a* and the top plate 30*c* collaboratively. The third horizontal copper foil 37*a* and the electroless-plating resistant layer 61*a* are opposite to each other with respect to the top plate 30*c*. The electroless-plating resistant layer 61*a* is disposed within the first accommodation space 31.

Figure 23B:
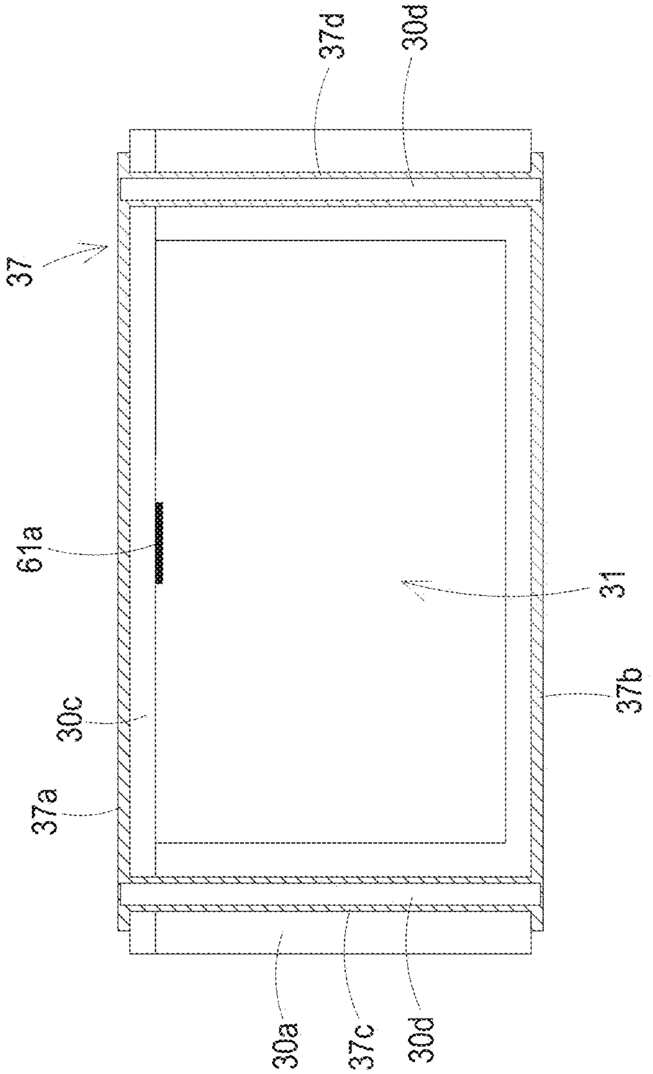

Please refer to FIG. 23B. Then, a fourth horizontal copper foil 37*b* is formed on the base 30*a*. The fourth horizontal copper foil 37*b* and the third horizontal copper foil 37*a* are opposite to each other with respect to the first accommodation space 31. The base 30*a* further includes a plurality of first through holes 30*d*. The first through holes 30*d* run through the top plate 30*c* and the base 30*a*. In addition, the first through holes 30*d* are arranged between the third horizontal copper foil 37*a* and the fourth horizontal copper foil 37*b*. Moreover, the third connection copper foil 37*c* and the fourth connection copper foil 37*d* are formed in the corresponding first through holes 30*d* and penetrated through the top plate 30*c* and the base 30*a*. The two ends of the third connection copper foil 37*c* are connected with a first end of the third horizontal copper foil 37*a* and a first end of the fourth horizontal copper foil 37*b*. The two ends of the fourth connection copper foil 37*d* are connected with a second end of the third horizontal copper foil 37*a* and a second end of the fourth horizontal copper foil 37*b*. The third horizontal copper foil 37*a*, the fourth horizontal copper foil 37*b*, the third connection copper foil 37*c* and the fourth connection copper foil 37*d* are collaboratively defined as a second metal structure 37.

Figure 23C:
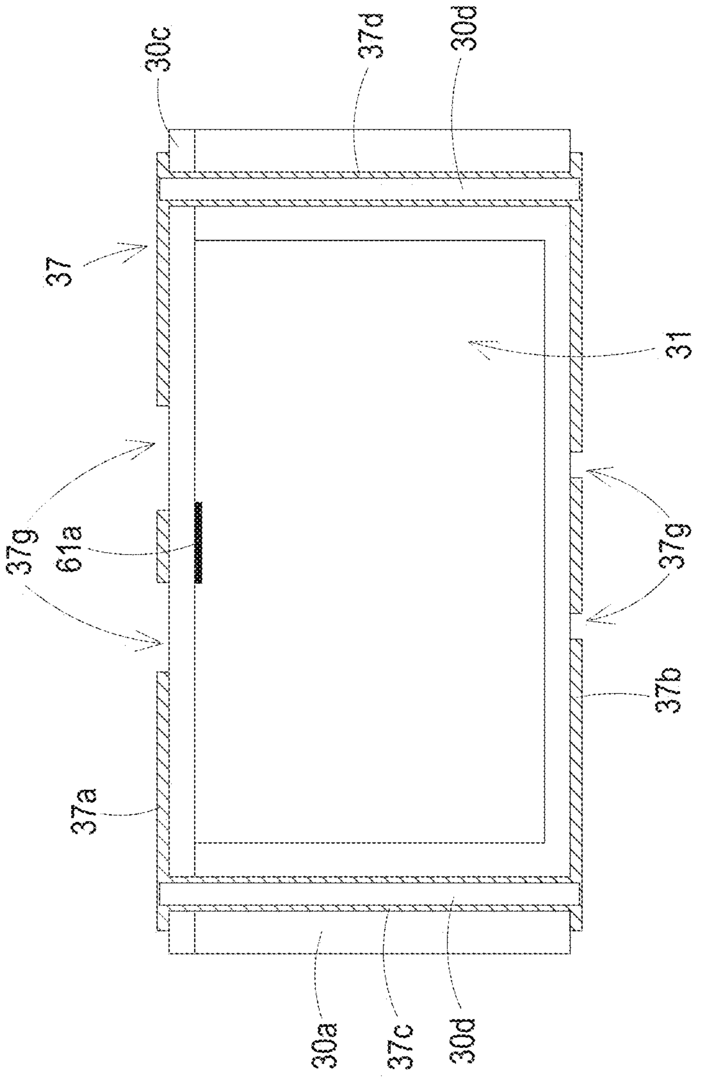

Please refer to FIG. 23C. Then, a metallization process is performed to form etch holes 37*g* in the third horizontal copper foil 37*a* and the fourth horizontal copper foil 37*b*.

Figure 23D:
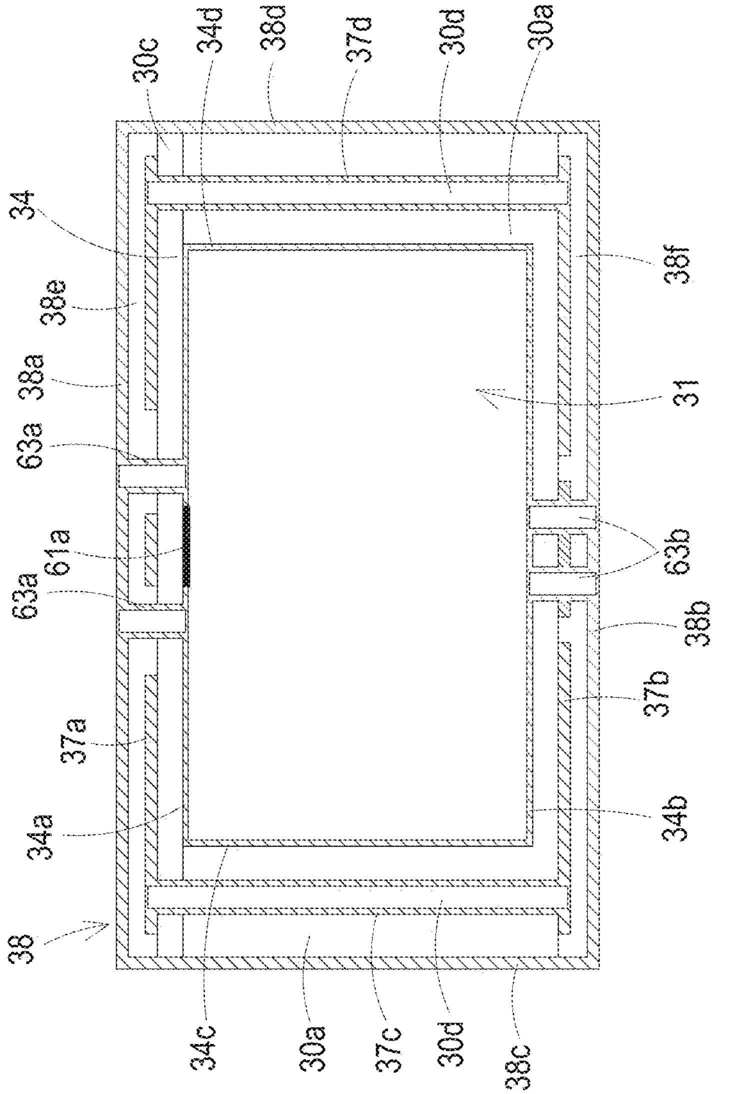

Please refer to FIG. 23D. Then, a third insulation layer 38*e* is formed on the third horizontal copper foil 37*a*, and a fourth insulation layer 38*f* is formed on the fourth horizontal copper foil 37*b*. Then, a plurality of third through holes 63*a* and a plurality of fourth through holes 63*b* are formed. The third through holes 63*a* run through the third insulation layer 38*e* and the top plate 30*c*. The fourth through holes 63*b* run through the fourth insulation layer 38*f* and the base 30*a*. Then, a first horizontal copper foil 34*a*, a second horizontal copper foil 34*b*, a first connection copper foil 34*c* and a second connection copper foil 34*d* are formed on an inner wall of the first accommodation space 31 through the plurality of third through holes 63*a* and the plurality of fourth through holes 63*b* by using a metallization process. The two ends of the first horizontal copper foil 34*a* are connected with a first end of the first connection copper foil 34*c* and a first end of the second connection copper foil 34*d*. The two ends of the second horizontal copper foil 34*b* are connected with a second end of the first connection copper foil 34*c* and a second end of the second connection copper foil 34*d*. The first horizontal copper foil 34*a*, the second horizontal copper foil 34*b*, the first connection copper foil 34*c* and the second connection copper foil 34*d* are collaboratively defined as a first metal structure 34. The portion of the inner wall of the first accommodation space 31 corresponding to the electroless-plating resistant layer 61*a* are not plated with the first metal structure 34. In this embodiment, a fifth horizontal copper foil 38*a* is formed on the third insulation layer 38*e*, and a sixth horizontal copper foil 38*b* is formed on the fourth insulation layer 38*f*. In addition, a fifth connection copper foil 38*c* and a sixth connection copper foil 38*d* are formed. The fifth connection copper foil 38*c* is connected between a first end of the fifth horizontal copper foil 38*a* and a first end of the sixth horizontal copper foil 38*b*. The sixth connection copper foil 38*d* is connected between a second end of the fifth horizontal copper foil 38*a* and a second end of the sixth horizontal copper foil 38*b*. The fifth horizontal copper foil 38*a*, the sixth horizontal copper foil 38*b*, the fifth connection copper foil 38*c* and the sixth connection copper foil 38*d* are collaboratively formed as a third metal structure 38.

Figure 23E:
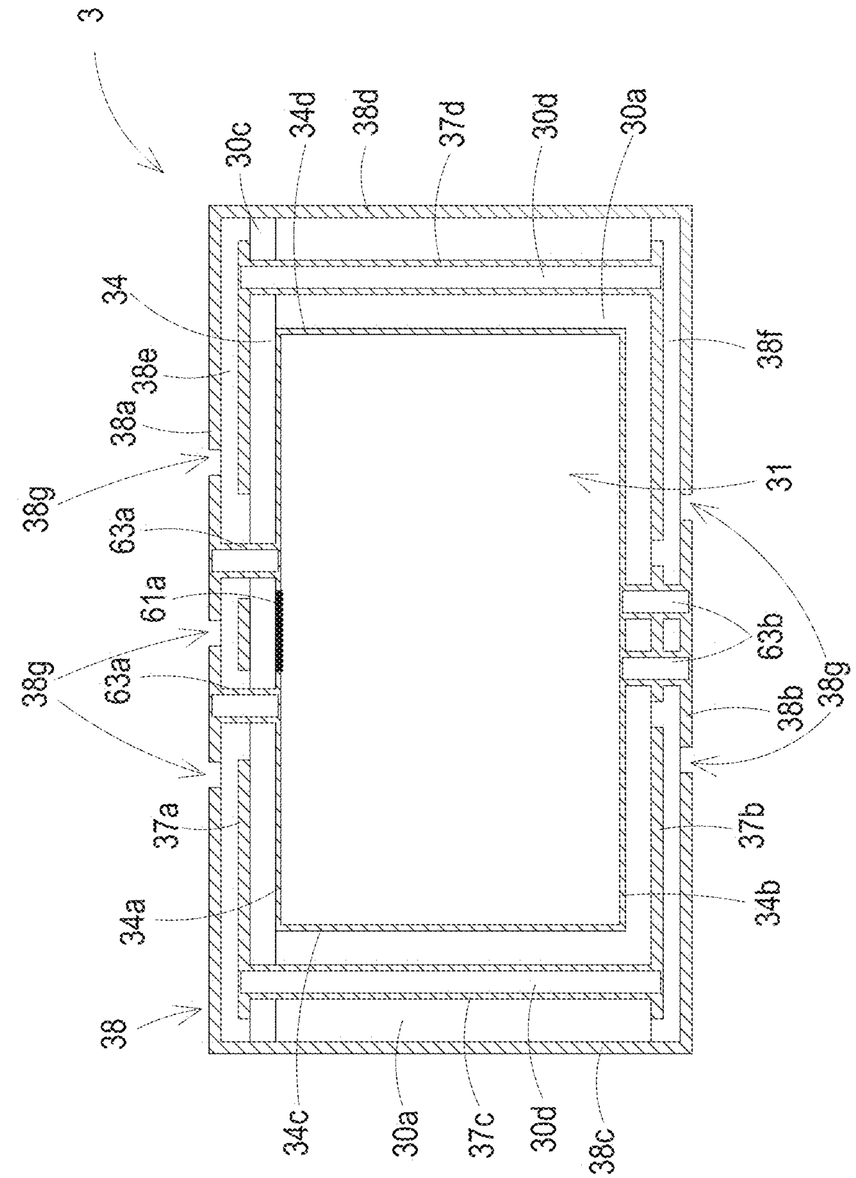

Please refer to FIG. 23E. Then, a metallization process is performed to form etch holes 38*g* in the fifth horizontal copper foil 38*a* and the sixth horizontal copper foil 38*b*.

Figure 23F:
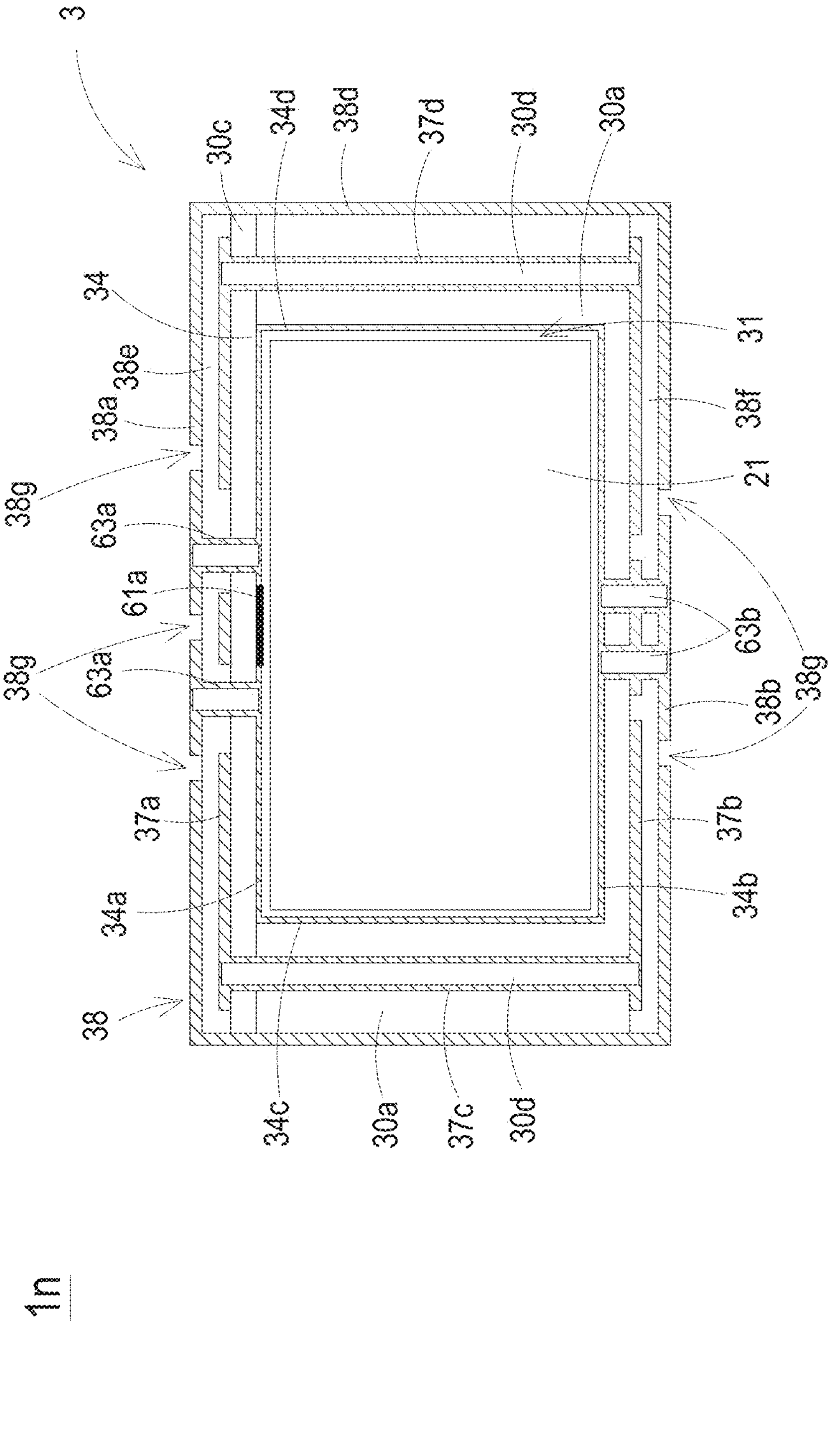

Please refer to FIG. 23F. Then, a first magnetic part 21 is disposed within the first accommodation space 31 of the substrate 3. Consequently, the magnetic element 1*n* is produced. In this embodiment, the first metal structure 34 is formed on the four lateral sides of the inner wall of the first accommodation space 31.

In this embodiment, the first metal structure 34 and the third metal structure 38 of the magnetic element 1*n* are simultaneously formed through a single electroplating process. Consequently, the fabricating time and the fabricating cost are largely reduced.

It is noted that numerous modifications and alterations may be made while retaining the teachings of the invention. For example, the step of FIG. 19A may be used to manufacture the substrate of FIG. 23F. For example, the second horizontal copper foil 34*b*, the first connection copper foil 34*c* and the second connection copper foil 34*d* are previously formed on the inner wall of the first accommodation space 31. After a subsequent metallization process is performed, the copper foil thickness is further increased. Consequently, the current flow capacity is enhanced.

Figure 24:
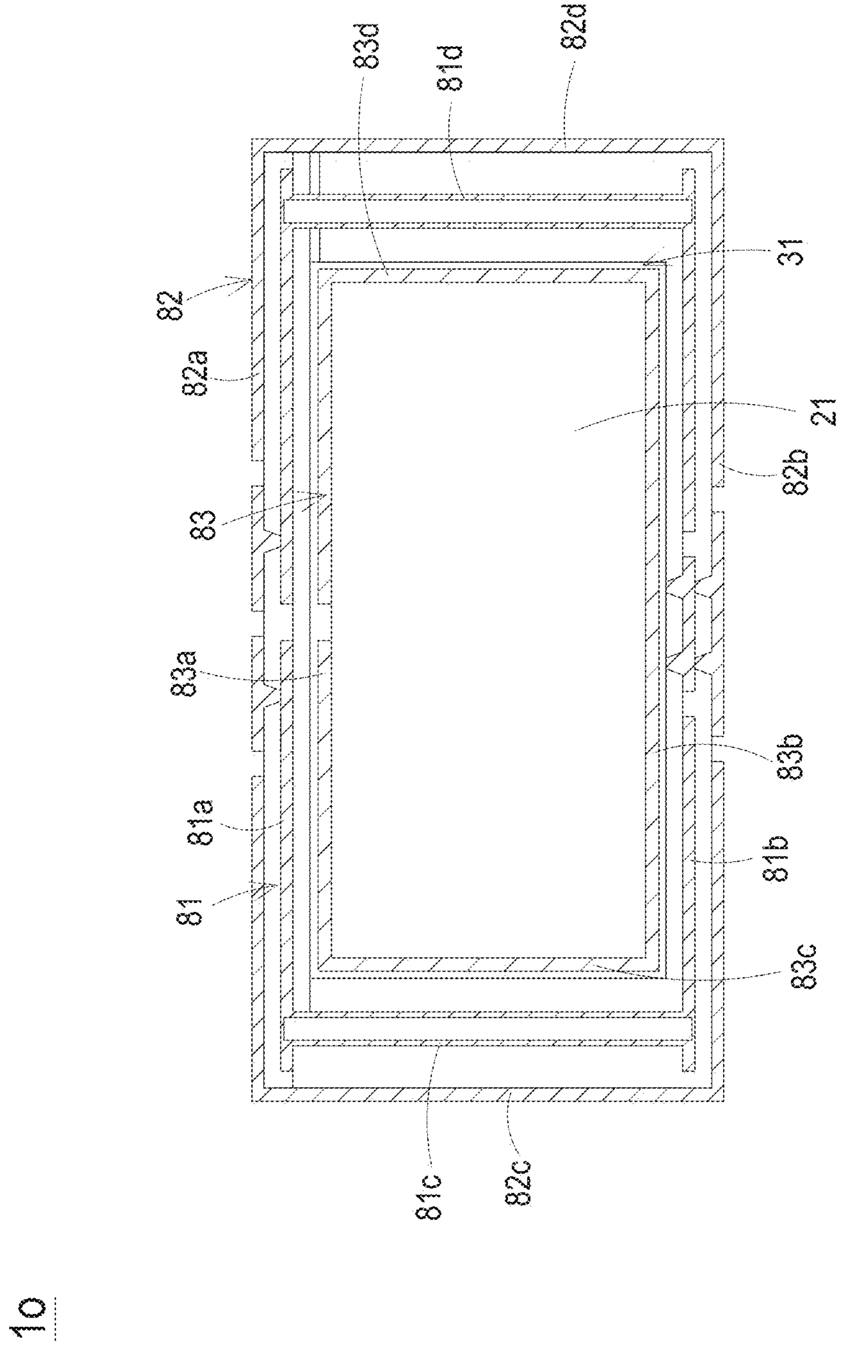
FIG. 24 is a schematic cross-sectional view illustrating a magnetic element according to a fifteenth embodiment of the present invention.

FIG. 24 is a schematic cross-sectional view illustrating a magnetic element according to a fifteenth embodiment of the present invention. In this embodiment, the substrate 3 of the magnetic element 1*o* includes a first metal structure 81 and a second metal structure 82. The first metal structure 81 includes a third connection copper foil 81*c*, a fourth connection copper foil 81*d*, a third horizontal copper foil 81*a* and a fourth horizontal copper foil 81*b*. The third connection copper foil 81*c*, the fourth connection copper foil 81*d*, the third horizontal copper foil 81*a* and the fourth horizontal copper foil 81*b* of the first metal structure 81 are respectively similar to the third connection copper foil 37*c*, the fourth connection copper foil 37*d*, the third horizontal copper foil 37*a* and the fourth horizontal copper foil 37*b* of the second metal structure 37 as shown in FIG. 19F. The second metal structure 82 includes a fifth horizontal copper foil 82*a*, a sixth horizontal copper foil 82*b*, a fifth connection copper foil 82*c* and a sixth connection copper foil 82*d*. The fifth horizontal copper foil 82*a*, the sixth horizontal copper foil 82*b*, the fifth connection copper foil 82*c* and the sixth connection copper foil 82*d* of the second metal structure 82 are respectively similar to the fifth horizontal copper foil 38*a*, the sixth horizontal copper foil 38*b*, the fifth connection copper foil 38*c* and the sixth connection copper foil 38*d* of the third metal structure 38 as shown in FIG. 19F.

The magnetic element 1*o* further includes a fourth metal structure 83. The fourth metal structure 83 is attached on the first magnetic part 21. The fourth metal structure 83 includes an eighth horizontal copper foil 83*a*, a ninth horizontal copper foil 83*b*, an eighth connection copper foil 83*c* and a ninth connection copper foil 83*d*. The eighth horizontal copper foil 83*a* and the ninth horizontal copper foil 83*b* are on two opposite sides of the first magnetic part 21. The eighth connection copper foil 83*c* and the ninth connection copper foil 83*d* are on the other two opposite sides of the first magnetic part 21. The eighth connection copper foil 83*c* is connected between a first end of the eighth horizontal copper foil 83*a* and a first end of the ninth horizontal copper foil 83*b*. The ninth connection copper foil 83*d* is connected between a second end of the eighth horizontal copper foil 83*a* and a second end of the ninth horizontal copper foil 83*b*. In this embodiment, only a portion of the fourth metal structure 83 is attached on the first magnetic part 21. Consequently, there is a gap between the two segments of the eighth horizontal copper foil 83*a*.

In the magnetic element 1 to the magnetic element In of the above embodiments 1~1n), the magnetic parts may be bare magnetic parts. Optionally, a fourth insulation structure 9 is formed on the surface of the bare magnetic part through a spraying process, a dipping process, an electrophoresis process, an electrostatic spraying process, a chemical vapor deposition process, a physical vapor deposition process, a sputtering process, an evaporation process or a printing process. The fourth insulation structure 9 can provide an insulating function. The fourth insulation structure 9 can cover the entire of the magnetic part or a portion of the magnetic part. As shown in FIG. 5, the first magnetic part, the second magnetic part, the third magnetic part and the fourth magnetic part of the magnetic core assembly of the magnetic element are connected with each other in an end-to-end manner. For achieving the requirement inductance, adhesives with glass beads are disposed in the contact region between the first magnetic part and the third magnetic part and the contact region between the first magnetic part and the fourth magnetic part. The inductance may be adjusted according to the dimension of the glass beads. Under this circumstance, the fourth insulation structure 9 may be omitted.

In the magnetic element 1*o*, the fourth metal structure 83 is attached on the first magnetic part 21. Consequently, it is not necessary to connect other metal parts with other metal structures (e.g., horizontal transition structures). In some embodiments, a thin insulation layer (not shown) is formed on the surface of the first magnetic part through a spraying process, a dipping process, an electrophoresis process, an electrostatic spraying process, a chemical vapor deposition process, a physical vapor deposition process, a sputtering process, an evaporation process or a printing process. Consequently, the insulation between the fourth metal structure 83 and the first magnetic part 21 is achieved. The thickness of the thin insulation layer is smaller than 20 μm. Since the width and the height of the fourth metal structure 83 are smaller, the dimension of the magnetic element 1*o* can be further reduced, and the power density of the magnetic element 1*o* can be enhanced. In case that the dimension of the magnetic element 1*o* is not changed, the dimension of the magnetic core assembly can be increased. Consequently, the magnetic loss can be effectively reduced, and the efficiency of the magnetic element 1*o* can be increased.

It is noted that the features of different embodiments may be combined together according to the practical requirements. Consequently, the dimension of the power module can be further reduced, and the power density can be further enhanced.

Figure 25:
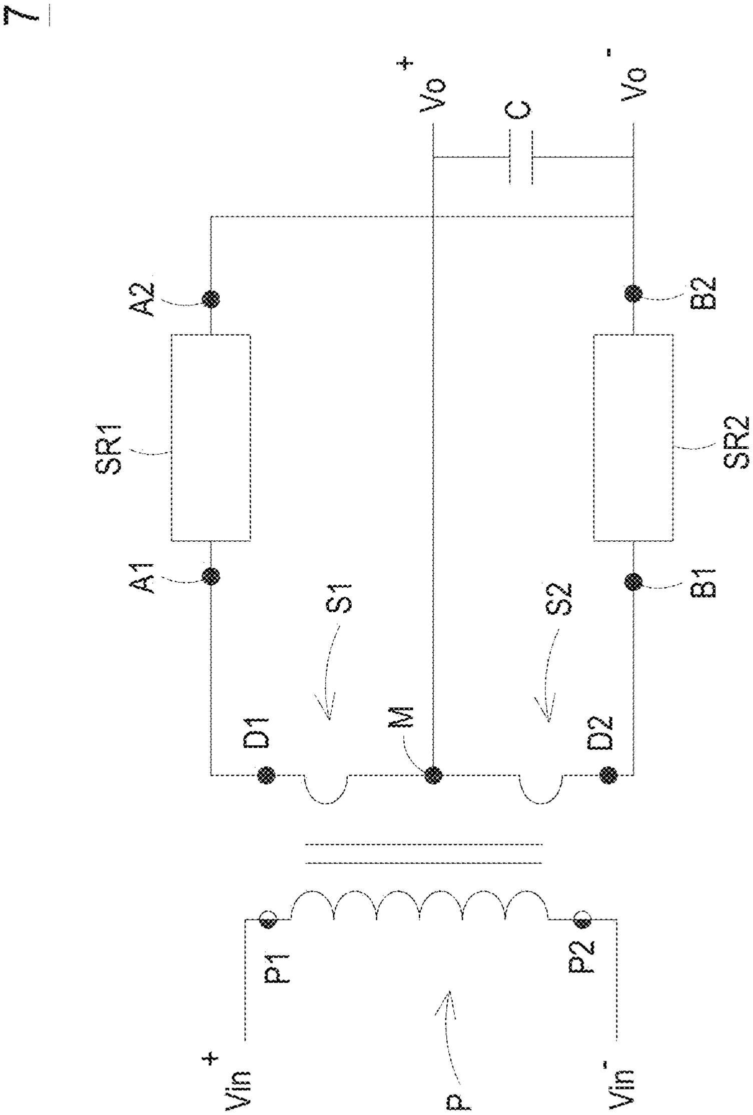
FIG. 25 is a schematic circuit diagram illustrating a power module with the magnetic element of the present invention.

FIG. 25 is a schematic circuit diagram illustrating a power module with the magnetic element of the present invention. For illustration, the magnetic module has the structure as shown in FIG. 8G. It is noted that the magnetic element of any of the above embodiments can be applied to the power module. The power module 7 is connected between an input side and an output side. The input side includes a positive input terminal Vin+ and a negative input terminal Vin−. The output side includes a positive output terminal Vo+ and a negative output terminal Vo−. The power module 7 includes the magnetic element and electronic components. The magnetic element includes a primary winding P, a first secondary winding S1 and a second secondary winding S2. The electronic components include two power switches SR1, SR2 and a capacitor C. A first terminal P1 of the primary winding P is connected with the positive input terminal Vin+. A second terminal P2 of the primary winding P is connected with the negative input terminal Vin−. A first terminal D1 of the first secondary winding S1 is connected with a first terminal A1 of the power switch SR1. A second terminal of the first secondary winding S1 and a first terminal of the second secondary winding S2 are connected with a node M. A second terminal D2 of the second secondary winding S2 is connected with a first terminal B1 of the power switch SR2. The node M is connected with the positive output terminal Vo+. A second terminal A2 of the power switch SR1 and a second terminal B2 of the power switch SR2 are connected with each other and connected to the negative output terminal Vo−. The capacitor C is connected between the positive output terminal Vo+ and the negative output terminal Vo−. In an embodiment, the first secondary winding S1 is implemented with the first metal structure 34 of the magnetic element 1, the second secondary winding S2 is implemented with the second metal structure 37 of the magnetic element 1, and the primary winding P is implemented with the third metal structure 38 of the magnetic element 1. In some embodiment, the primary winding P, the first secondary winding S1 and the second secondary winding S2 are implemented with the first metal structure 34, the second metal structure 37 and the third metal structure 38 of the magnetic element 1, respectively.

Figure 26:
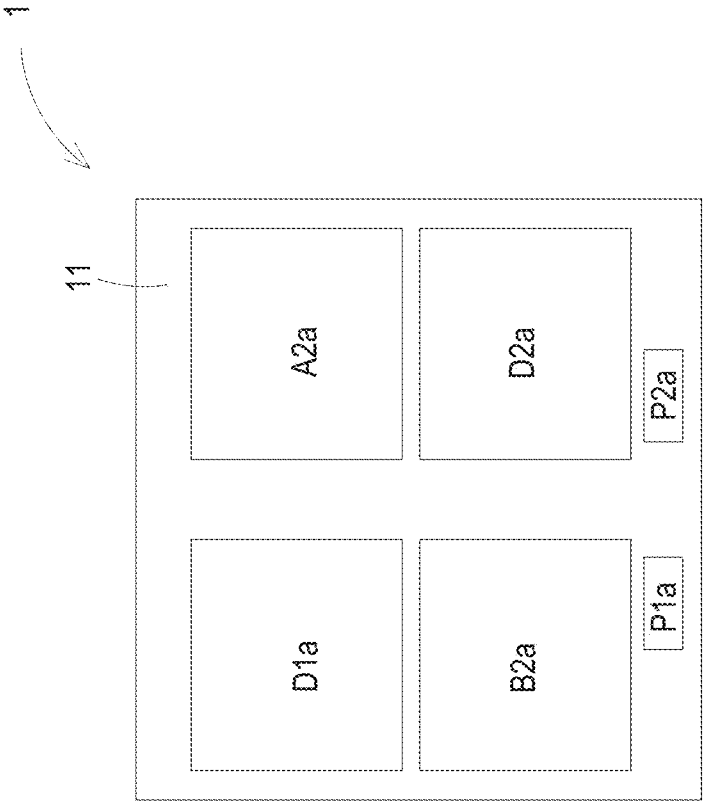
FIG. 26 is a schematic top view illustrating a top surface of the magnetic element as shown in FIG. 8G.
Figure 27A:
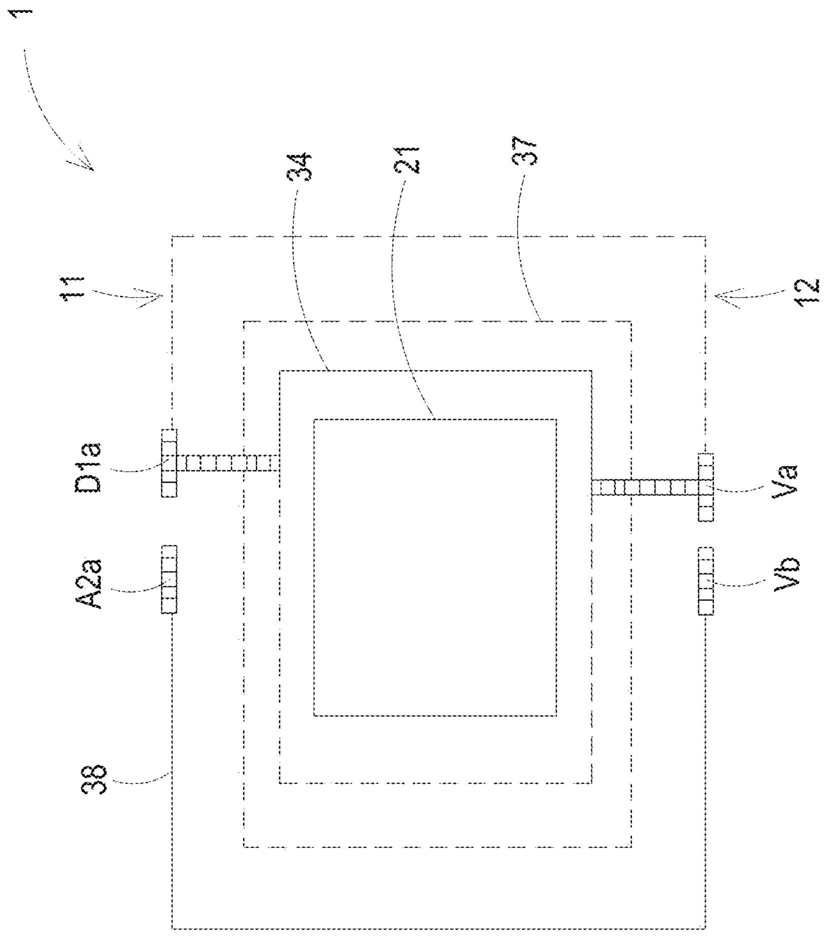
FIG. 27A schematically illustrates the primary winding and the secondary winding of the magnetic element as shown in FIG. 26 and taken along a viewpoint.
Figure 27B:
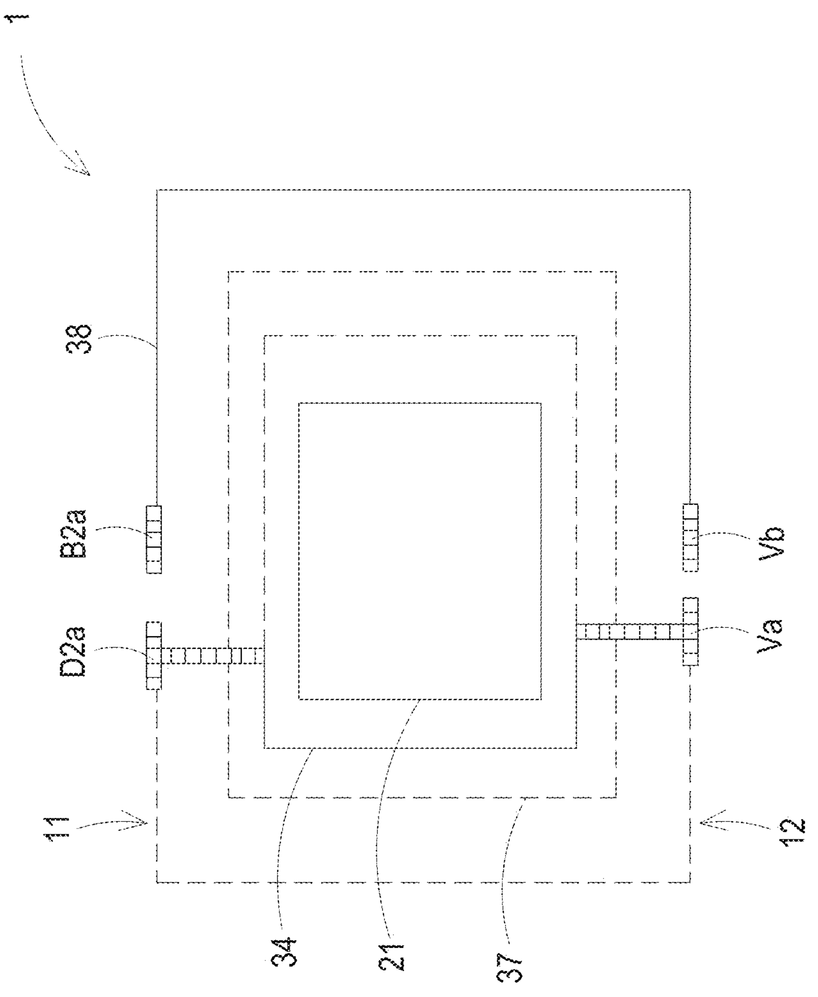
FIG. 27B schematically illustrates the primary winding and the secondary winding of the magnetic element as shown in FIG. 26 and taken along another viewpoint.

Please refer to FIGS. 25, 26, 27A and 27B. FIG. 26 is a schematic top view illustrating a top surface of the magnetic element as shown in FIG. 8G. FIG. 27A schematically illustrates the primary winding and the secondary winding of the magnetic element as shown in FIG. 26 and taken along a viewpoint. FIG. 27B schematically illustrates the primary winding and the secondary winding of the magnetic element as shown in FIG. 26 and taken along another viewpoint.

As shown in FIG. 26, a first surface mount pin D1*a*, a third surface mount pin A2*a*, a fifth surface mount pin D2*a*, a sixth surface mount pin B2*a*, a seventh surface mount pin P1*a* and an eighth surface mount pin P2*a* are disposed on a top surface 11 of the magnetic element 1. The first surface mount pin D1*a* is used as the first terminal D1 of the first secondary winding S1 and the first terminal A1 of the power switch SR1 as shown in FIG. 25. The third surface mount pin A2*a* is used as the second terminal A2 of the power switch SR1 as shown in FIG. 25. The fifth surface mount pin D2*a* is used as the second terminal D2 of the second secondary winding S2 and the first terminal B1 of the power switch SR2 as shown in FIG. 25. The sixth surface mount pin B2*a* is used as the second terminal B2 of the power switch SR2 as shown in FIG. 25. The seventh surface mount pin P1*a* is used as the first terminal P1 of the primary winding P as shown in FIG. 25. The eighth surface mount pin P2*a* is used as the second terminal P2 of the primary winding P as shown in FIG. 25.

As shown in FIGS. 27A and 27B, a second surface mount pin Va and a fourth surface mount pin Vb are disposed on a bottom surface 12 of the magnetic element 1. The second surface mount pin Va is used as the positive output terminal Vo+ as shown in FIG. 25. The fourth surface mount pin Vb is used as the negative output terminal Vo as shown in FIG. 25.

As shown in FIG. 27A, a first portion of the first metal structure 34 (e.g., the region indicated by solid lines) and a first portion of the third metal structure 38 (e.g., the region indicated by dotted lines) are formed as the first secondary winding S1 (i.e., the second winding). Consequently, the first secondary winding S1 is flat-wounded on the first magnetic part 21. A first end of the first portion of the first metal structure 34 is connected with the first surface mount pin D1*a*. A second end of the first portion of the first metal structure 34 is connected with the second surface mount pin Va. A first end of the first portion of the third metal structure 38 is connected with the third surface mount pin A2*a*. A second end of the first portion of the third metal structure 38 is connected with the fourth surface mount pin Vb. As shown in FIG. 27B, a second portion of the first metal structure 34 (e.g., the region indicated by solid lines) and a second portion of the third metal structure 38 (e.g., the region indicated by solid lines) are formed as the second secondary winding S2 (i.e., the third winding). Consequently, the second secondary winding S2 is flat-wounded on the first magnetic part 21. A first end of the second portion of the first metal structure 34 is connected with the fifth surface mount pin D2*a*. A second end of the second portion of the first metal structure 34 is connected with the second surface mount pin Va. A first end of the second portion of the third metal structure 38 is connected with the sixth surface mount pin B2*a*. A second end of the second portion of the third metal structure 38 is connected with the fourth surface mount pin Vb.

In an embodiment, the second metal structure 37 is served as the primary winding P as shown in FIG. 25. The second metal structure 37 is connected with the seventh surface mount pin P1*a* and the eighth surface mount pin P2*a*. The first secondary winding S1 and the second secondary winding S2 are distributed in a split-level arrangement. Since the symmetry between the first secondary winding S1 and the second secondary winding S2 is improved, the current-sharing efficacy of the currents flowing through the power switches SR1 and SR2 are enhanced.

Figure 28:
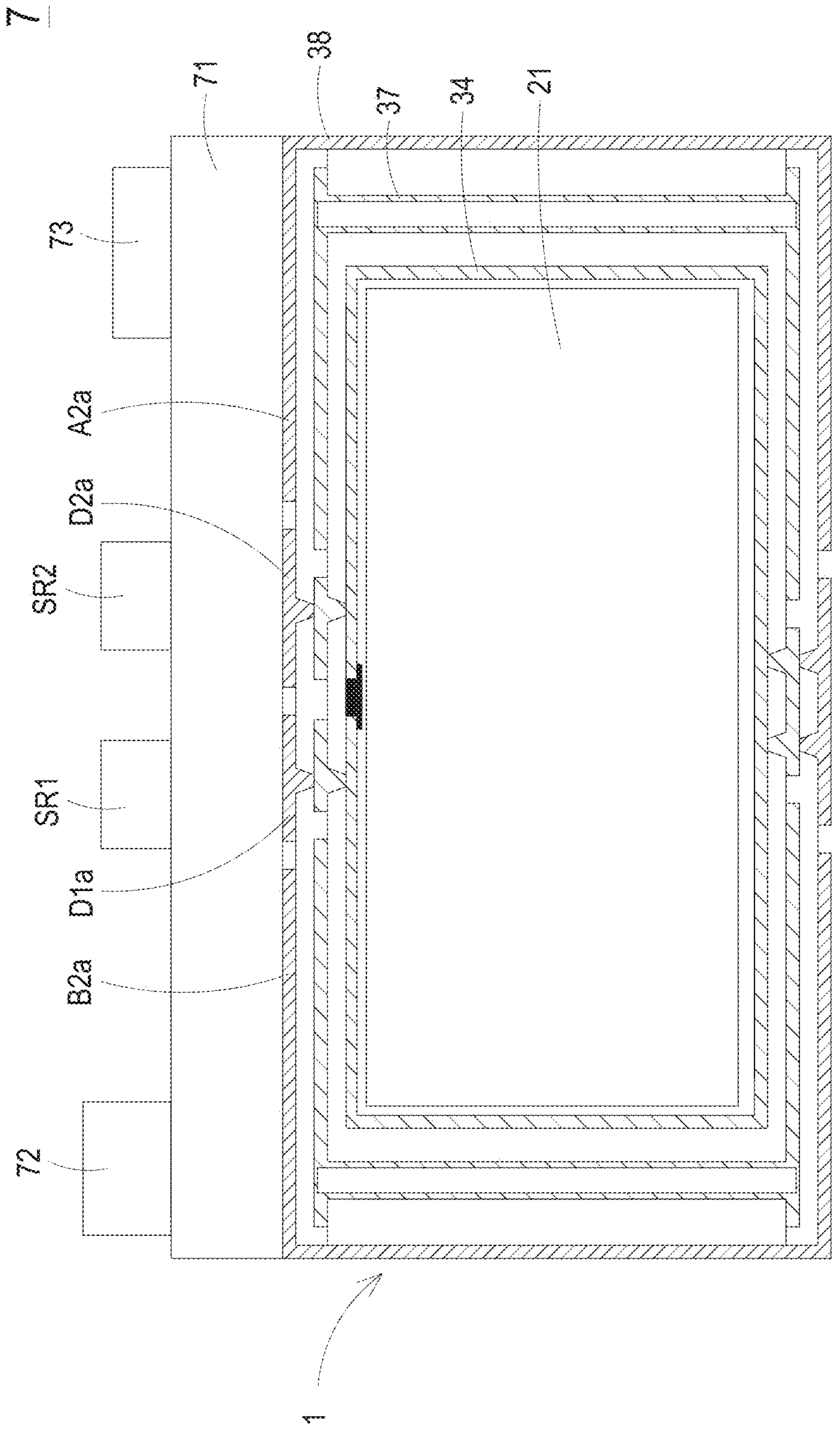
FIG. 28 is a schematic cross-sectional view illustrating a first example of the power module as shown in FIG. 25.

Please refer to FIGS. 25, 26, 27A, 27B and 28. FIG. 28 is a schematic cross-sectional view illustrating a first example of the power module as shown in FIG. 25. For illustration, the magnetic module has the structure as shown in FIG. 8G. It is noted that the magnetic element of any of the above embodiments can be applied to the power module. The power module 7 includes the magnetic element 1, a circuit board 71, primary side components 72, secondary side components 73 and the power switches SR1, SR2. The primary side components 72 and the secondary side components 73 are passive components. The circuit board 71 is disposed on the magnetic element 1. The primary side components 72, the secondary side components 73 and the power switches SR1, SR2 are disposed on the circuit board 71. The first terminal of the power switch SR1 is electrically connected with the first surface mount pin D1*a* through the circuit board 71. The first terminal of the power switch SR2 is electrically connected with the fifth surface mount pin D2*a* through the circuit board 71. The second terminal of the power switch SR1 and the second terminal of the power switch SR2 are electrically connected with each other through the circuit board 71.

Figure 29:
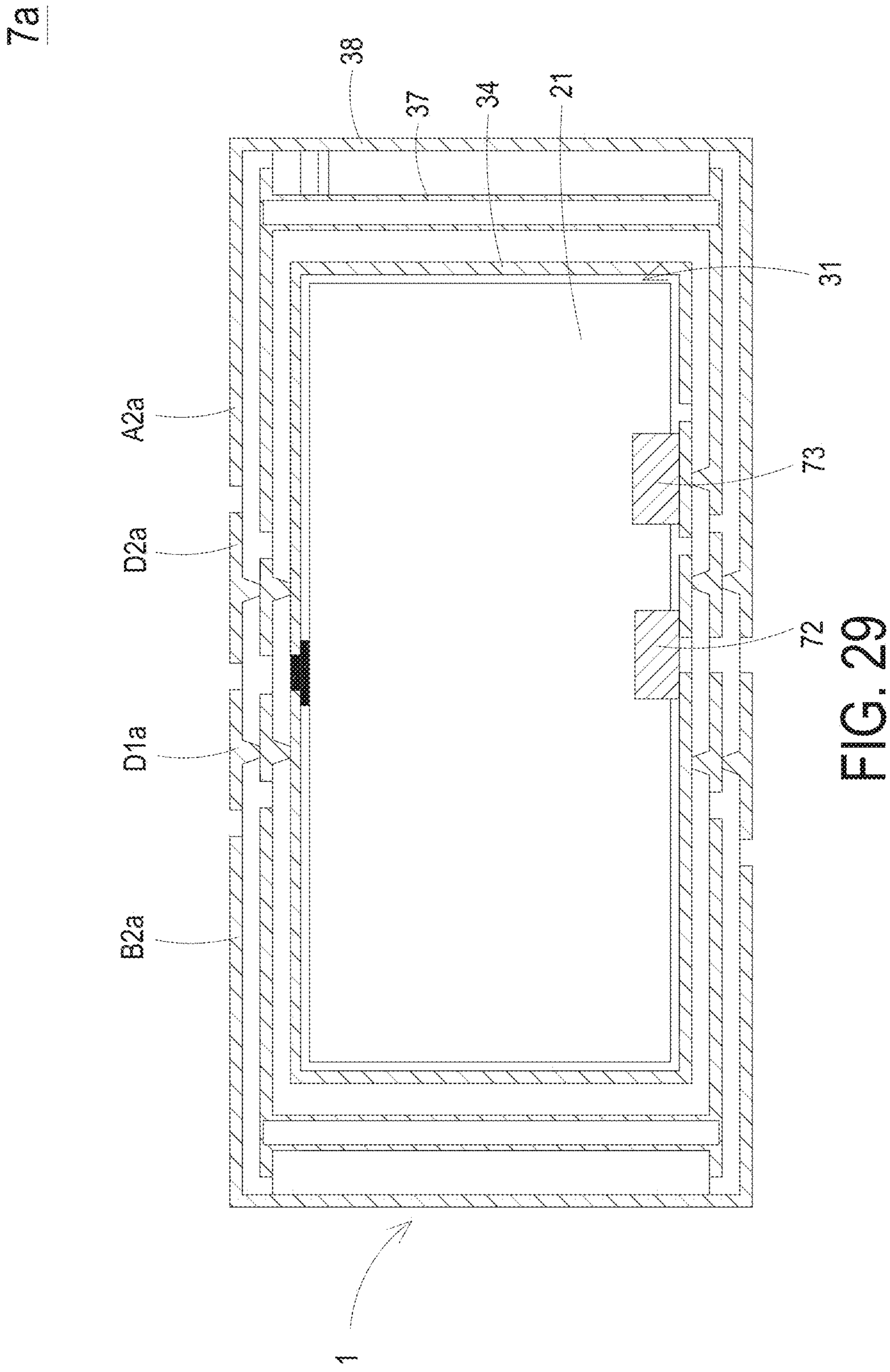
FIG. 29 is a schematic cross-sectional view illustrating a second example of the power module as shown in FIG. 25.

It is noted that numerous modifications and alterations may be made while retaining the teachings of the invention. For example, the number of the power switches may be varied according to the practical requirements. FIG. 29 is a schematic cross-sectional view illustrating a second example of the power module as shown in FIG. 25. In this embodiment, the power module 7*a* is not equipped with a circuit board. The primary side components 72 and the secondary side components 73 are disposed within the first accommodation space 31. Consequently, the current loop is shorter.

The power module is not restricted to the LLC converter. That is, the power converter may be applied to any other appropriate circuit including a transformer module, e.g., a flyback converter or a bridge circuit. Since the power switches are directly connected with a plurality of output terminals of the magnetic element, the connecting loss is reduced. Moreover, since the primary winding and the secondary windings of the magnetic element are magnetically coupled with each other, the AC impedance and the AC loss are reduced.

From the above descriptions, the present invention provides the magnetic element. The first magnetic part is disposed within the first accommodation space of the substrate. The second magnetic part is disposed within the second accommodation space of the substrate. For a three-layered winding assembly, since the distances between the three layers of the winding assembly and the first magnetic part and the distances between the corresponding layers of the winding assembly and the second magnetic part are nearly equal, the current distribution is more uniform and the overall magnetic loss of the magnetic element is reduced. Moreover, since the first magnetic part and the second magnetic part are arranged independently and respectively disposed within the first accommodation space and the second accommodation space, the first magnetic part and the second magnetic part can be polished separately. Moreover, since the first magnetic part and the second magnetic part are respectively disposed within the first accommodation space and the second accommodation space of the substrate, the first magnetic part and the second magnetic part are not influenced by each other. After the first magnetic part and the second magnetic part are polished separately, the first magnetic part and the second magnetic part are disposed in the corresponding accommodation spaces. In other words, the position precision of the first magnetic part and the position precision of the second magnetic part are not related to each other. Moreover, the position precision between the first magnetic part and the second magnetic part is determined according to the position precision between the first accommodation space and the second accommodation space. Since the dimension precision of the magnetic core assembly of the magnetic element is very high, the magnetic loss of the magnetic element is low and the overall dimension of the magnetic element is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetic element, comprising:

a magnetic core assembly comprising a first magnetic part and a second magnetic part, and the first magnetic part and the second magnetic part are separate pieces, wherein the magnetic core assembly further comprises a third magnetic part and a fourth magnetic part, wherein the first magnetic part and the second magnetic part are arranged between the third magnetic part and the fourth magnetic part, two ends of the third magnetic part are respectively connected with a first end of the first magnetic part and a first end of the second magnetic part, and two ends of the fourth magnetic part are respectively connected with a second end of the first magnetic part and a second end of the second magnetic part; and a winding assembly comprising a first winding, wherein the first winding is wound around the first magnetic part, wherein at least a portion of a substrate is formed as the first winding, and the substrate comprises a first accommodation space, a second accommodation space and a first metal structure, wherein at least a portion of the first metal structure is formed as at least a portion of the first winding, at least a portion of the first magnetic part and at least a portion of the second magnetic part are disposed within the first accommodation space and the second accommodation space respectively, the first accommodation space is enclosed by the first metal structure, and the substrate has an integral structure;

wherein the substrate is a board comprising a first surface and a second surface arranged opposite to each other, and the first accommodation space and the second accommodation space are arranged between the first surface and the second surface, wherein the substrate further comprises a first opening and a second opening, wherein the first opening is located at a first side of the substrate, the second opening is located at a second side of the substrate, the first accommodation space and the second accommodation space are arranged between the first opening and the second opening, the first opening is in communication with the first accommodation space and the second accommodation space, the second opening is in communication with the first accommodation space and the second accommodation space, at least a portion of the third magnetic part is disposed within the first opening, and at least a portion of the fourth magnetic part is disposed within the second opening.

2. The magnetic element according to claim 1, wherein the first magnetic part, the second magnetic part, the third magnetic part and the fourth magnetic part are arranged independently.

3. The magnetic element according to claim 1, wherein the first magnetic part and the third magnetic part are integrally formed as an integral structure, and the second magnetic part and the fourth magnetic part are integrally formed as another integral structure.

4. The magnetic element according to claim 1, wherein the substrate further comprises a first opening, wherein the first opening is located at a first side of the substrate, and the first opening is in communication with the first accommodation space and the second accommodation space, wherein at least a portion of the third magnetic part is disposed within the first opening, a second side of the substrate has no opening, and the fourth magnetic part is pre-embedded in the second side of the substrate.

5. The magnetic element according to claim 1, wherein the substrate comprises a first horizontal wiring layer and a second horizontal wiring layer, and the first horizontal wiring layer and the second horizontal wiring layer are opposite to each other with respect to the first magnetic part, wherein the first metal structure comprises a first horizontal copper foil, a second horizontal copper foil, a first connection copper foil and a second connection copper foil, wherein the first horizontal copper foil, the first connection copper foil, the second horizontal copper foil and the second connection copper foil are connected with each other and arranged around the first magnetic part, wherein the first connection copper foil and the second connection copper foil are arranged between the first horizontal copper foil and the second horizontal copper foil, wherein the first horizontal copper foil is formed in the first horizontal wiring layer, and the second horizontal copper foil is formed in the second horizontal wiring layer.

6. The magnetic element according to claim 5, wherein at least a portion of the first metal structure is formed on an inner wall of the first accommodation space.

7. The magnetic element according to claim 6, wherein the first metal structure is formed on the inner wall of the first accommodation space completely.

8. The magnetic element according to claim 5, wherein the substrate further comprises a seventh horizontal wiring layer, the seventh horizontal wiring layer is arranged between the first horizontal wiring layer and the second horizontal wiring layer, the first metal structure further comprises two first horizontal transition structures, the two first horizontal transition structures are formed in the seventh horizontal wiring layer and located at two sides of the first magnetic part, the two horizontal transition structures are respectively connected with two ends of the first horizontal copper foil through conductive posts, the two first horizontal transition structures are connected with the first connection copper foil and the second connection copper foil, respectively.

9. The magnetic element according to claim 5, wherein the first metal structure is formed as the first winding completely.

10. The magnetic element according to claim 5, wherein the substrate further comprises a third horizontal wiring layer, a fourth horizontal wiring layer and a second metal structure, and the third horizontal wiring layer and the fourth horizontal wiring layer are opposite to each other with respect to the first magnetic part, wherein the third horizontal wiring layer is located at a side of the first horizontal wiring layer away from the first accommodation space, and the fourth horizontal wiring layer is located at a side of the second horizontal wiring layer away from the first accommodation space, wherein the second metal structure comprises a third horizontal copper foil, a fourth horizontal copper foil, a third connection copper foil and a fourth connection copper foil, wherein the third horizontal copper foil, the third connection copper foil, the fourth horizontal copper foil and the fourth connection copper foil are connected with each other and arranged around the first magnetic part, wherein the third connection copper foil and the fourth connection copper foil are arranged between the third horizontal copper foil and the fourth horizontal copper foil, the second metal structure is disposed on an outer side of the first metal structure, wherein the third horizontal copper foil is formed in the third horizontal wiring layer, and the fourth horizontal copper foil is formed in the fourth horizontal wiring layer.

11. The magnetic element according to claim 10, wherein the magnetic element further comprises a second winding, and the second winding is wound around the first magnetic part, wherein the first metal structure is formed as the first winding, and the second metal structure is formed as the second winding.

12. The magnetic element according to claim 10, wherein the magnetic element further comprises a second winding, and the second winding is wound around the first magnetic part, wherein a first portion of the first metal structure and a first portion of the second metal structure are formed as the first winding, and a second portion of the first metal structure and a second portion of the second metal structure are formed as the second winding.

13. The magnetic element according to claim 10, wherein the substrate further comprises a fifth horizontal wiring layer, a sixth horizontal wiring layer and a third metal structure, and the fifth horizontal wiring layer and the sixth horizontal wiring layer are opposite to each other with respect to the first magnetic part, wherein the fifth horizontal wiring layer is located at a side of the third horizontal wiring layer away from the first accommodation space, and the sixth horizontal wiring layer is located at a side of the fourth horizontal wiring layer away from the first accommodation space, wherein the third metal structure comprises a fifth horizontal copper foil, a sixth horizontal copper foil, a fifth connection copper foil and a sixth connection copper foil, wherein the fifth horizontal copper foil, the fifth connection copper foil, the sixth horizontal copper foil and the sixth connection copper foil are connected with each other and arranged around the first magnetic part, wherein the fifth connection copper foil and the sixth connection copper foil are arranged between the fifth horizontal copper foil and the sixth horizontal copper foil, wherein the third metal structure is located at an outer side of the second metal structure, the fifth horizontal copper foil is formed in the fifth horizontal wiring layer, and the sixth horizontal copper foil is formed in the sixth horizontal wiring layer.

14. The magnetic element according to claim 13, wherein the substrate further comprises a seventh horizontal wiring layer, the third metal structure comprises two second horizontal transition structures, two third horizontal transition structures, two fourth horizontal transition structures, two fifth horizontal transition structures and two sixth horizontal transition structures, the two second horizontal transition structures are formed in the seventh horizontal wiring layer and opposite to each other with respect to the first magnetic part, the two third horizontal transition structures are formed in the first horizontal wiring layer and opposite to each other with respect to the first magnetic part, the two fourth horizontal transition structures are formed in the third horizontal wiring layer and opposite to each other with respect to the first magnetic part, the two fifth horizontal transition structures are formed in the fourth horizontal wiring layer and opposite to each other with respect to the first magnetic part, one of the two second horizontal transition structures, one of the two third horizontal transition structures, one of the two fourth horizontal transition structures and one end of the fifth horizontal copper foil are connected with each other through a first conductive part, one of the two fifth horizontal transition structures and the sixth horizontal copper foil are connected with each other through a second conductive part, one of the two second horizontal transition structures and one of the two fifth horizontal transition structures are connected with two ends of the fifth connection copper foil, the other second horizontal transition structure, the other third horizontal transition structure, the other fourth horizontal transition structure, the other end of the fifth horizontal copper foil are connected with each other through a third conductive part, the other fifth horizontal transition structure and the sixth horizontal copper foil are connected with each other through a fourth conductive part, the other second horizontal transition structure and the other fifth horizontal transition structure are connected with two ends of the sixth connection copper foil.

15. The magnetic element according to claim 13, wherein the magnetic element further comprises a second winding and a third winding, and the second winding and the third winding are wound around the first magnetic part, wherein the first metal structure is formed as the first winding, the second metal structure is formed as the second winding, and the third metal structure is formed as the third winding.

16. The magnetic element according to claim 13, wherein the magnetic element further comprises a second winding and a third winding, and the second winding and the third winding are wound around the first magnetic part, wherein the second metal structure is formed as the second winding, a first portion of the first metal structure and a first portion of the third metal structure are formed as the first winding, the first portion of the first metal structure and the first portion of the third metal structure are connected with each other through a first conductive post, a second portion of the first metal structure and a second portion of the third metal structure are formed as the third winding, and the second portion of the first metal structure and the second portion of the third metal structure are connected with each other through a second conductive post.

17. The magnetic element according to claim 6, wherein a portion of the first metal structure is formed on an inner wall of the first accommodation space and divided into a plurality of segments.

18. The magnetic element according to claim 17, wherein an electroless-plating resistant layer is arranged between at least two of the plurality of segments of the first metal structure.

19. The magnetic element according to claim 1, wherein an edge of the first magnetic part has a chamfer, and the chamfer is located beside a corner of the first metal structure.

20. The magnetic element according to claim 1, wherein the magnetic element further comprises a circuit board and at least one power switch, wherein the least one power switch is disposed on the circuit board, and the at least one power switch is electrically connected with the first winding.

21. The magnetic element according to claim 1, wherein the magnetic element further comprises a passive component, and the passive component is disposed within the first accommodation space.

22. The magnetic element according to claim 1, wherein the magnetic element further comprises a fourth metal structure, and a portion of the fourth metal structure is attached on a portion of the first magnetic part.

23. The magnetic element according to claim 1, wherein the magnetic element further comprises an insulation structure, and the insulation structure is attached on the first magnetic part.

* * * * *